US012274117B2

(12) United States Patent
Naijo et al.

(10) Patent No.: US 12,274,117 B2
(45) Date of Patent: Apr. 8, 2025

(54) LIGHT-EMITTING DEVICE AND AN ELECTRONIC APPARATUS INCLUDING SAME

(71) Applicant: Samsung Display Co., Ltd., Yongin-si (KR)

(72) Inventors: Tsuyoshi Naijo, Yongin-si (KR); Hyunyoung Kim, Yongin-si (KR); Hyosup Shin, Yongin-si (KR); Jiyoung Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 499 days.

(21) Appl. No.: 17/399,013

(22) Filed: Aug. 10, 2021

(65) Prior Publication Data

US 2022/0190276 A1 Jun. 16, 2022

(30) Foreign Application Priority Data

Dec. 15, 2020 (KR) ........................ 10-2020-0175824

(51) Int. Cl.
*H01L 51/50* (2006.01)
*H10K 50/11* (2023.01)
(Continued)

(52) U.S. Cl.
CPC ............ *H10K 50/18* (2023.02); *H10K 50/11* (2023.02); *H10K 85/322* (2023.02); *H10K 85/342* (2023.02); *H10K 85/346* (2023.02); *H10K 85/40* (2023.02); *H10K 85/654* (2023.02); *H10K 85/6572* (2023.02); *H10K 2101/10* (2023.02);
(Continued)

(58) Field of Classification Search
None
See application file for complete search history.

(56) References Cited

U.S. PATENT DOCUMENTS 7,381,479 B2 6/2008 Lamansky et al.
7,393,599 B2 7/2008 Thompson et al.
(Continued)

FOREIGN PATENT DOCUMENTS

CN 103360303 10/2013
CN 103492383 A 1/2014
(Continued)

OTHER PUBLICATIONS

English translation of JP 2008147424 A obtained from Global Dossier (Year: 2008).
(Continued)

*Primary Examiner* — Long Pham
(74) *Attorney, Agent, or Firm* — Womble Bond Dickinson (US) LLP

(57) ABSTRACT

A light-emitting device includes: a first electrode; a second electrode facing the first electrode; an interlayer located between the first electrode and the second electrode and including an emission layer; and an electron transport region located between the emission layer and the second electrode and including: a hole blocking layer; and an electron transport layer, an electron injection layer, or any combination thereof, wherein the emission layer includes a first host, a second host, a first dopant, and a second dopant, and the electron transport region includes a layer including a red dopant compound.

20 Claims, 3 Drawing Sheets

(51) Int. Cl.

| | |
|---|---|
| ***H10K 50/18*** | (2023.01) |
| ***H10K 85/30*** | (2023.01) |
| ***H10K 85/40*** | (2023.01) |
| ***H10K 85/60*** | (2023.01) |
| *H10K 101/00* | (2023.01) |
| *H10K 101/10* | (2023.01) |
| *H10K 101/30* | (2023.01) |

(52) U.S. Cl.
CPC ..... *H10K 2101/27* (2023.02); *H10K 2101/30* (2023.02); *H10K 2101/90* (2023.02)

(56) References Cited

U.S. PATENT DOCUMENTS

| | | | |
|---|---|---|---|
| 7,585,573 | B2 | 9/2009 | Lee et al. |
| 7,652,287 | B2 | 1/2010 | Jeong et al. |
| 7,776,458 | B2 | 8/2010 | Ragini et al. |
| 8,106,199 | B2 | 1/2012 | Jabbour et al. |
| 8,389,725 | B2 | 3/2013 | Li et al. |
| 8,669,364 | B2 | 3/2014 | Li et al. |
| 8,680,760 | B2 | 3/2014 | Cheng et al. |
| 8,816,080 | B2 | 8/2014 | Li et al. |
| 8,846,940 | B2 | 9/2014 | Li et al. |
| 8,883,322 | B2 | 11/2014 | Wu et al. |
| 8,946,417 | B2 | 2/2015 | Jian et al. |
| 9,051,344 | B2 | 6/2015 | Lin et al. |
| 9,076,974 | B2 | 7/2015 | Li et al. |
| 9,093,650 | B2 | 7/2015 | Kim et al. |
| 9,142,791 | B2 | 9/2015 | Adamovich et al. |
| 9,172,046 | B1 | 10/2015 | Kim et al. |
| 9,203,039 | B2 | 12/2015 | Li et al. |
| 9,221,857 | B2 | 12/2015 | Li et al. |
| 9,224,963 | B2 | 12/2015 | Li et al. |
| 9,238,668 | B2 | 1/2016 | Li et al. |
| 9,299,944 | B2 | 3/2016 | Seo et al. |
| 9,312,502 | B2 | 4/2016 | Li et al. |
| 9,324,957 | B2 | 4/2016 | Li et al. |
| 9,340,728 | B2 | 5/2016 | Ise et al. |
| 9,382,273 | B2 | 7/2016 | Li et al. |
| 9,391,289 | B2 | 7/2016 | Seo et al. |
| 9,425,415 | B2 | 8/2016 | Li et al. |
| 9,478,764 | B2 | 10/2016 | Seo |
| 9,620,722 | B2 | 4/2017 | Martynova et al. |
| 9,783,564 | B2 | 10/2017 | Kottas et al. |
| 9,923,155 | B2 | 3/2018 | Li et al. |
| 10,256,419 | B2 | 4/2019 | Brooks et al. |
| 10,326,111 | B2 | 6/2019 | Yoo et al. |
| 10,361,388 | B2 | 7/2019 | Mitsumori et al. |
| 10,374,186 | B2 | 8/2019 | Ohsawa et al. |
| 10,586,932 | B2 | 3/2020 | Hosoumi et al. |
| 10,833,280 | B2 | 11/2020 | Ahn et al. |
| 10,847,727 | B2 | 11/2020 | Hayer et al. |
| 11,289,668 | B2 | 3/2022 | Kwak et al. |
| 12,035,617 | B2 | 7/2024 | Shin et al. |
| 2003/0175553 | A1 | 9/2003 | Thompson et al. |
| 2004/0080267 | A1 | 4/2004 | Cok |
| 2005/0287394 | A1 | 12/2005 | Yang et al. |
| 2006/0103298 | A1 | 5/2006 | Lee |
| 2008/0018221 | A1 | 1/2008 | Egen et al. |
| 2011/0024735 | A1 | 2/2011 | Sawada et al. |
| 2011/0272679 | A1 | 11/2011 | Yokoyama et al. |
| 2013/0168656 | A1 | 7/2013 | Tsai et al. |
| 2013/0270531 | A1 | 10/2013 | Seo et al. |
| 2014/0027733 | A1 | 1/2014 | Zeng et al. |
| 2014/0246660 | A1 | 9/2014 | Tanaka et al. |
| 2014/0309428 | A1 | 10/2014 | Egen et al. |
| 2015/0053958 | A1 | 2/2015 | Ishisone et al. |
| 2015/0060794 | A1 | 3/2015 | Oh et al. |
| 2015/0105556 | A1 | 4/2015 | Li et al. |
| 2015/0137051 | A1 | 5/2015 | Jung et al. |
| 2015/0155511 | A1 | 6/2015 | Ohsawa et al. |
| 2015/0194616 | A1 | 7/2015 | Li et al. |
| 2015/0194622 | A1 | 7/2015 | Yamamoto et al. |
| 2015/0280140 | A1 | 10/2015 | Matsuki et al. |
| 2015/0349279 | A1 | 12/2015 | Li et al. |
| 2016/0013427 | A1 | 1/2016 | Kim et al. |
| 2016/0028028 | A1 | 1/2016 | Li et al. |
| 2016/0056401 | A1 | 2/2016 | Lee et al. |
| 2016/0072078 | A1 | 3/2016 | Lee et al. |
| 2016/0351829 | A1 | 12/2016 | Hosoumi et al. |
| 2017/0018600 | A1 | 1/2017 | Ito et al. |
| 2017/0062752 | A1 | 3/2017 | Ihn et al. |
| 2017/0077421 | A1 | 3/2017 | Ihn et al. |
| 2017/0200899 | A1 | 7/2017 | Kim et al. |
| 2017/0309687 | A1 | 10/2017 | Watabe et al. |
| 2017/0338436 | A1 | 11/2017 | Mitsumori et al. |
| 2017/0346029 | A1 | 11/2017 | Kim et al. |
| 2017/0352819 | A1 | 12/2017 | Son et al. |
| 2018/0013073 | A1 | 1/2018 | Duan et al. |
| 2018/0105741 | A1 | 4/2018 | Ko et al. |
| 2018/0151630 | A1 | 5/2018 | Yamaoka et al. |
| 2018/0309080 | A1 | 10/2018 | Seo et al. |
| 2019/0006608 | A1 | 1/2019 | Koo et al. |
| 2019/0051834 | A1 | 2/2019 | Liu et al. |
| 2019/0074468 | A1 | 3/2019 | Kwak et al. |
| 2019/0140204 | A1 | 5/2019 | Seo et al. |
| 2019/0157599 | A1 | 5/2019 | Nakamura et al. |
| 2019/0165286 | A1 | 5/2019 | Li et al. |
| 2019/0203114 | A1 | 7/2019 | Ihn et al. |
| 2019/0214584 | A1 | 7/2019 | Chen et al. |
| 2019/0284137 | A1 | 9/2019 | Baek et al. |
| 2019/0296254 | A1 | 9/2019 | Ko et al. |
| 2019/0312210 | A1 | 10/2019 | Akashi et al. |
| 2019/0375768 | A1 | 12/2019 | Kim et al. |
| 2020/0136059 | A1 | 4/2020 | Hong et al. |
| 2020/0140471 | A1 | 5/2020 | Chen et al. |
| 2020/0168818 | A1 | 5/2020 | Lin et al. |
| 2020/0203610 | A1 | 6/2020 | Duan et al. |
| 2020/0295272 | A1 | 9/2020 | Lee et al. |
| 2020/0308209 | A1* | 10/2020 | Yoon .................. C07F 15/0033 |
| 2020/0313096 | A1 | 10/2020 | Kim et al. |
| 2020/0350507 | A1 | 11/2020 | Sun et al. |
| 2021/0159440 | A1 | 5/2021 | Mitsumori et al. |
| 2021/0257574 | A1 | 8/2021 | Ishisone et al. |
| 2021/0359227 | A1 | 11/2021 | Shin et al. |
| 2021/0376248 | A1* | 12/2021 | Song .................. H10K 50/125 |
| 2022/0020939 | A1 | 1/2022 | Lee et al. |
| 2022/0131095 | A1 | 4/2022 | Ko et al. |
| 2022/0173339 | A1 | 6/2022 | Lee et al. |
| 2022/0190276 | A1* | 6/2022 | Naijo .................. H10K 85/322 |
| 2022/0199918 | A1 | 6/2022 | Ahn et al. |
| 2024/0138221 | A1 | 4/2024 | Song et al. |

FOREIGN PATENT DOCUMENTS

| | | | |
|---|---|---|---|
| CN | 104370974 | A | 2/2015 |
| DE | 10-2014-008722 | A1 | 12/2015 |
| EP | 1 820 801 | A1 | 8/2007 |
| EP | 2 461 390 | A1 | 6/2012 |
| EP | 3 275 968 | A1 | 1/2018 |
| EP | 2 461 390 | B1 | 5/2018 |
| EP | 3 425 690 | A1 | 1/2019 |
| EP | 3 428 174 | A1 | 1/2019 |
| EP | 3 432 380 | A2 | 1/2019 |
| EP | 3 439 063 | A1 | 2/2019 |
| EP | 3 451 403 | A1 | 3/2019 |
| EP | 3 537 495 | A1 | 9/2019 |
| JP | 2004-273190 | A | 9/2004 |
| JP | 2005-514754 | A | 5/2005 |
| JP | 2007-45742 | A | 2/2007 |
| JP | 2007-335904 | | 12/2007 |
| JP | 2008-147424 | A | 6/2008 |
| JP | 2010-184910 | A | 8/2010 |
| JP | 2011-091366 | A | 5/2011 |
| JP | 2011-216656 | A | 10/2011 |
| JP | 2011-256143 | A | 12/2011 |
| JP | 2013-023500 | A | 2/2013 |
| JP | 2014-513679 | A | 6/2014 |
| JP | 2015-17231 | A | 1/2015 |
| JP | 2017-523270 | A | 8/2017 |
| JP | 2017-199903 | A | 11/2017 |
| JP | 2017-212443 | A | 11/2017 |
| JP | 2019-016788 | A | 1/2019 |
| JP | 2019-047124 | A | 3/2019 |

(56) References Cited

FOREIGN PATENT DOCUMENTS

| | | | |
|---|---|---|---|
| JP | 2019-062184 | A | 4/2019 |
| KR | 10-0730115 | B1 | 6/2007 |
| KR | 10-2012-0042886 | A | 5/2012 |
| KR | 10-2013-0116185 | A | 10/2013 |
| KR | 10-2014-0033091 | A | 3/2014 |
| KR | 10-2014-0092826 | A | 7/2014 |
| KR | 10-2015-0030660 | A | 3/2015 |
| KR | 10-2016-0012941 | A | 2/2016 |
| KR | 10-2016-0045508 | A | 4/2016 |
| KR | 10-2016-0080090 | A | 7/2016 |
| KR | 10-2016-0130940 | A | 11/2016 |
| KR | 10-2017-0026075 | A | 3/2017 |
| KR | 10-2017-0136823 | A | 12/2017 |
| KR | 10-2018-0013958 | A | 2/2018 |
| KR | 10-2018-0085007 | A | 7/2018 |
| KR | 10-2019-0004236 | A | 1/2019 |
| KR | 10-2019-0011754 | A | 2/2019 |
| KR | 10-2019-0026618 | A | 3/2019 |
| KR | 10-2019-0069584 | A | 6/2019 |
| KR | 10-2019-0112232 | A | 10/2019 |
| KR | 20200011059 | | 2/2020 |
| KR | 102083434 | | 3/2020 |
| KR | 10-2020-0115795 | A | 10/2020 |
| KR | 20200115890 | | 10/2020 |
| TW | 201711243 | A | 3/2017 |
| WO | WO 2011/013830 | A1 | 2/2011 |
| WO | WO 2011/055912 | A1 | 5/2011 |
| WO | WO 2012/121936 | A2 | 9/2012 |
| WO | WO 2012/143080 | A2 | 10/2012 |
| WO | WO 2013/069338 | A1 | 5/2013 |
| WO | WO 2015/171627 | A1 | 11/2015 |

OTHER PUBLICATIONS

Definition of "apparatus" in Merriam-Webster online dictionary, https://www.merriam-webster.com/dictionary/apparatus (Year: 2021).
Extended European Patent Office Search Report for European Application No. 19163558.0, dated Jul. 25, 2019, 7 pages.
European Patent Office, Search report corresponding to European Application No. 20188007.7, Oct. 22, 2020, 9 pages.
Cha, Jae-Ryung, et al. "Effect of increasing electron donor units for high-efficiency blue thermally activated delayed fluorescence", Dyes and Pigments, 2017, vol. 140, p. 399-406.
Fleetham et al. "Efficient "Pure" Blue OLEDs Employing Tetradentate Pt Complexes with a Narrow Spectral Bandwidth", Adv. Mater. 2014, vol. 26, pp. 7116-7121 (Year: 2014).
Goushi, Kenichi et al., "Organic light-emitting diodes employing efficient reverse intersystem crossing for triplet-to-singlet state conversation", Nature Photonics, Apr. 2012, pp. 253-258, Macmillan Publishers Limited.
Graves, David et al.; "Photophysical Investigation of the Thermally Activated Delayed Emission from Films of m-MTDATA:PBD Exciplex"; Adv. Funct. Mater. 2014; 24; pp. 2343-2351.
Hang et al. "Highly Efficient Blue-Emitting Cyclometalated Platinum(II) Complexes by Judicious Molecular Design", Angew. Chem. Int. Ed., 2013, vol. 52, p. 6753-6756 (Year: 2013).
Im, Yirang, et al. "Molecular Design Strategy of Organic Thermally Activated Delayed Fluorescence Emitters", Chem. Mater. 2017, vol. 29, p. 1946-1963.
Kang, Jae-Wook, et al., "A Host Material Containing Tetraphenylsilane for Phosphorescent OLEDs with High Efficiency and Operational Stability," Org. Electronics 2008, 9, pp. 452-460.
Kesti, Tero J. et al., "Exciplex Intermediates in Photoinduced Electron Transfer of Porphyrin-Fullerene Dyads", J. Am. Chem. Soc., 2002, pp. 8067-8077, vol. 124, No. 27, American Chemical Society, U.S.
Kim, Kwon-Hyeon et al., "Phosphorescent dye-based supramolecules for high-efficiency organic light-emitting diodes", Nature Communications, Sep. 10, 2014, pp. 1-8, Macmillan Publishers Limited.
Kim, Sei-Yong et al., "Organic Light-Emitting Diodes with 30% External Quantum Efficiency Based on a Horizontally Oriented Emitter", Advanced Functional Materials, 2013, pp. 3896-3900, vol. 23, WILEY-VCH Verlag Gmbh & Co. KGaA, Weinheim.
Kuzmin, Michael G. et al., "Exciplex mechanism of excited state electron transfer reactions in polar media", Journal of Photochemistry and Photobiology A: Chemistry, 1996, pp. 51-57, vol. 102, Elsevier Science S.A.
Lee, Jeong-Hwan et al., "An Exciplex Forming Host for Highly Efficient Blue Organic Light Emitting Diodes with Low Driving Voltage", Advanced Functional Materials, 2014, 6 pages, WILEY-VCH Verlag Gmbh & Co. KGaA, Weinheim.
Lee, Jeong-Hwan et al., "Exciplex-Forming Co-Host-Based Red Phosphorescent Organic Light-Emitting Diodes with Long Operational Stability and High Efficiency", Applied Materials & Interfaces, Jan. 18, 2017, 5 pages, ACS Publications, U.S.
Liu, Xiao-Ke et al., "Prediction and Design of Efficient Exciplex Emitters for High-Efficiency, Thermally Activated Delayed-Fluorescence Organic Light-Emitting Diodes", Advanced Materials, 2015, 6 pages, WILEY-VCH Verlag Gmbh & Co. KGaA, Weinheim.
Pang et al. "A full-color, low-power, wearable display for mobile applications", SPIE, Mar. 29, 2012 (Year: 2012).
Shin, Hyun et al., "Effect of Triplet Exciplex Confinement in Organic Light-Emitting Diodes according to Donor/Acceptor forming ratio", Organic Photonics Laboratory, Poster, 2020, 1 page, Industrial Technology Development Program.
Shin, Hyun et al., "Sky-Blue Phosphorescent OLEDs with 34.1% External Quantum Efficiency Using a Low Refractive Index Electron Transporting Layer", Advanced Materials, 2016, pp. 4920-4925, vol. 28, WILEY-VCH Verlag Gmbh & Co. KGaA, Weinheim.
Shin, Hyun, "Exciplex based Organic Light-Emitting Diodes with Theoretical Efficiency and Long Operational Lifetime", 2018, 185 pages, Department of Materials Science and Engineering, The Graduate School, Seoul National University.
Wei, Xiaofang et al., "Design of Efficient Exciplex Emitters by Decreasing the Energy Gap between the local excited triplet(3LE)state of the Acceptor and the charge transfer (CT) states of the Exciplex", Frontiers in Chemistry, Mar. 11, 2019, 17 pages, Frontiers in Chemistry.
U.S. Office action issued in U.S. Appl. No. 16/360,938, dated Sep. 23, 2021, 8 pages.
U.S. Office action issued in U.S. Appl. No. 16/360,938, dated Dec. 13, 2021, 73 pages.
U.S. Final Office Action for U.S. Appl. No. 16/360,938 dated May 31, 2022, 66 pages.
U.S. Advisory Action for U.S. Appl. No. 16/360,938 dated Aug. 12, 2022, 3 pages.
U.S. Office Action for U.S. Appl. No. 16/360,938 dated Oct. 3, 2022, 63 pages.
U.S. Office Action for U.S. Appl. No. 17/813,749 dated Jan. 5, 2023,48 pages.
U.S. Office Action for U.S. Appl. No. 16/859,763 dated Mar. 9, 2022, 10 pages.
U.S. Notice of Allowance for U.S. Appl. No. 16/859,763 dated Jul. 7, 2022, 8 pages.
U.S. Notice of Allowance dated Oct. 20, 2022, issued in U.S. Appl. No. 16/859,763 (8 pages).
U.S. Office Action dated Feb. 16, 2023, issued in U.S. Appl. No. 17/003,743 (33 pages).
U.S. Notice of Allowance for U.S. Appl. No. 16/859,763 dated Mar. 22, 2023, 10 pages.
U.S. Final Rejection for U.S. Appl. No. 16/360,938 dated Mar. 28, 2023, 43 pages.
U.S. Final Rejection for U.S. Appl. No. 17/003,743, filed Jun. 9, 2023, 42 pages.
U.S. Final Rejection for U.S. Appl. No. 17/813,749, filed Jun. 20, 2023, 71 pages.
U.S. Notice of Allowance dated Jul. 19, 2023, issued in U.S. Appl. No. 16/859,763 (10 pages).
U.S. Office Action for U.S. Appl. No. 16/360,938 dated Sep. 12, 2023, 60 pages.
U.S. Office Action dated Oct. 11, 2023, issued in U.S. Appl. No. 18/157,335 (10 pages).

(56) References Cited

OTHER PUBLICATIONS

U.S. Notice of Allowance dated Nov. 2, 2023, issued in U.S. Appl. No. 16/859,763 (10 pages).
U.S. Office Action dated Nov. 24, 2023, issued in U.S. Appl. No. 17/813,749 (56 pages).
U.S. Final Office Action dated Jan. 29, 2024, issued in U.S. Appl. No. 16/360,938 (46 pages).
U.S. Notice of Allowance dated Feb. 16, 2024, issued in U.S. Appl. No. 16/859,763 (11 pages).
U.S. Notice of Allowance dated Mar. 20, 2024, issued in U.S. Appl. No. 18/157,335 (9 pages).
U.S. Office Action dated Apr. 12, 2024, issued in U.S. Appl. No. 17/003,743 (24 pages).
U.S. Final Office Action dated Apr. 24, 2024, issued in U.S. Appl. No. 17/813,749 (60 pages).
U.S. Notice of Allowance dated Jun. 5, 2024, issued in U.S. Appl. No. 16/859,763 (10 pages).
U.S. Office Action dated Jul. 30, 2024, issued in U.S. Appl. No. 16/360,938 (71 pages).
U.S. Notice of Allowance dated Aug. 2, 2024, issued in U.S. Appl. No. 18/157,335 (9 pages).
U.S. Final Office Action dated Sep. 6, 2024, issued in U.S. Appl. No. 17/003,743 (26 pages).
U.S. Notice of Allowance dated Sep. 25, 2024, issued in U.S. Appl. No. 16/859,763 (10 pages).
U.S. Office Action dated Oct. 9, 2024, issued in U.S. Appl. No. 17/813,749 (73 pages).
U.S. Final Office Action dated Nov. 22, 2024, issued in in U.S. Appl. No. 16/360,938 (49 pages).

* cited by examiner

LIGHT-EMITTING DEVICE AND AN ELECTRONIC APPARATUS INCLUDING SAME

CROSS-REFERENCE TO RELATED APPLICATION

This application claims priority from and the benefit of Korean Patent Application No. 10-2020-0175824, filed on Dec. 15, 2020, which is incorporated by reference for all purposes as if fully set forth herein.

BACKGROUND

Field

Embodiments of the invention relate generally to display devices, and more particularly, a light-emitting device and an electronic apparatus including the same.

Discussion of the Background

Light-emitting devices are self-emission devices that have wide viewing angles, high contrast ratios, short response times, and excellent characteristics in terms of luminance, driving voltage, and response speed, compared to devices in the art.

In a light-emitting device, a first electrode is located on a substrate, and a hole transport region, an emission layer, an electron transport region, and a second electrode are sequentially formed on the first electrode. Holes provided from the first electrode may move toward the emission layer through the hole transport region, and electrons provided from the second electrode may move toward the emission layer through the electron transport region. Carriers, such as the holes and the electrons, recombine in the emission layer to thereby produce light.

The above information disclosed in this Background section is only for understanding of the background of the inventive concepts, and, therefore, it may contain information that does not constitute prior art.

SUMMARY

Light-emitting devices and electronic apparatuses including the same constructed according to the principles and illustrative implementations of the invention have improved lifespan compared to the related art. For example, light emitting devices made according to the principles and one or more embodiments of the invention may have an efficiency equivalent to that of the related art, but a lifespan improved by 20% or more.

Additional features of the inventive concepts will be set forth in the description which follows, and in part will be apparent from the description, or may be learned by practice of the inventive concepts.

According to one aspect of the invention, a light-emitting device includes: a first electrode; a second electrode facing the first electrode; an interlayer including an emission layer between the first electrode and the second electrode; and an electron transport region including a layer including a red dopant compound between the emission layer and the second electrode and including: a hole blocking layer; and an electron transport layer, an electron injection layer, or any combination thereof, wherein the emission layer includes a first host, a second host, a first dopant, and a second dopant.

The first electrode may be an anode, and the second electrode may be a cathode.

The first electrode may be an anode, the second electrode may be a cathode, and the interlayer may further include a hole transport region between the first electrode and the emission layer and including a hole injection layer, a hole transport layer, an electron blocking layer, or any combination thereof.

The emission layer may be configured to emit blue light.

The emission layer may not contact the layer including the red dopant compound.

The first dopant may include a phosphorescent dopant, and the second dopant may include a thermally activated delayed fluorescence dopant.

Any one of the first dopant and the second dopant may have more intersystem crossing occurring than emission of light.

The first dopant may have a phosphorescent dopant, the second dopant may have a thermally activated delayed fluorescence dopant, and the first dopant may have more intersystem crossing occurring than emission of light.

The hole blocking layer may include Compound HB, and a value of T1 energy of Compound HB (T1_HB) and a value of T1 energy of the red dopant compound (T1_RD) satisfy the following Equation (1):

$$T1\_HB > T1\_RD \quad (1).$$

The hole blocking layer may include Compound HB, and Compound HB may have an absolute value of highest occupied molecular orbital energy (HOMO_HB) the red dopant compound may have an absolute value of highest occupied molecular orbital energy (HOMO_RD) that satisfy the following Equation (2):

$$|HOMO\_HB| > |HOMO\_RD| \quad (2).$$

The hole blocking layer may include Compound HB, and Compound HB may have a value of T1_HB from about 2.5 eV to about 3.5 eV.

The red dopant compound may have a value of T1_RD from about 1.5 eV to about 2.5 eV.

The first host may include a hole transporting host, and the second host may include an electron transporting host.

The hole blocking layer may include the layer including the red dopant compound.

The first host may include any one of the following compounds 1H-1 to 1H-7, as described herein.

The second host may include any one of the following compounds 2H-1 to 2H-7, as described herein.

The first dopant may include any one of the following compounds 1D-1 to 1D-10, as described herein.

The second dopant may include any one of the following compounds DF8 and 2D-1 to 2D-7, as described herein.

The red dopant compound may include any one of the following compounds PD9, PD11, and PD26-PD28.

An electronic apparatus may include the light-emitting device, as described above.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

DETAILED DESCRIPTION

Figure 1:
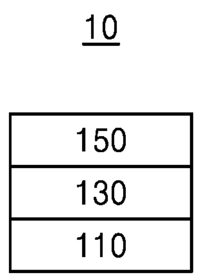
FIG. 1 is a schematic view of an embodiment of a structure of a light-emitting device constructed according to the principles of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

A light-emitting device according to an embodiment includes: a first electrode; a second electrode facing the first electrode; an interlayer located between the first electrode and the second electrode and including an emission layer; and an electron transport region located between the emission layer and the second electrode and including: a hole blocking layer; and an electron transport layer, an electron injection layer, or any combination thereof, the emission layer may include a first host, a second host, a first dopant, and a second dopant, and the electron transport region may include a layer including a red dopant compound.

In an embodiment, the electrode may be an anode, and the second electrode may be a cathode. In an embodiment, a light-emitting device may include: an anode; a cathode facing the anode; an interlayer located between the anode and the cathode and including an emission layer; and an electron transport region located between the emission layer and the cathode and including: a hole blocking layer; and an electron transport layer, an electron injection layer, or any combination thereof, the emission layer may include a first host, a second host, a first dopant, and a second dopant, and the electron transport region may include a layer including a red dopant compound.

In an embodiment, the first electrode may be an anode, the second electrode may be a cathode, and the interlayer may further include a hole transport region located between the first electrode and the emission layer and including a hole injection layer, a hole transport layer, an electron blocking layer, or any combination thereof. For example, the red dopant compound may be a red phosphorescent dopant compound.

In an embodiment, the emission layer may emit blue light. In an embodiment, the emission layer may not be in contact with the layer including a red dopant compound. In an embodiment, the first dopant may be a phosphorescent dopant, and the second dopant may be a thermally activated delayed fluorescence dopant. The weight ratio of the first dopant to the second dopant in the emission layer may be from about 5:3 to about 3:5. When the weight ratio of the first dopant to the second dopant is in the range above, an operation of light-emitting system through intersystem crossing becomes optimal.

In an embodiment, any one of the first dopant and the second dopant may have more intersystem crossing occurring than emission of light. In an embodiment, the first dopant may be a phosphorescent dopant, the second dopant may be a thermally activated delayed fluorescence dopant, and the first dopant may have more intersystem crossing occurring than emission of light. The first dopant in the light-emitting device may have more intersystem crossing (ISC) actively occurring than emission of light. Due to the ISC, singlet excitons generated by a host may be transferred to the second dopant.

In an embodiment, about 20% to about 30% of the phosphorescent dopant, which is the first dopant, may emit light, and ISC may occur in about 70% to about 80% of the phosphorescent dopant. Singlet excitons generated by the first hot, singlet excitons generated by the second host, and/or excitons generated by the first host and the second host may be transferred to the thermally activated delayed fluorescence dopant, which is the second dopant, due to the ISC.

In an embodiment, the hole blocking layer of the light-emitting device may include Compound HB, and the value of T1 energy of Compound HB (T1_HB) and the value of T1 energy of the red dopant compound (T1_RD) may satisfy the following Equation (1):

$$T1\_HB > T1\_RD \quad (1).$$

In an embodiment, the value of T1_HB of Compound HB may be from about 2.5 eV to about 3.5 eV. In an embodiment, the value of T1_RD of the red dopant compound may be from about 1.5 eV to about 2.5 eV. In an embodiment, the hole blocking layer of the light-emitting device may include Compound HB, and the absolute value of highest occupied molecular orbital (HOMO) energy of Compound HB (HOMO_HB) and the absolute value of HOMO energy of the red dopant compound (HOMO_RD) may satisfy the following Equation (2):

$$|HOMO\_HB| > |HOMO\_RD| \quad (2)$$

In an embodiment, the value of HOMO_HB of Compound HB may be from about −6.5 eV to about −5.5 eV. In an embodiment, the value of HOMO_RD of the red dopant compound may be from about −5.5 eV to about −4.5 eV.

A layer including a red dopant having a relatively low T1 energy value and a relatively low HOMO energy absolute value is located in an electron transport region, and thus holes leaked from an emission layer are trapped by the red dopant of the layer including the red dopant to suppress deterioration of a material (e.g., Compound HB) due to hole retention in the electron transport region and deterioration of a material (e.g., Compound HB) due to exciton formation. Thus, the lifespan is improved.

When the value of T1_HB of Compound HB and the value of T1_RD of the red dopant compound satisfy Equation (1) above and the absolute value of HOMO_HB of Compound HB and the absolute value of HOMO_RD of the red dopant compound satisfy Equation (2) above, improvement in lifespan becomes optimal.

In an embodiment, the first host may be a hole transporting host, and the second host may be an electron transporting host. The weight ratio of the first dopant to the second dopant in the emission layer may be from about 7:3 to about 3:7. The weight ratio of the first host, which is a hole transporting host, to the second host, which is an electron transporting host, is within the range above, transporting of holes and transporting of electrons may be desirably balanced.

In an embodiment, the hole blocking layer may include the layer including a red dopant compound. In an embodiment, the hole blocking layer may include a first hole blocking layer and a second hole blocking layer. In an embodiment, the hole blocking layer may include a first hole blocking layer and a second hole blocking layer, the second hole blocking layer may include the red dopant compound, the first hole blocking layer may not include the red dopant compound, the first hole blocking layer may be in contact with the emission layer. The second hole blocking layer may include the red dopant compound, and may not be in contact with the emission layer.

In an embodiment, a light-emitting device according to an embodiment may include emission layer/first hole blocking layer not including a red dopant compound/second hole blocking layer including a red dopant compound/electron transport layer structure. In an embodiment, a light-emitting device according to an embodiment may include hole transport layer/electron blocking layer/emission layer/first hole blocking layer not including a red dopant compound/second hole blocking layer including a red dopant compound/electron transport layer structure.

The amount of the red dopant compound in the second hole blocking layer may be from about 0.5 weight percent (wt %) to about 7 wt %. In an embodiment, the amount of the red dopant compound in the second hole blocking layer may be from about 1 wt % to about 5 wt %. When the amount of the red dopant compound is within the range, the layer including the red dopant compound (e.g. second hole blocking layer) may be optimal for trapping holes leaked from the emission layer.

In an embodiment, for example, the value of HOMO energy of the electron blocking layer compound may be greater than the value of HOMO energy of the hole transport layer compound. In an embodiment, the absolute value of lowest unoccupied molecular orbital (LUMO) energy of a hole blocking layer compound may be greater than the absolute value of LUMO energy of the electron transport layer compound.

The host and the dopant are described in further detail below. An electronic apparatus according to another aspect includes the light-emitting device. In an embodiment, the electronic apparatus may further include a thin-film transistor, the thin-film transistor may include a source electrode and a drain electrode, and the first electrode of the light-emitting device may be electrically connected to at least one of the source electrode and the drain electrode of the thin-film transistor. In an embodiment, the electronic apparatus may further include a color filter, a color conversion layer, a touch screen layer, a polarizing layer, or any combination thereof.

Description of FIG. 1

FIG. 1 is a schematic view of an embodiment of a structure of a light-emitting device constructed according to the principles of the invention.

The light-emitting device 10 includes a first electrode 110, an interlayer 130, and a second electrode 150. Hereinafter, a structure of the light-emitting device 10 according to an embodiment and a method of manufacturing the light-emitting device 10 will be described in connection with FIG. 1.

First Electrode 110

In FIG. 1, a substrate may be additionally located under the first electrode 110 or above the second electrode 150. As the substrate, a glass substrate or a plastic substrate may be used. In an embodiment, the substrate may be a flexible substrate, and may include plastics with excellent heat resistance and durability, such as a polyimide, a polyethylene terephthalate (PET), a polycarbonate, a polyethylene naphthalate, a polyarylate (PAR), a polyetherimide, or any combination thereof. The first electrode 110 may be formed by, for example, depositing or sputtering a material for forming the first electrode 110 on the substrate. When the first electrode 110 is an anode, the material for forming the first electrode 110 may be a high work function material that facilitates injection of holes.

The first electrode 110 may be a reflective electrode, a semi-transmissive electrode, or a transmissive electrode. When the first electrode 110 is a transmissive electrode, the material for forming the first electrode 110 may include an indium tin oxide (ITO), an indium zinc oxide (IZO), a tin oxide ($SnO_2$), a zinc oxide (ZnO), or any combinations thereof. In one or more embodiments, when the first electrode 110 is a semi-transmissive electrode or a reflective electrode, magnesium (Mg), silver (Ag), aluminum (Al), aluminum-lithium (Al—Li), calcium (Ca), magnesium-indium (Mg—In), magnesium-silver (Mg—Ag), or any combinations thereof may be used as the material for forming a first electrode. The first electrode 110 may have a single-layered structure consisting of a single layer or a multilayer structure including a plurality of layers. In an embodiment, the first electrode 110 may have a three-layered structure of an ITO/Ag/ITO.

Interlayer 130

The interlayer 130 may be located on the first electrode 110. The interlayer 130 may include an emission layer. The interlayer 130 may further include a hole transport region between the first electrode 110 and the emission layer and an electron transport region between the emission layer and the second electrode 150. The interlayer 130 may further include metal-containing compounds such as organometallic compounds, inorganic materials such as quantum dots, and the like, in addition to various organic materials.

In one or more embodiments, the interlayer 130 may include, i) two or more emission layers sequentially stacked between the first electrode 110 and the second electrode 150 and ii) a charge generation layer located between the two or more emission layers. When the interlayer 130 includes the emission layer and the charge generation layer as described above, the light-emitting device 10 may be a tandem light-emitting device.

Hole Transport Region in Interlayer 130

The hole transport region may have: i) a single-layered structure consisting of a single layer consisting of a single material, ii) a single-layered structure consisting of a single layer consisting of a plurality of different materials, or iii) a multi-layered structure including a plurality of layers including different materials. The hole transport region may include a hole injection layer, a hole transport layer, an emission auxiliary layer, an electron blocking layer, or any combination thereof.

In an embodiment, the hole transport region may have a multi-layered structure including a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron blocking layer structure, wherein, in each structure, layers are stacked sequentially from the first electrode 110. The hole transport region may include a compound represented by Formula 201, a compound represented by Formula 202, or any combination thereof:

Formula 201

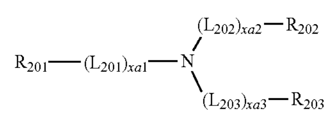

Formula 202

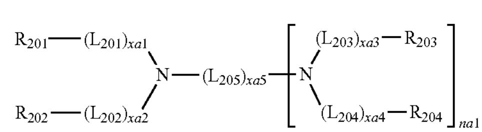

In Formulae 201 and 202, $L_{201}$ to $L_{204}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $L_{205}$ may be *—O—*', *—S—*', *—N($Q_{201}$)-*', a $C_1$-$C_{20}$ alkylene group unsubstituted or substituted with at least one $R_{10a}$, a $C_2$-$C_{20}$ alkenylene group unsubstituted or substituted with at least one $R_{10a}$, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, xa1 to xa4 may each independently an integer from 0 to 5, xa5 may be an integer from 1 to 10, $R_{201}$ to $R_{204}$ and $Q_{201}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_{201}$ and $R_{202}$ may optionally be linked to each other, via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group (for example, a carbazole group or the like) unsubstituted or substituted with at least one $R_{10a}$ (for example, Compound HT16), $R_{203}$ and $R_{204}$ may optionally be linked to each other, via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group unsubstituted or substituted with at least one $R_{10a}$, and na1 may be an integer from 1 to 4.

In an embodiment, each of Formulae 201 and 202 may include at least one of groups represented by Formulae CY201 to CY217.

CY201

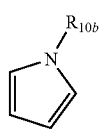

CY202

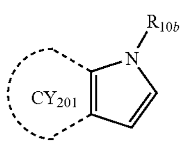

CY203

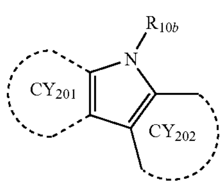

CY204

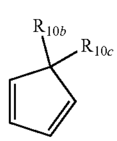

CY205

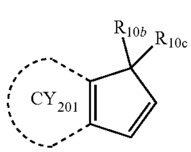

-continued

CY206

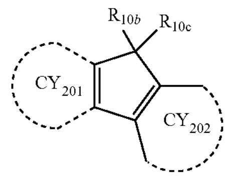

CY207

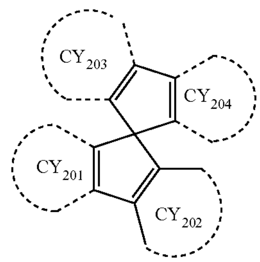

CY208

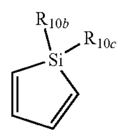

CY209

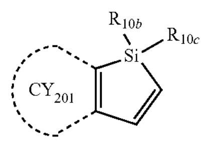

CY210

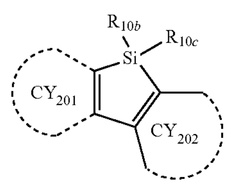

CY211

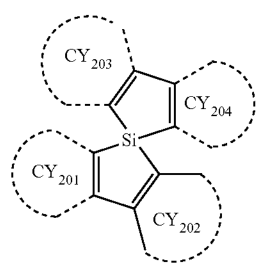

CY212

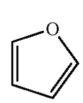

CY213

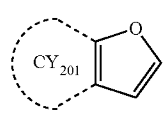

CY214

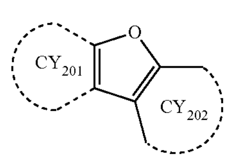

-continued

CY215

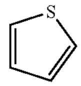

CY216

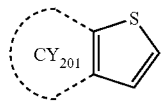

CY217

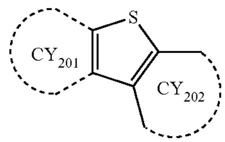

$R_{10b}$ and $R_{10c}$ in Formulae CY201 to CY217 are the same as described in connection with $R_{10a}$, ring CY201 to ring CY204 may each independently be a $C_3$-$C_{20}$ carbocyclic group or a $C_1$-$C_{20}$ heterocyclic group, and at least one hydrogen in Formulae CY201 to CY217 may be unsubstituted or substituted with $R_{10a}$.

In an embodiment, ring CY201 to ring CY204 in Formulae CY201 to CY217 may each independently be a benzene group, a naphthalene group, a phenanthrene group, or an anthracene group. In an embodiment, each of Formulae 201 and 202 may include at least one of groups represented by Formulae CY201 to CY203.

In an embodiment, Formula 201 may include at least one of groups represented by Formulae CY201 to CY203 and at least one of groups represented by Formulae CY204 to CY217. In an embodiment, xa1 in Formula 201 may be 1, $R_{201}$ may be a group represented by one of Formulae CY201 to CY203, xa2 may be 0, and $R_{202}$ may be a group represented by one of Formulae CY204 to CY207. In an embodiment, each of Formulae 201 and 202 may not include a group represented by one of Formulae CY201 to CY203. In an embodiment, each of Formulae 201 and 202 may not include groups represented by Formulae CY201 to CY203, and may include at least one of groups represented by Formulae CY204 to CY217. In an embodiment, each of Formulae 201 and 202 may not include groups represented by Formulae CY201 to CY217.

In an embodiment, the hole transport region may include one of Compounds HT1 to HT49, 4,4',4"-tris[phenyl(m-tolyl)amino]triphenylamine (m-MTDATA), 1-N,1-N-bis[4-(diphenylamino)phenyl]-4-N,4-N-diphenylbenzene-1,4-diamine (TDATA), 4,4',4"-tris[2-naphthyl(phenyl)amino]triphenylamine (2-TNATA), N,N'-di(1-naphthyl)-N,N'-diphenyl-(1,1'-biphenyl)-4,4'-diamine (NPB or NPD), N4,N4'-di(naphthalen-2-yl)-N4,N4'-diphenyl-[1,1'-biphenyl]-4,4'-diamine (β-NPB), N,N'-bis(3-methylphenyl)-N,N'-diphenylbenzidine (TPD), N,N'-bis(3-methylphenyl)-N,N'-diphenyl-9,9-spirobifluorene-2,7-diamine (Spiro-TPD), N2,N7-di-1-naphthalenyl-N2,N7-diphenyl-9,9'-spirobi[9H-fluorene]-2,7-diamine (Spiro-NPB), N,N'-di(1-naphthyl)-N,N-diphenyl-2,2'-dimethyl-(1,1'-biphenyl)-4,4'-diamine (methylated NPB), 4,4'-cyclohexylidenebis[N,N-bis(4-methylphenyl)benzenamine] (TAPC), N,N,N',N'-tetrakis(3-methylphenyl)-3,3'-dimethylbenzidine (HMTPD), 4,4',4"-tris(N-carbazolyl)triphenylamine (TCTA), polyaniline/dodecylbenzenesulfonic acid (PANT/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), or any combination thereof:

HT1

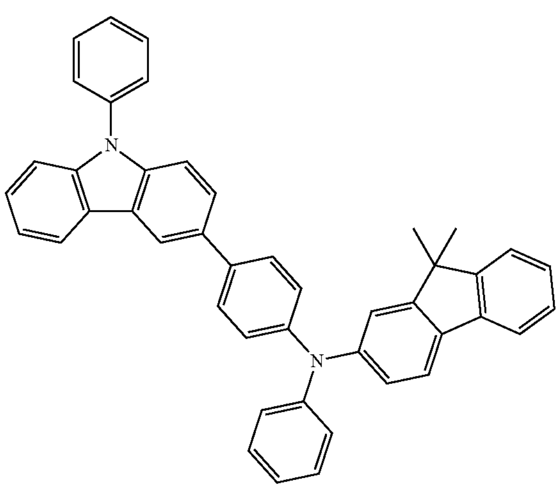

HT2

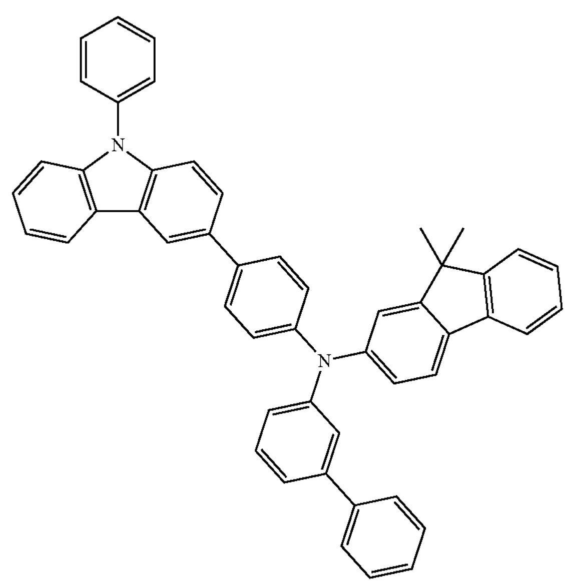

-continued
HT3
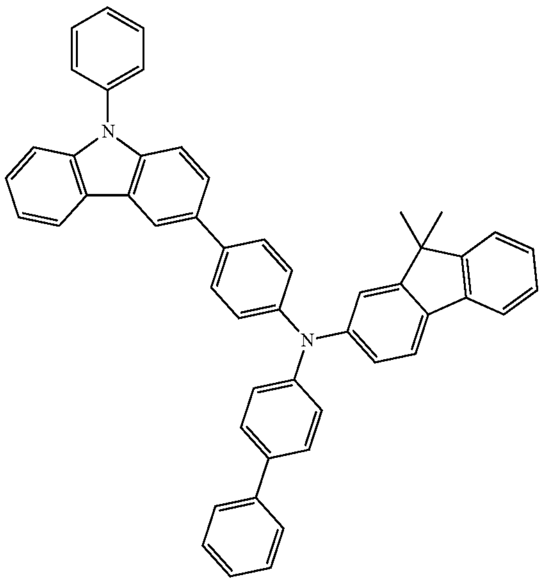
HT4
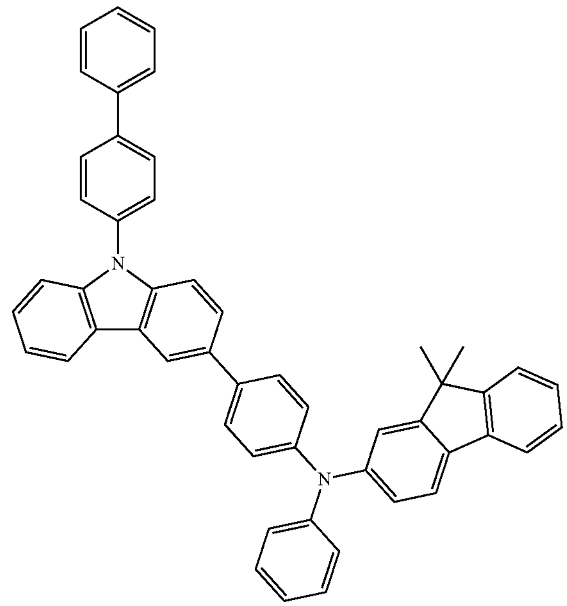
HT5
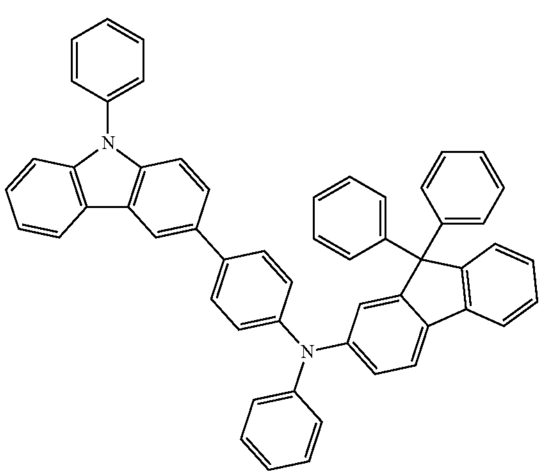
HT6
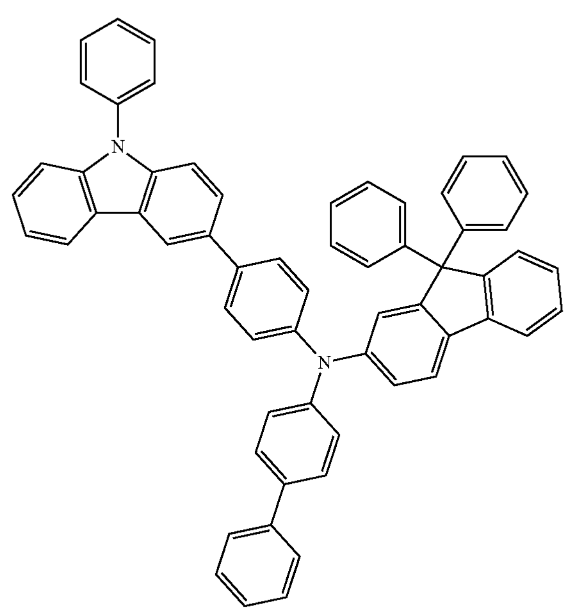

-continued
HT7
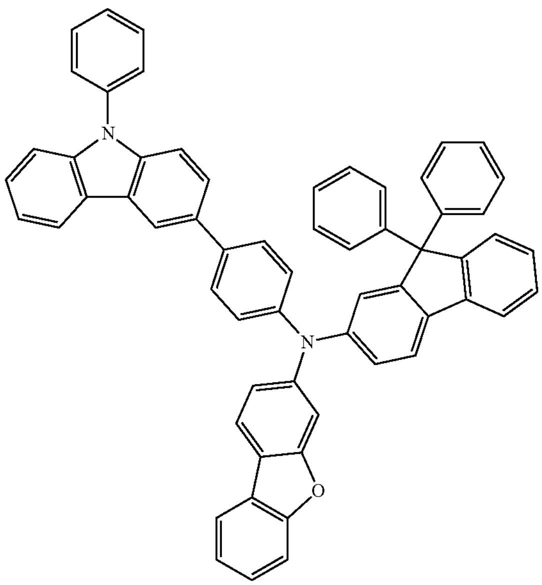
HT8
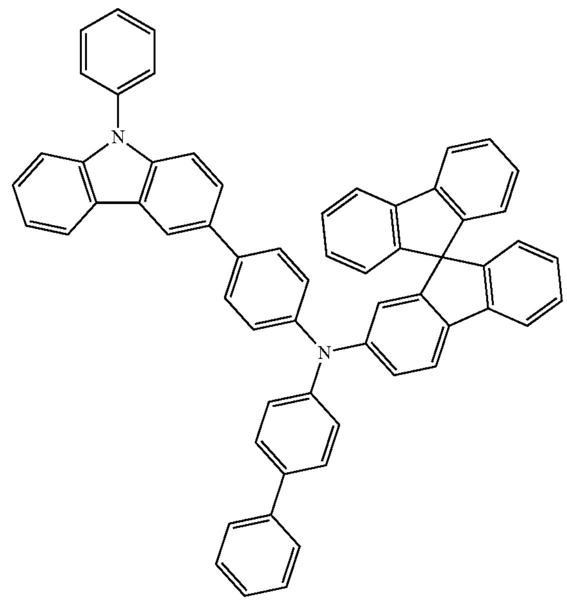
HT9
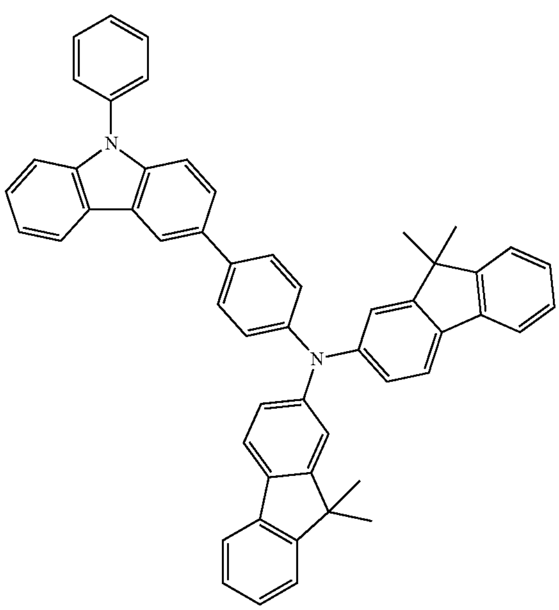
HT10
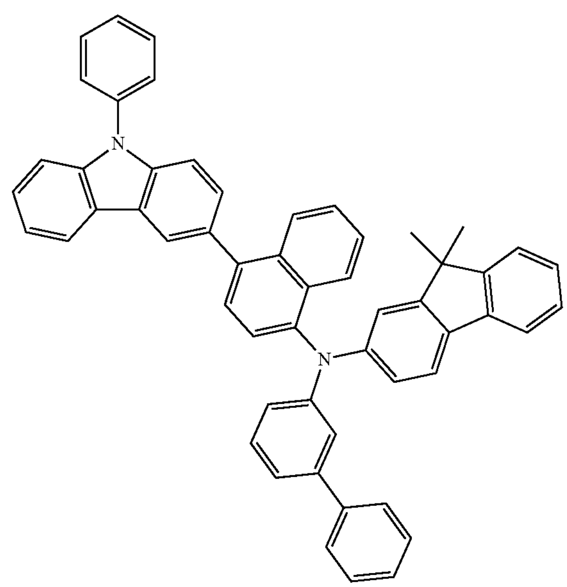

-continued
HT11
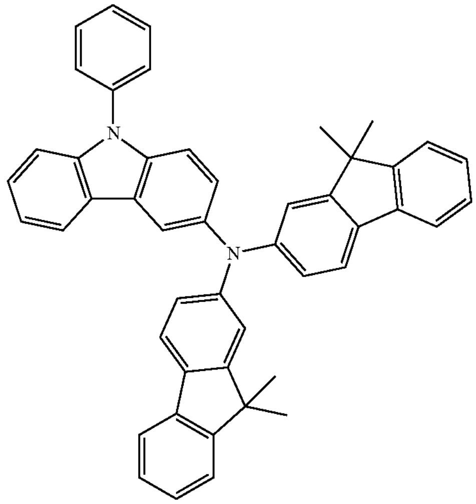
HT12
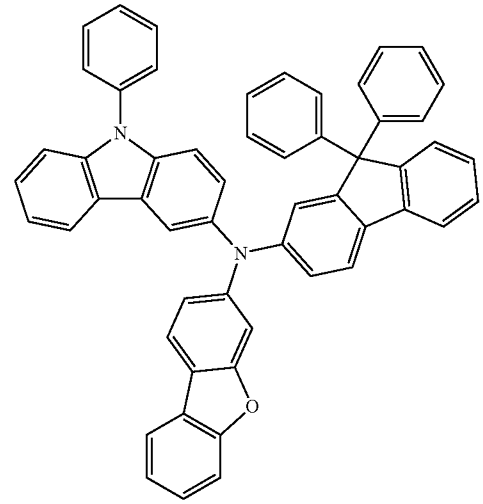
HT13
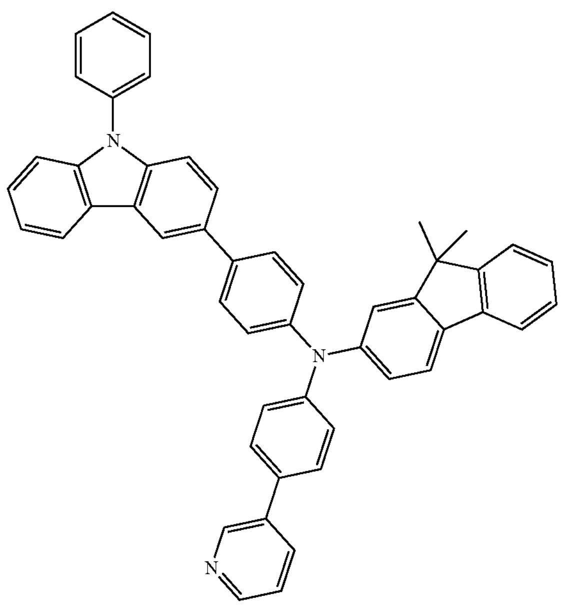
HT14
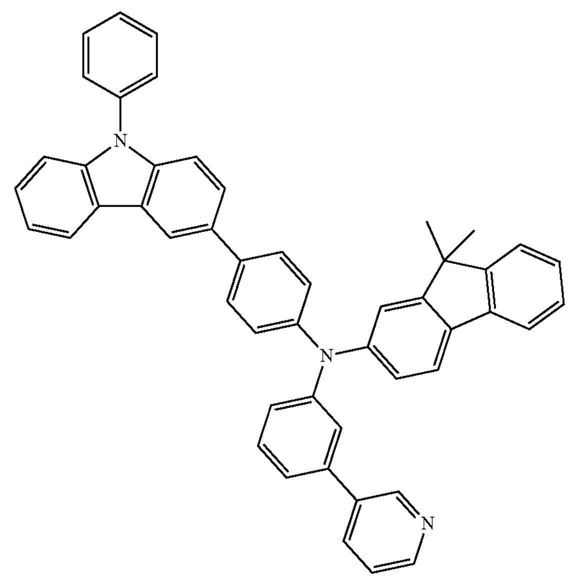
HT15
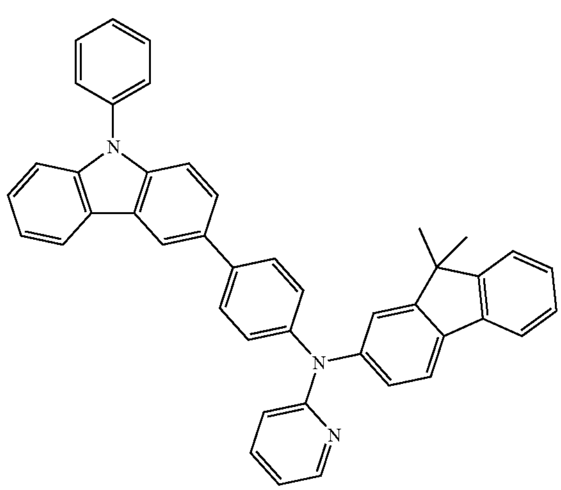
HT16
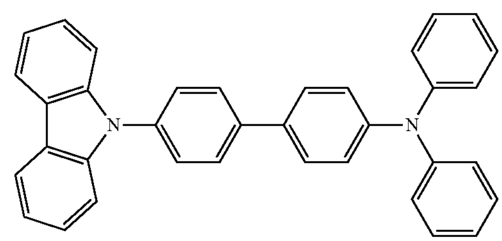

-continued
HT17
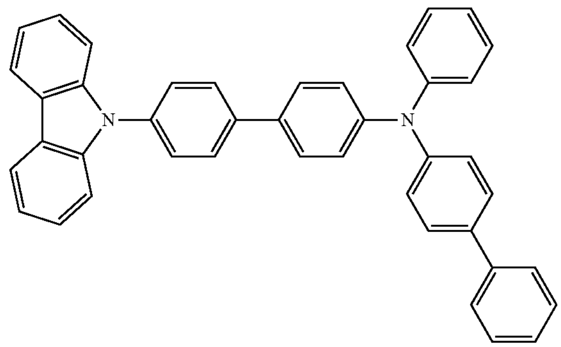
HT18
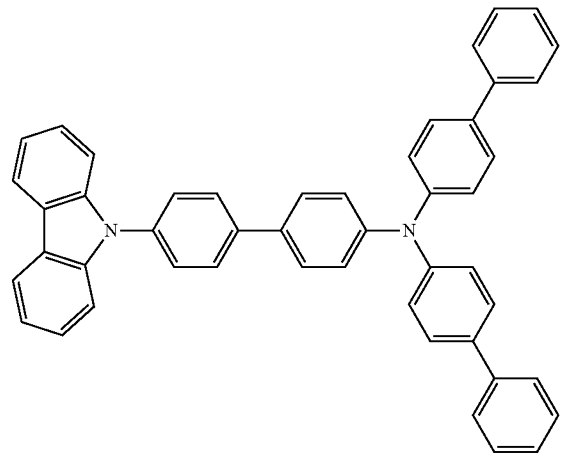
HT19
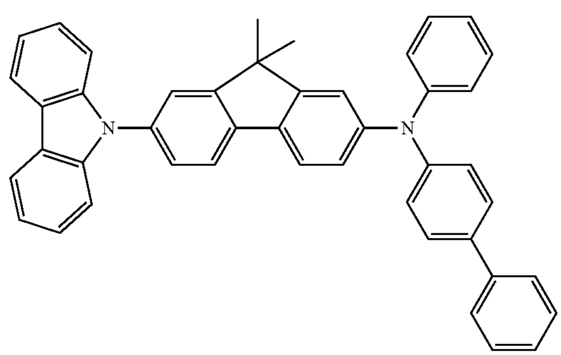
HT20
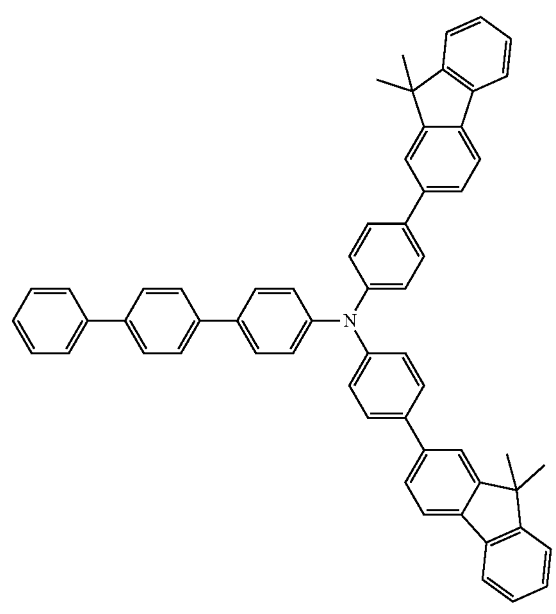

-continued
HT21
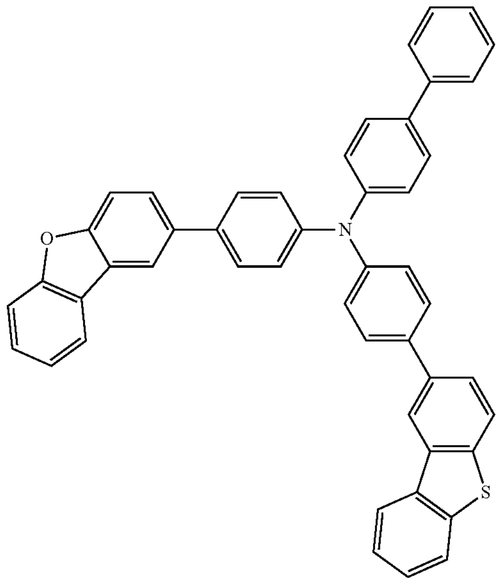
HT22
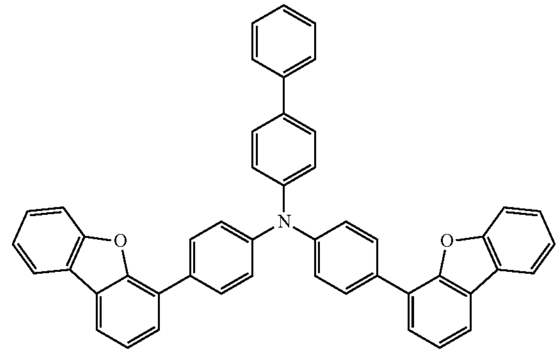
HT23
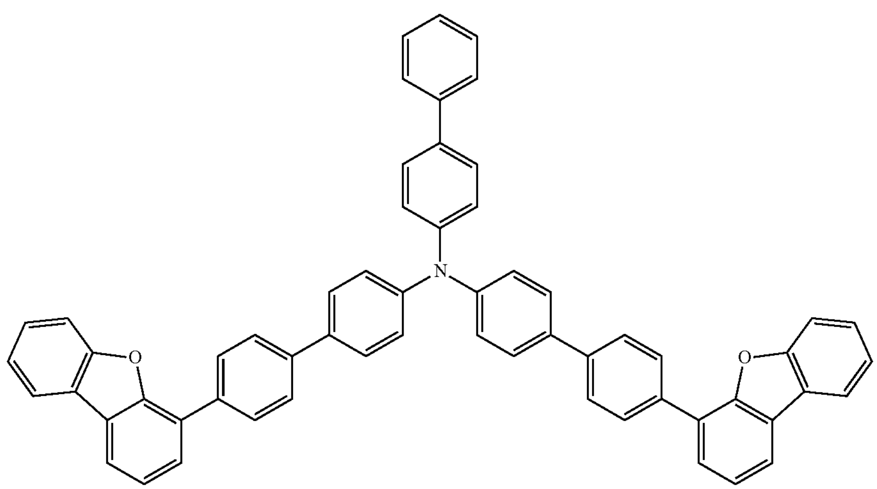

-continued
HT24
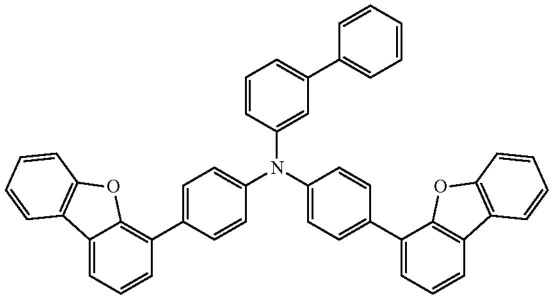
HT25
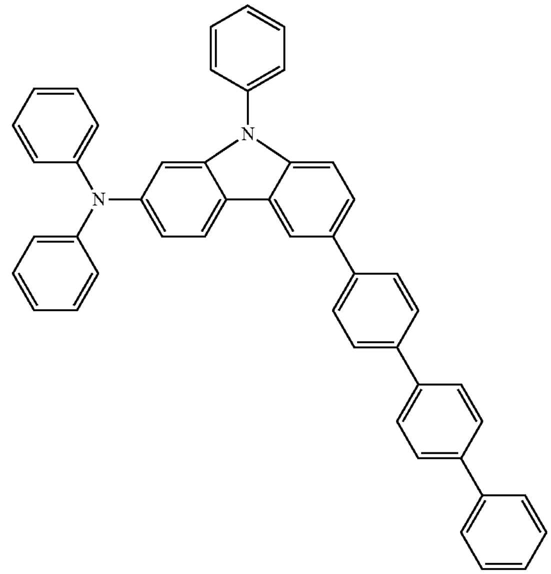
HT26
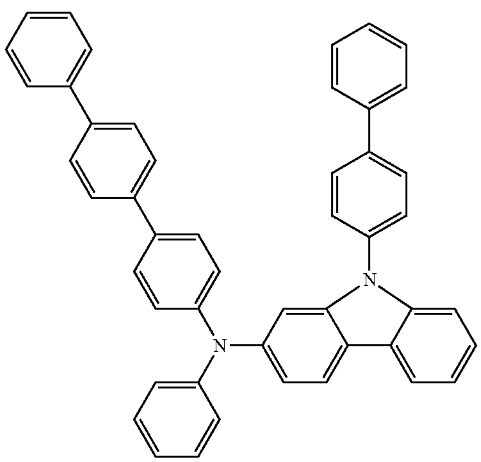
HT27
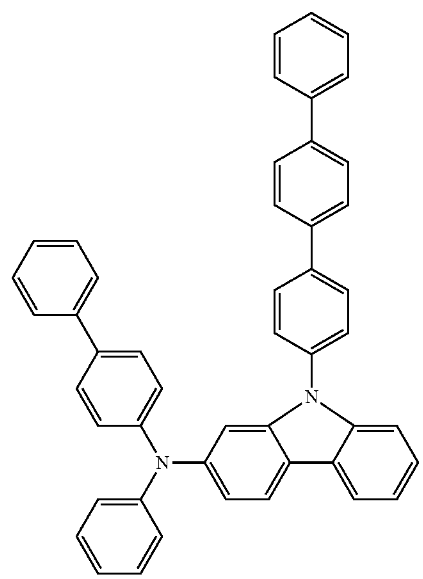
HT28
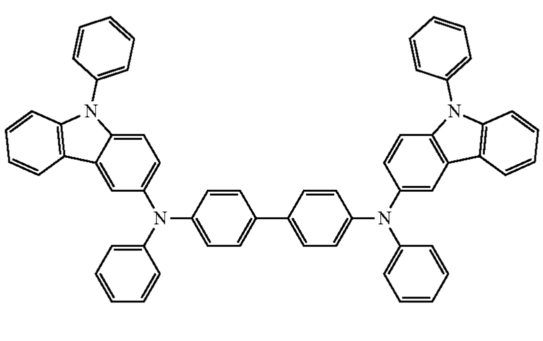
HT29
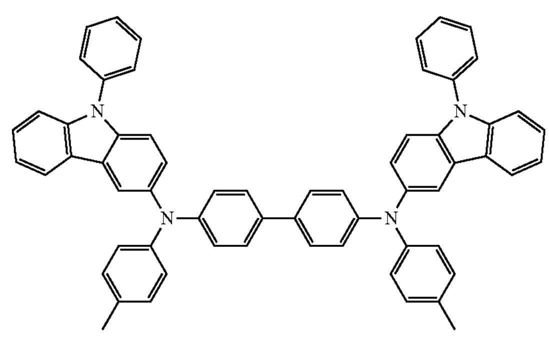

-continued
HT30
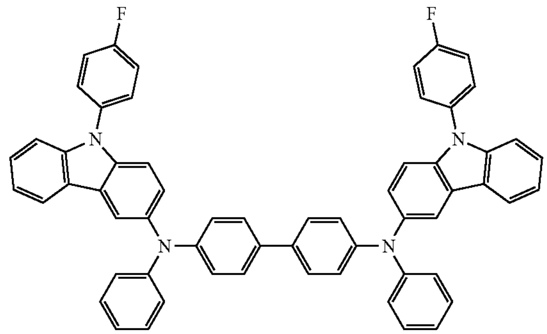
HT31
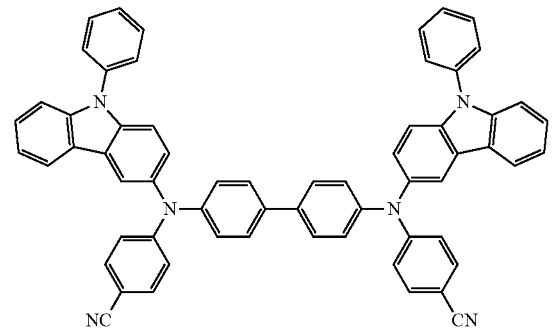
HT32
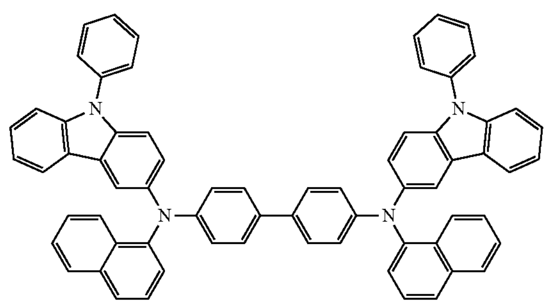
HT33
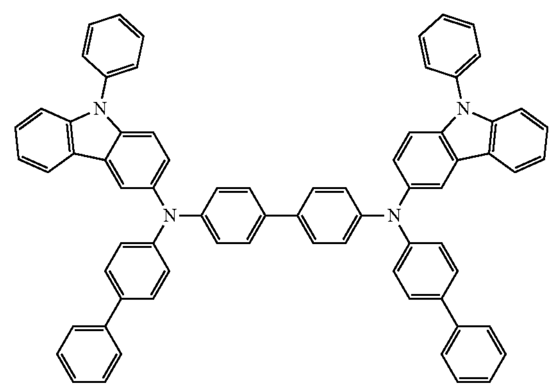
HT34
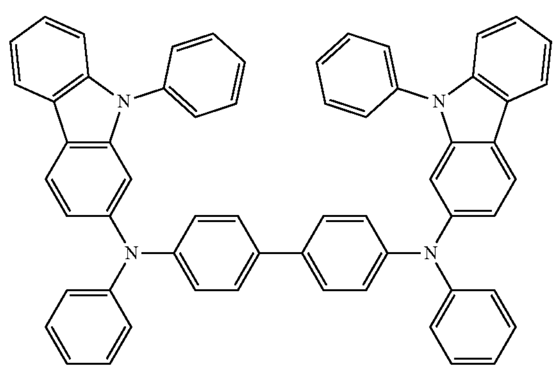
HT35
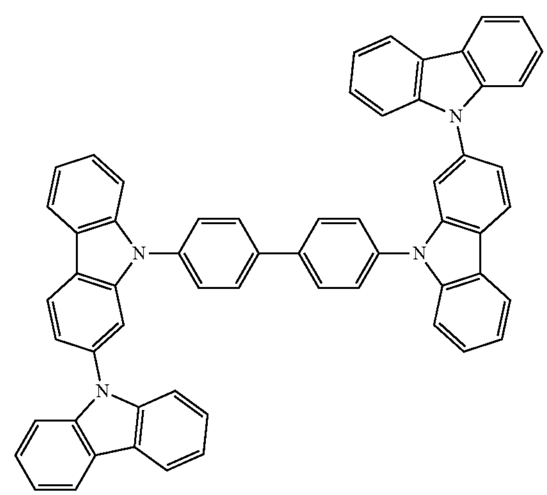

-continued
HT36
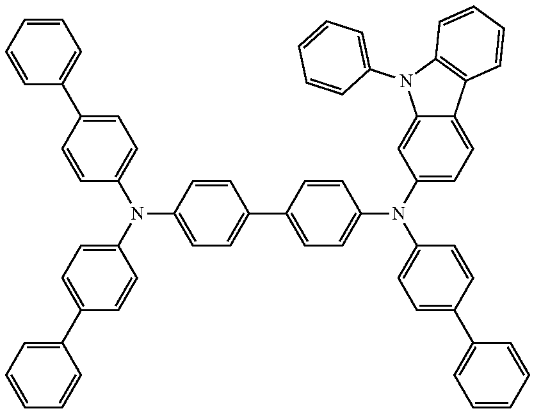
HT37
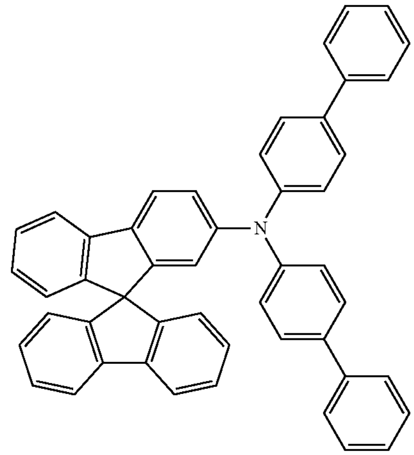
HT38
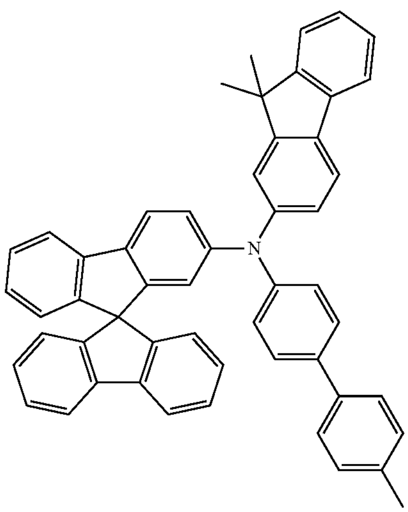
HT39
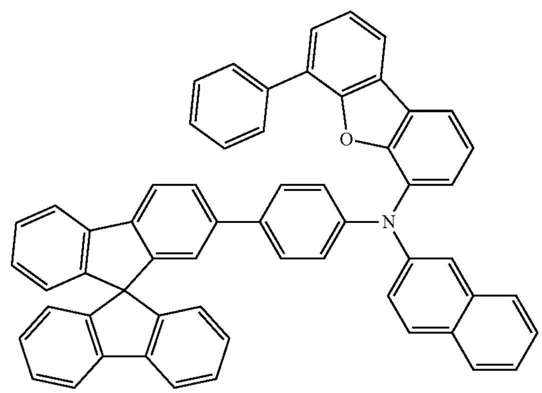
HT40
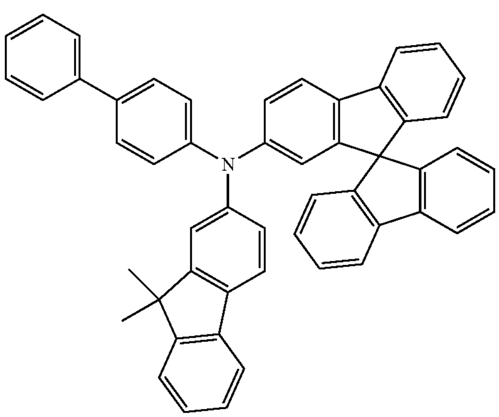
HT41
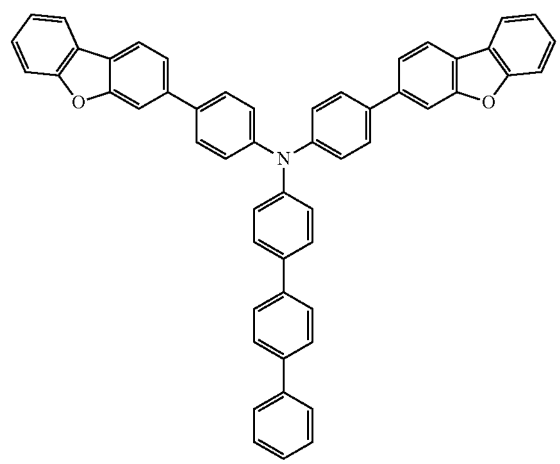

-continued
HT42
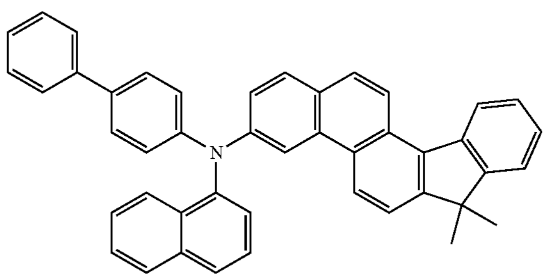
HT43
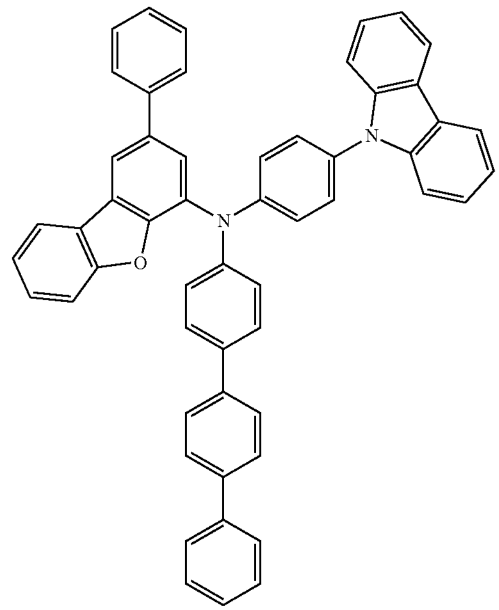
HT44
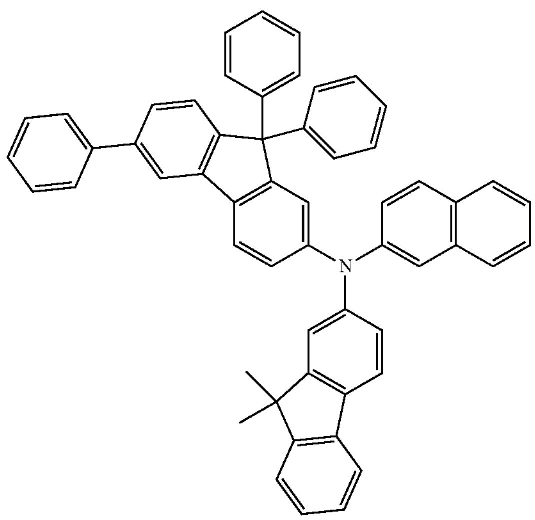
HT45
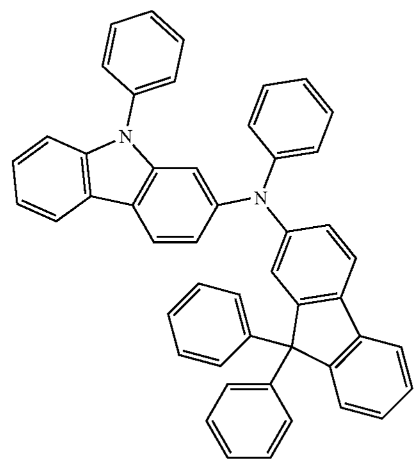
HT46
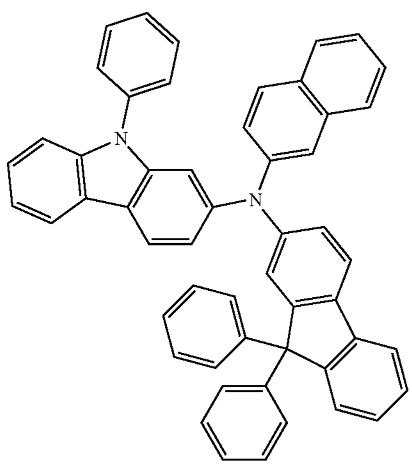
H47
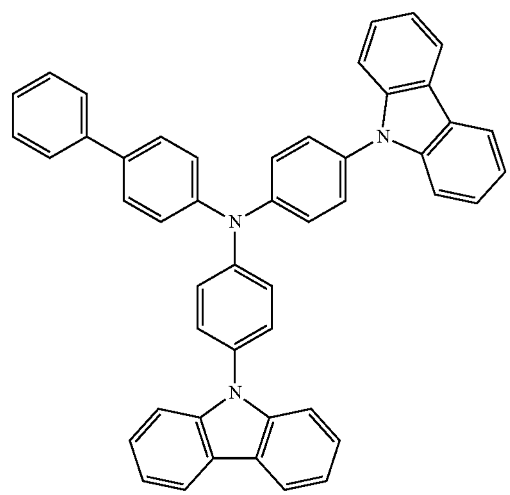

-continued
HT48
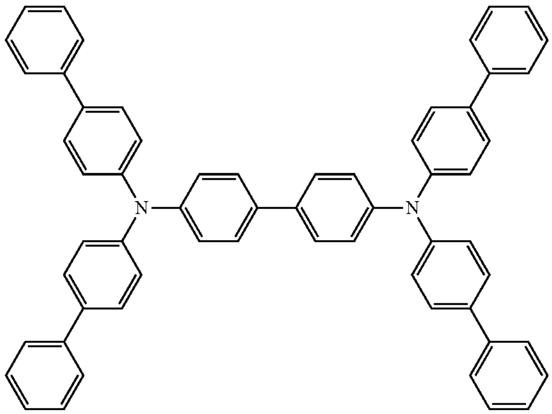
HT49
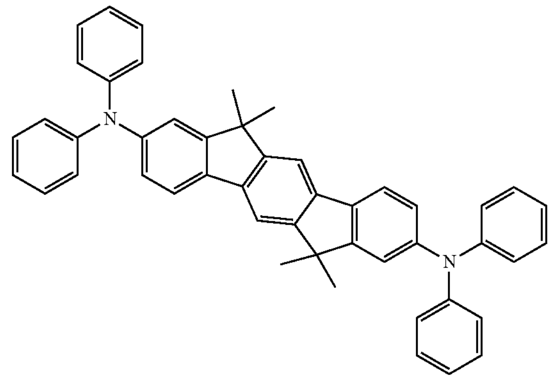
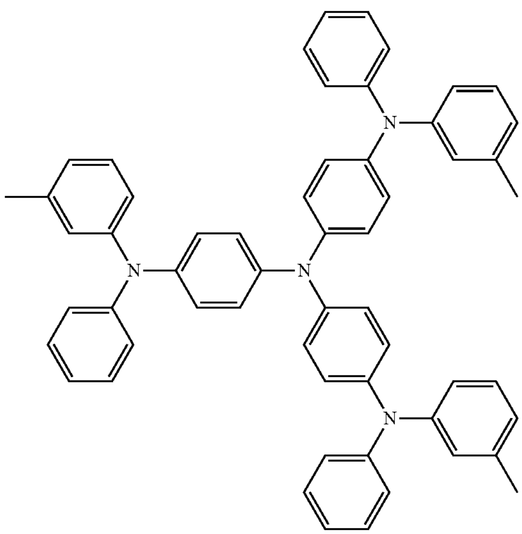
m-MTDATA
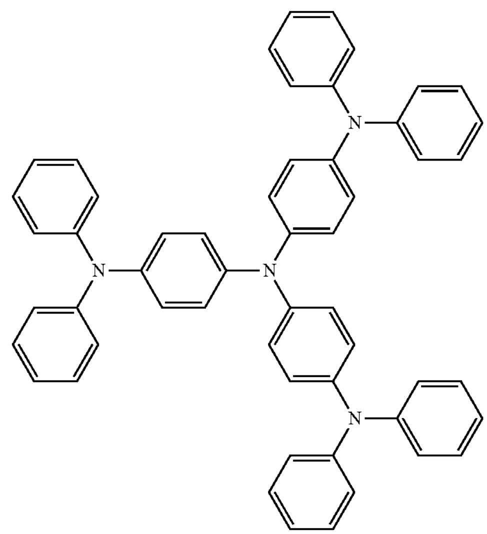
TDATA
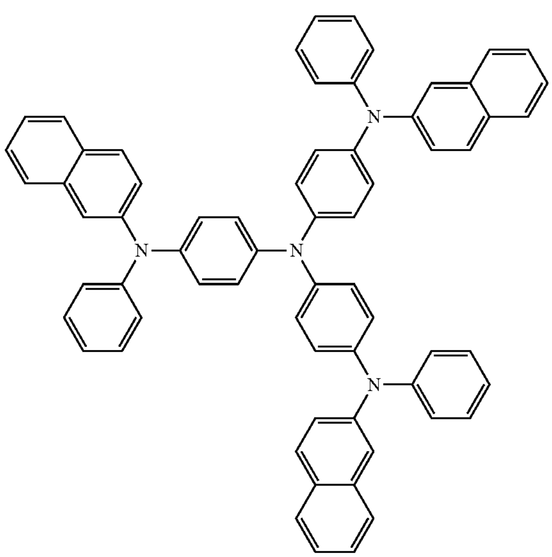
2-TNATA -continued

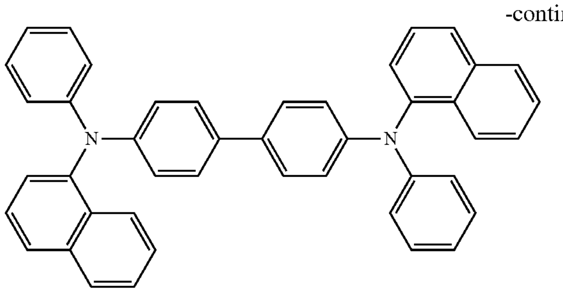

NPB

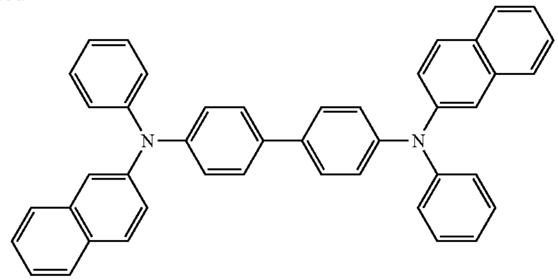

β-NPB

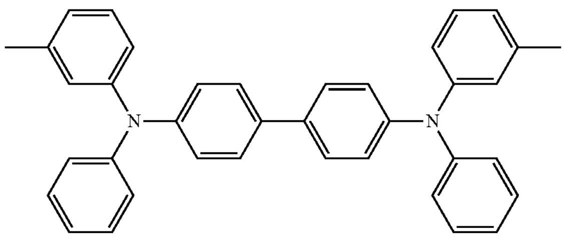

TPD

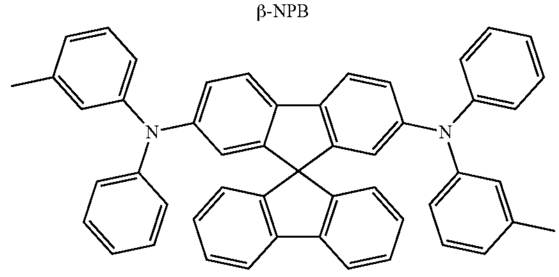

Spiro-TPD

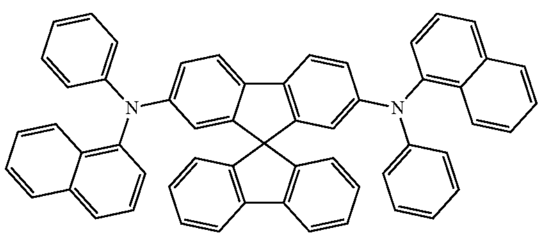

Spiro-NPB

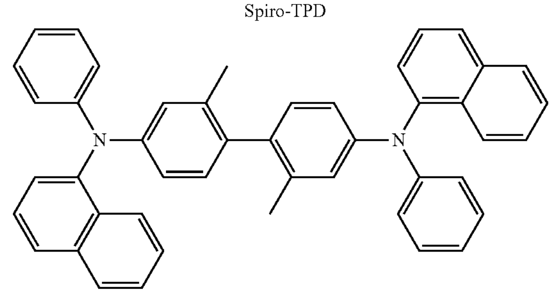

methylated-NPB

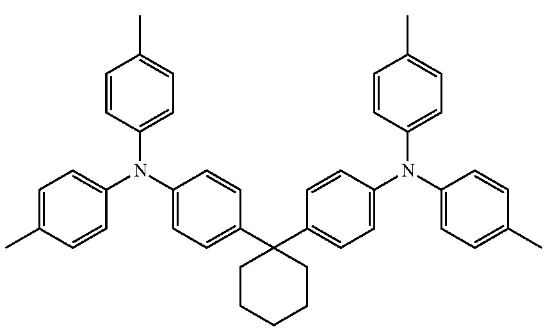

TAPC

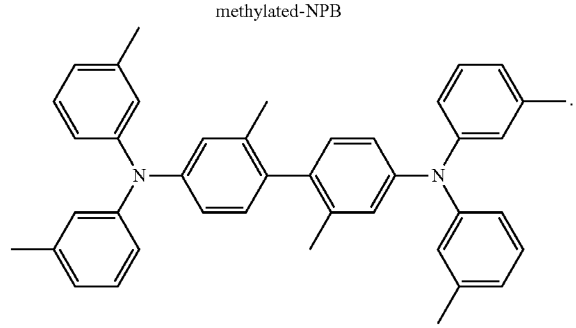

HMTPD

The thickness of the hole transport region may be in a range of about 50 Å to about 10,000 Å, for example, about 100 Å to about 4,000 Å. When the hole transport region includes the hole injection layer, the hole transport layer, or any combination thereof, the thickness of the hole injection layer may be in a range of about 100 Å to about 9,000 Å, for example, about 100 Å to about 1,000 Å, and the thickness of the hole transport layer may be in a range of about 50 Å to about 2,000 Å, for example, about 100 Å to about 1,500 Å. When the thicknesses of the hole transport region, the hole injection layer and the hole transport layer are within these ranges, satisfactory hole-transporting characteristics may be obtained without a substantial increase in driving voltage.

The emission auxiliary layer may increase light-emission efficiency by compensating for an optical resonance distance according to the wavelength of light emitted by an emission layer, and the electron blocking layer may block the leakage of electrons from an emission layer to an electron transport region. Materials that may be included in the hole transport region may be included in the emission auxiliary layer and the electron blocking layer.

p-dopant

The hole transport region may further include, in addition to these materials, a charge-generation material for the improvement of conductive properties. The charge-generation material may be uniformly or non-uniformly dispersed in the hole transport region (for example, in the form of a single layer consisting of a charge-generation material). The charge-generation material may be, for example, a p-dopant. In an embodiment, a LUMO energy level (or a work function) of the p-dopant may be about −3.5 eV or less. In an embodiment, the p-dopant may include a quinone derivative, a cyano group-containing compound, a fluorine-containing compound, a compound containing element EL1 and element EL2, or any combination thereof.

Examples of the quinone derivative may include tetracyanoquinodimethane (TCNQ), 2,3,5,6-tetrafluoro-7,7,8,8-tetracyanoquinodimethane (F4-TCNQ), and the like. Examples of the cyano group-containing compound may include 1,4,5,8,9,12-hexaazatriphenylene-hexacarbonitrile (HAT-CN), a compound represented by Formula 221 below, and the like.

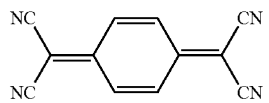

TCNQ

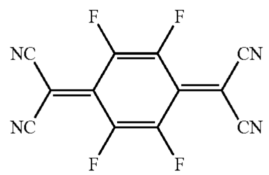

F4-TCNQ

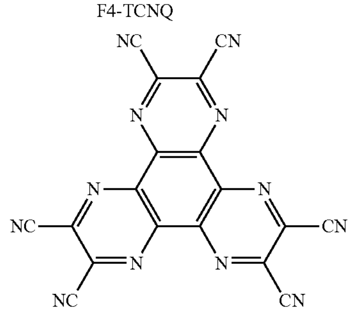

HAT-CN

Formula 221

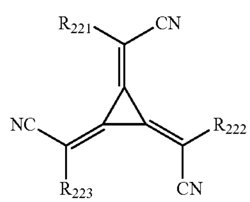

In Formula 221, $R_{221}$ to $R_{223}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, and at least one of $R_{221}$ to $R_{223}$ may each independently be a $C_3$-$C_{60}$ carbocyclic group or a $C_1$-$C_{60}$ heterocyclic group, each substituted with: a cyano group; —F; —Cl; —Br; —I; a $C_1$-$C_{20}$ alkyl group substituted with a cyano group, —F, —Cl, —Br, —I, or any combination thereof; or any combination thereof.

Examples of the fluorine-containing compound may include the following compound:

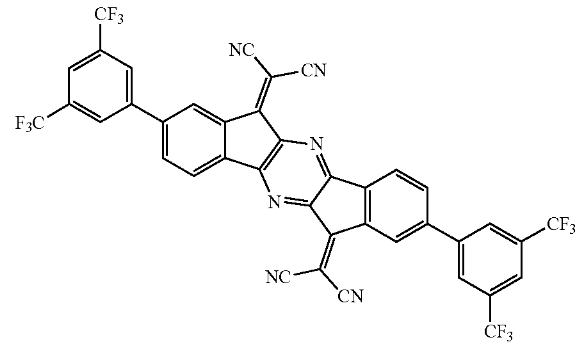 [SMILES: N#CC(C#N)=C1c2cc(-c3cc(C(F)(F)F)cc(C(F)(F)F)c3)ccc2-c2nc3c(nc21)-c1ccc(-c2cc(C(F)(F)F)cc(C(F)(F)F)c2)cc1C3=C(C#N)C#N]

In the compound containing element EL1 and element EL2, element EL1 may be a metal, a metalloid, or a combination thereof, and element EL2 may be a non-metal, a metalloid, or a combination thereof.

Examples of the metal may include: an alkali metal (for example, lithium (Li), sodium (Na), potassium (K), rubidium (Rb), cesium (Cs), etc.); an alkaline earth metal (for example, beryllium (Be), magnesium (Mg), calcium (Ca), strontium (Sr), barium (Ba), etc.); a transition metal (for example, titanium (Ti), zirconium (Zr), hafnium (Hf), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), etc.); a post-transition metal (for example, zinc (Zn), indium (In), tin (Sn), etc.); and a lanthanide metal (for example, lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), etc.).

Examples of the metalloid may include silicon (Si), antimony (Sb), and tellurium (Te). Examples of the non-metal may include oxygen (O) and a halogen (for example, F, Cl, Br, I, etc.).

In an embodiment, examples of the compound containing element EL1 and element EL2 may include a metal oxide, a metal halide (for example, a metal fluoride, a metal chloride, a metal bromide, or a metal iodide), a metalloid halide (for example, a metalloid fluoride, a metalloid chloride, a metalloid bromide, or a metalloid iodide), a metal telluride, or any combination thereof.

Examples of the metal oxide may include a tungsten oxide (for example, WO, $W_2O_3$, $WO_2$, $WO_3$, $W_2O_5$, etc.), a vanadium oxide (for example, VO, $V_2O_3$, $VO_2$, $V_2O_5$, etc.), molybdenum oxide (MoO, $Mo_2O_3$, $MoO_2$, $MoO_3$, $Mo_2O_5$, etc.), and a rhenium oxide (for example, $ReO_3$, etc.). Examples of the metal halide may include an alkali metal halide, an alkaline earth metal halide, a transition metal halide, a post-transition metal halide, and a lanthanide metal halide.

Examples of the alkali metal halide may include LiF, NaF, KF, RbF, CsF, LiCl, NaCl, KCl, RbCl, CsCl, LiBr, NaBr, KBr, RbBr, CsBr, LiI, NaI, KI, RbI, and CsI. Examples of the alkaline earth metal halide may include $BeF_2$, $MgF_2$, $CaF_2$, $SrF_2$, $BaF_2$, $BeCl_2$, $MgCl_2$, $CaCl_2$, $SrCl_2$, $BaCl_2$, $BeBr_2$, $MgBr_2$, $CaBr_2$, $SrBr_2$, $BaBr_2$, $BeI_2$, $MgI_2$, $CaI_2$, $SrI_2$, and $BaI_2$.

Examples of the transition metal halide may include a titanium halide (for example, $TiF_4$, $TiCl_4$, $TiBr_4$, $TiI_4$, etc.), a zirconium halide (for example, $ZrF_4$, $ZrCl_4$, $ZrBr_4$, $ZrI_4$, etc.), a hafnium halide (for example, $HfF_4$, $HfCl_4$, $HfBr_4$, $HfI_4$, etc.), a vanadium halide (for example, $VF_3$, $VCl_3$, $VBr_3$, $VI_3$, etc.), a niobium halide (for example, $NbF_3$, $NbCl_3$, $NbBr_3$, $NbI_3$, etc.), a tantalum halide (for example, $TaF_3$, $TaCl_3$, $TaBr_3$, $TaI_3$, etc.), a chromium halide (for example, $CrF_3$, $CrCl_3$, $CrBr_3$, $CrI_3$, etc.), a molybdenum halide (for example, $MoF_3$, $MoCl_3$, $MoBr_3$, $MoI_3$, etc.), a tungsten halide (for example, $WF_3$, $WCl_3$, $WBr_3$, $WI_3$, etc.), a manganese halide (for example, $MnF_2$, $MnCl_2$, $MnBr_2$, $MnI_2$, etc.), a technetium halide (for example, $TcF_2$, $TcCl_2$, $TcBr_2$, $TcI_2$, etc.), a rhenium halide (for example, $ReF_2$, $ReCl_2$, $ReBr_2$, $ReI_2$, etc.), an iron halide (for example, $FeF_2$, $FeCl_2$, $FeBr_2$, $FeI_2$, etc.), a ruthenium halide (for example, $RuF_2$, $RuCl_2$, $RuBr_2$, $RuI_2$, etc.), an osmium halide (for example, $OsF_2$, $OsCl_2$, $OsBr_2$, $OsI_2$, etc.), a cobalt halide (for example, $CoF_2$, $CoCl_2$, $CoBr_2$, $CoI_2$, etc.), a rhodium halide (for example, $RhF_2$, $RhCl_2$, $RhBr_2$, $RhI_2$, etc.), an iridium halide (for example, $IrF_2$, $IrCl_2$, $IrBr_2$, $IrI_2$, etc.), a nickel halide (for example, $NiF_2$, $NiCl_2$, $NiBr_2$, $NiI_2$, etc.), a palladium halide (for example, $PdF_2$, $PdCl_2$, $PdBr_2$, $PdI_2$, etc.), a platinum halide (for example, $PtF_2$, $PtCl_2$, $PtBr_2$, $PtI_2$, etc.), a copper halide (for example, CuF, CuCl, CuBr, CuI, etc.), a silver halide (for example, AgF, AgCl, AgBr, AgI, etc.), and a gold halide (for example, AuF, AuCl, AuBr, AuI, etc.).

Examples of the post-transition metal halide may include a zinc halide (for example, $ZnF_2$, $ZnCl_2$, $ZnBr_2$, $ZnI_2$, etc.), an indium halide (for example, $InI_3$, etc.), and a tin halide (for example, $SnI_2$, etc.).

Examples of the lanthanide metal halide may include YbF, $YbF_2$, $YbF_3$, $SmF_3$, YbCl, $YbCl_2$, $YbCl_3$, $SmCl_3$, YbBr, $YbBr_2$, $YbBr_3$, $SmBr_3$, YbI, $YbI_2$, $YbI_3$, and $SmI_3$.

Examples of the metalloid halide may include an antimony halide (for example, $SbCl_5$, etc.).

Examples of the metal telluride may include an alkali metal telluride (for example, $Li_2Te$, $Na_2Te$, $K_2Te$, $Rb_2Te$, $Cs_2Te$, etc.), an alkaline earth metal telluride (for example, BeTe, MgTe, CaTe, SrTe, BaTe, etc.), a transition metal telluride (for example, $TiTe_2$, $ZrTe_2$, $HfTe_2$, $V_2Te_3$, $Nb_2Te_3$, $Ta_2Te_3$, $Cr_2Te_3$, $Mo_2Te_3$, $W_2Te_3$, MnTe, TcTe, ReTe, FeTe, RuTe, OsTe, CoTe, RhTe, IrTe, NiTe, PdTe, PtTe, $Cu_2Te$, CuTe, $Ag_2Te$, AgTe, $Au_2Te$, etc.), a post-transition metal telluride (for example, ZnTe, etc.), and a lanthanide metal telluride (for example, LaTe, CeTe, PrTe, NdTe, PmTe, EuTe, GdTe, TbTe, DyTe, HoTe, ErTe, TmTe, YbTe, LuTe, etc.).

Emission Layer in Interlayer 130

When the light-emitting device 10 is a full-color light-emitting device, the emission layer may be patterned into a red emission layer, a green emission layer, and/or a blue emission layer, according to a sub-pixel. In an embodiment, the emission layer may have a stacked structure of two or more layers of the red emission layer, the green emission layer, and the blue emission layer, in which the two or more layers contact each other or are separated from each other. In one or more embodiments, the emission layer may include two or more materials of the red light-emitting material, the green light-emitting material, and the blue light-emitting material, in which the two or more materials are mixed with each other in a single layer to emit white light.

The emission layer may include a host and a dopant. The dopant may include a phosphorescent dopant, a fluorescent dopant, or any combination thereof. The amount of the dopant in the emission layer may be from about 0.01 parts by weight to about 15 parts by weight based on 100 parts by weight of the host. In an embodiment, the emission layer may include a quantum dot. In an embodiment, the emission layer may include a delayed fluorescence material. The delayed fluorescence material may act as a host or a dopant in the emission layer. The thickness of the emission layer may be in a range of about 100 Å to about 1,000 Å, for example, about 200 Å to about 600 Å. When the thickness of the emission layer is within the range, excellent light-emission characteristics may be obtained without a substantial increase in driving voltage.

Host

The hole transporting host may be a compound having strong hole characteristics. The compound having strong hole characteristics refers to a compound that is susceptible to holes, and the compound may have such characteristics by including a moiety (hole transporting moiety) that well receives holes. The moiety that well receives holes may be, for example, a π electron-rich hetero aromatic compound (e.g., a carbazole derivative or an indole derivative) or an aromatic amine.

The electron transporting host may be a compound having strong electron characteristics. A compound having strong electron characteristics refers to a compound that is susceptible to electrons, and the compound may have such characteristics by including a moiety (electron transporting moiety) that receives electrons well. The moiety that receives electrons well may be, for example, a π electron-deficient hetero-aromatic compound. In an embodiment, the moiety that receives electrons well may be a nitrogen-containing hetero-aromatic compound.

When one compound includes only a hole transporting moiety or includes only an electron transporting moiety, it is clear whether the one compound has hole transporting properties or electron transporting properties. One compound may include both a hole transporting moiety and an electron transporting moiety. In this case, simple comparison between the total number of hole transporting moieties in the one compound and the total number of electron transporting moieties in the one compound may be a criterion of predicting whether the one compound has hole transporting properties or electron transporting properties, but may not be an absolute criterion. One of reasons for the case is the fact that one hole transporting moiety and one electron transporting moiety each do not have exactly the same capability to attract holes and electrons.

Accordingly, a relatively reliable method of determining whether a compound of a certain structure has hole transporting properties or electron transporting properties is to implement the compound directly in the device. The hole transporting host and the electron transporting host may each independently include a compound represented by Formula 301:

$$[Ar_{301}]_{xb11}\text{-}[(L_{301})_{xb1}\text{-}R_{301}]_{xb21} \quad \text{Formula 301}$$

wherein, in Formula 301, $Ar_{301}$ and $L_{301}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xb11 may be 1, 2, or 3, xb1 may be an integer from 0 to 5, $R_{301}$ may be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, $—Si(Q_{301})(Q_{302})(Q_{303})$, $—N(Q_{301})(Q_{302})$, $—B(Q_{301})(Q_{302})$, $—C(=O)(Q_{301})$, $—S(=O)_2(Q_{301})$, or $—P(=O)(Q_{301})(Q_{302})$, xb21 may be an integer from 1 to 5, and $Q_{301}$ to $Q_{303}$ are the same as described in connection with $Q_1$.

In an embodiment, when xb11 in Formula 301 is 2 or more, two or more of Ar301(s) may be linked to each other via a single bond.

In an embodiment, the host may include a compound represented by Formula 301-1, a compound represented by Formula 301-2, or any combination thereof:

Formula 301-1

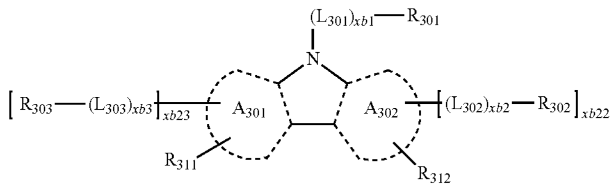

Formula 301-2

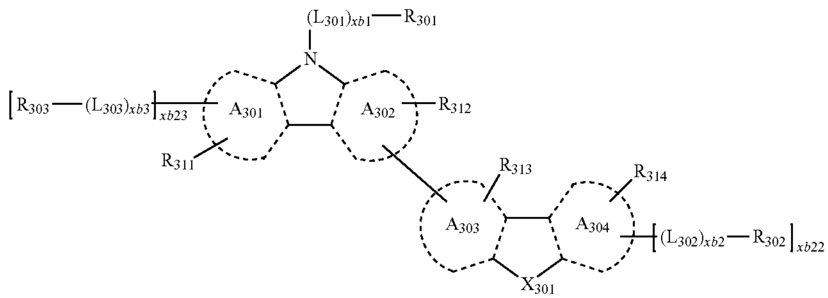

In Formulae 301-1 to 301-2, ring $A_{301}$ to ring $A_{304}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $X_{301}$ may be O, S, N-[$(L_{304})_{xb4}$-$R_{304}$], C($R_{304}$)($R_{305}$), or Si($R_{304}$)($R_{305}$), xb22 and xb23 may each independently be 0, 1, or 2, $L_{301}$, xb1, and $R_{301}$ are the same as described herein, $L_{302}$ to $L_{304}$ are each independently the same as described in connection with $L_{301}$, xb2 to xb4 are each independently the same as described in connection with xb1, and $R_{302}$ to $R_{305}$ and $R_{311}$ to $R_{314}$ are the same as described in connection with $R_{301}$.

In an embodiment, the host may include an alkali earth metal complex, a post-transition metal complex, or a combination thereof. In an embodiment, the host may include a Be complex (for example, Compound H55), an Mg complex, a Zn complex, or a combination thereof.

In an embodiment, the host may include one of Compounds H1 to H124; one of 1H-1 to 1H-7 and 2H-1 to 2H-7; 9,10-di(2-naphthyl)anthracene (ADN); 2-methyl-9,10-bis(naphthalen-2-yl)anthracene (MADN); 9,10-di-(2-naphthyl)-2-t-butyl-anthracene (TBADN); 4,4'-bis(N-carbazolyl)-1,1'-biphenyl (CBP); 1,3-di(carbazol-9-yl)benzene (mCP); 1,3,5-tri(carbazol-9-yl)benzene (TCP); or any combination thereof:

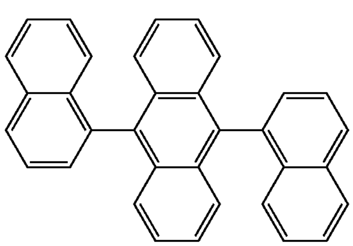

H1

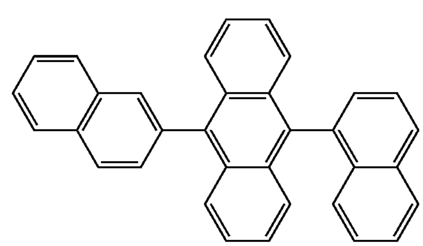

H2

-continued
H3
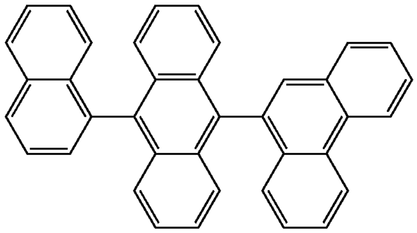
H4
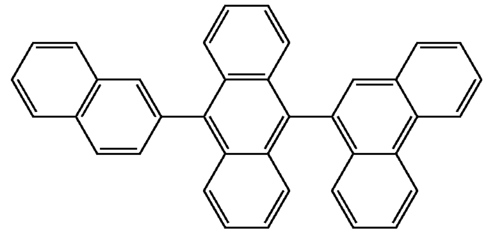
H5
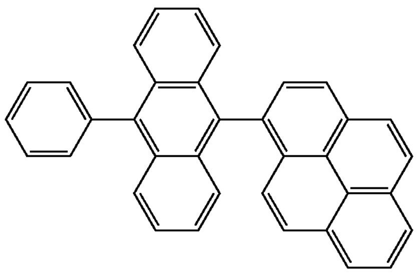
H6
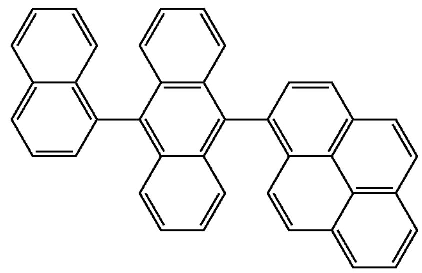
H7
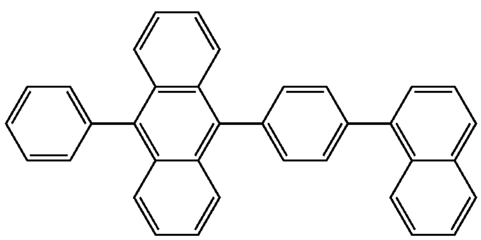
H8
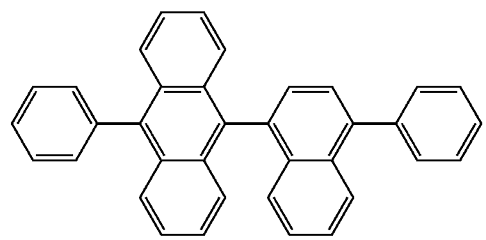
H9
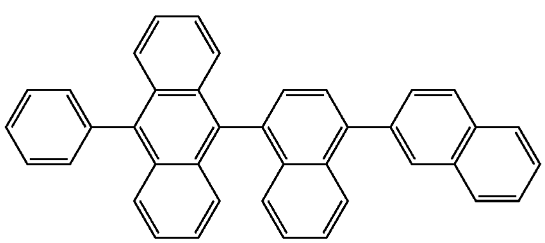
H10
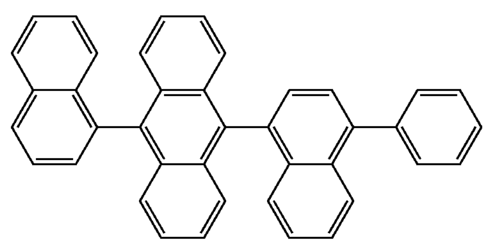
H11
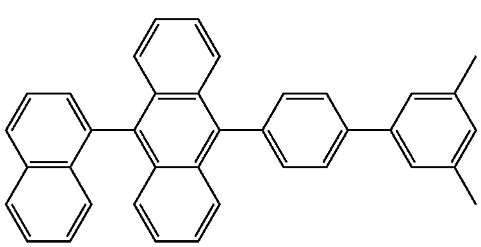
H12
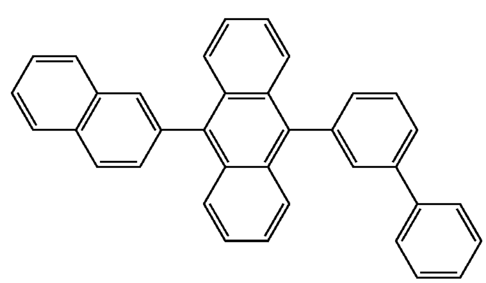

-continued
H13
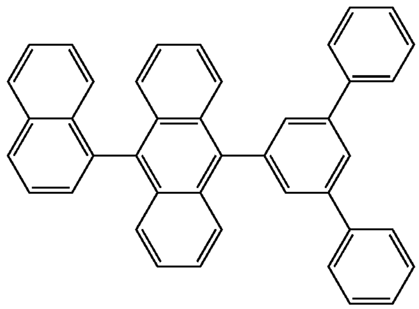
H14
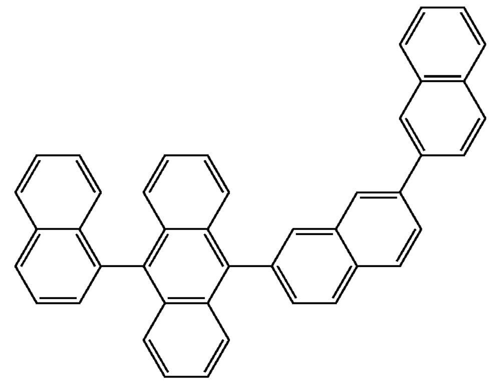
H15
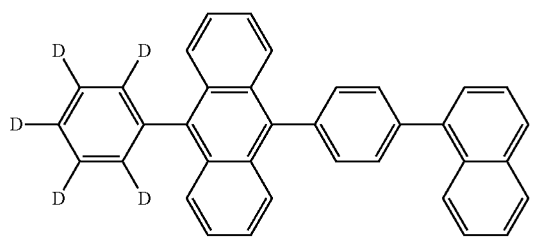
H16
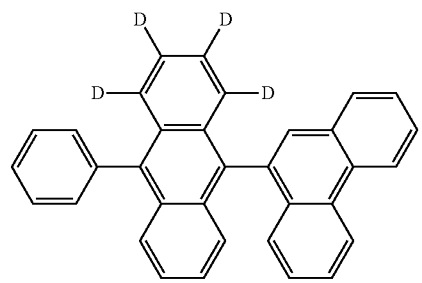
H17
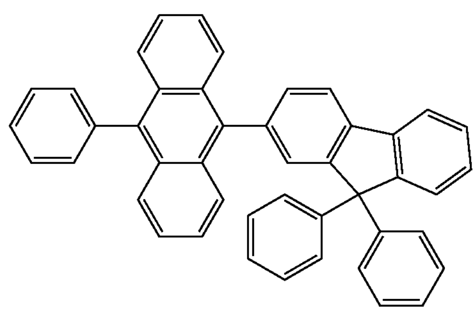
H18
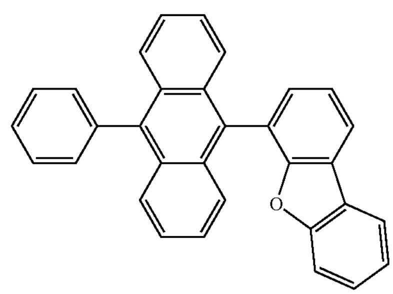
H19
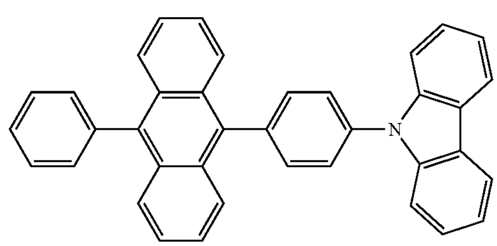
H20
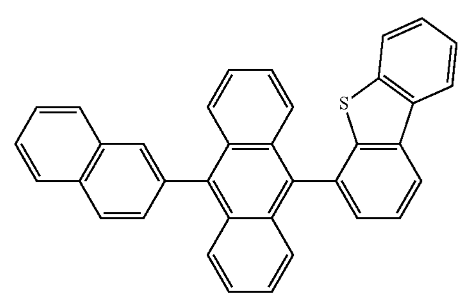

-continued
H21
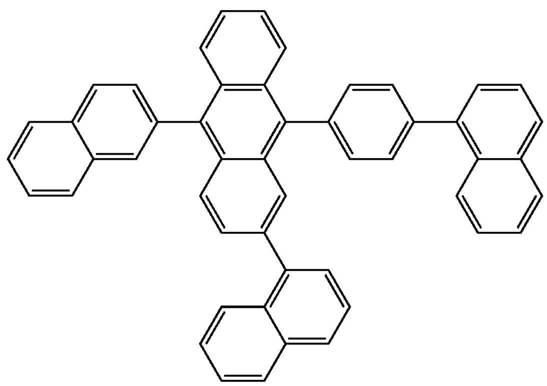
H22
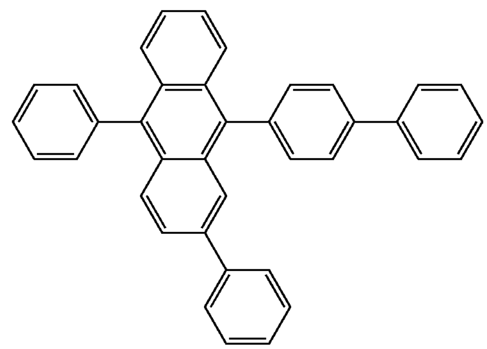
H23
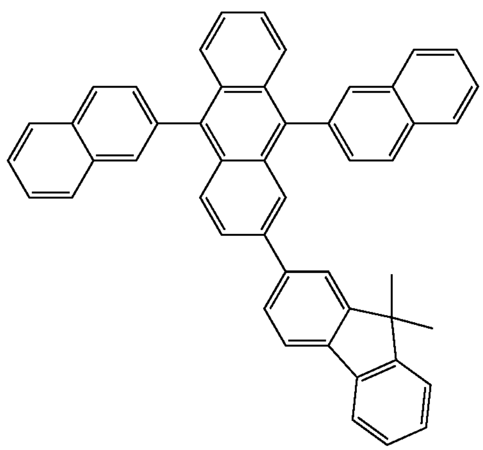
H24
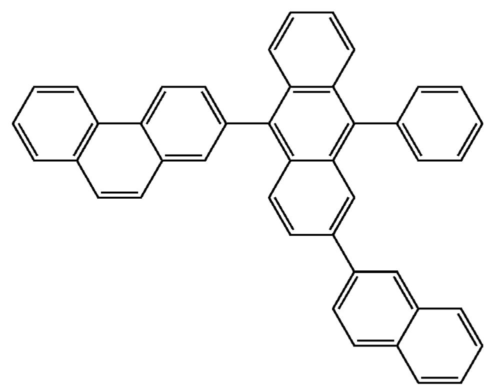
H25
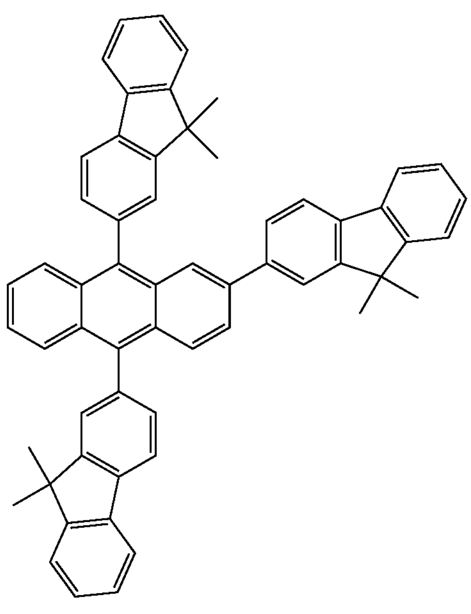
H26
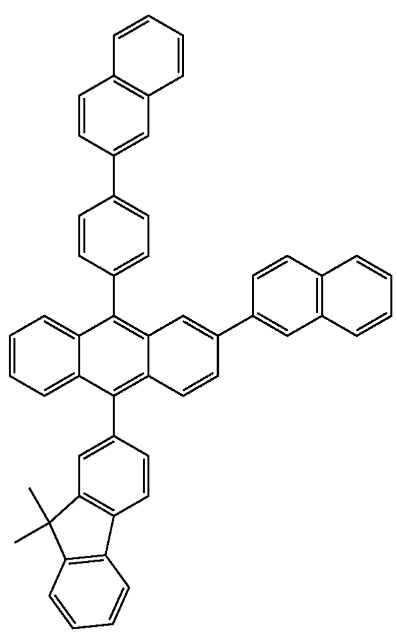

-continued
H27
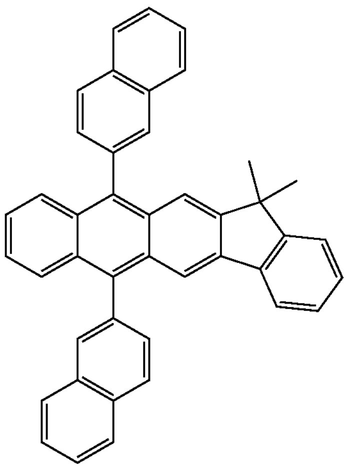
H28
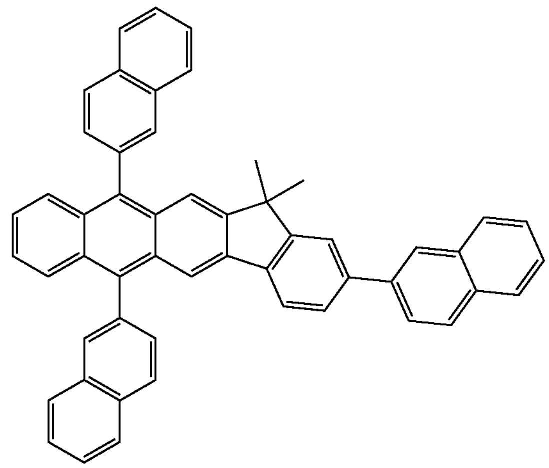
H29
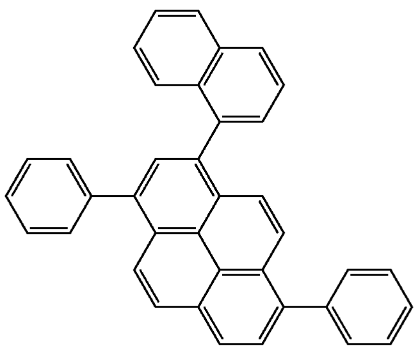
H30
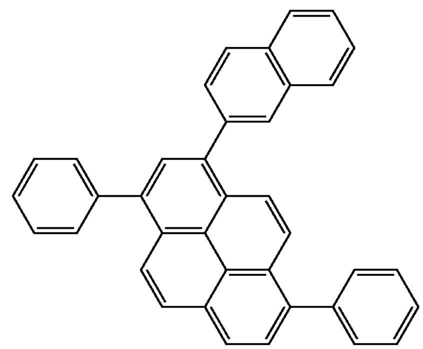
H31
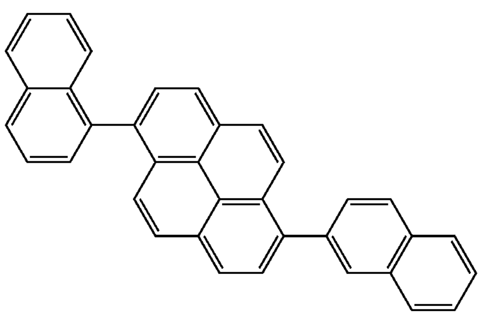
H32
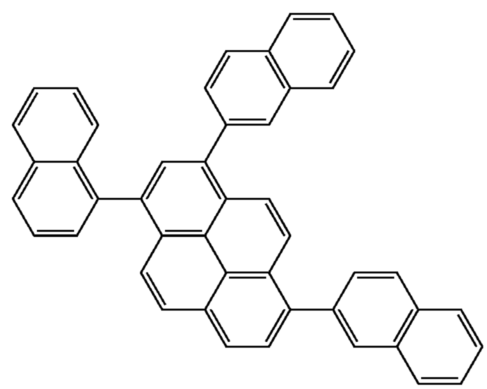
H33
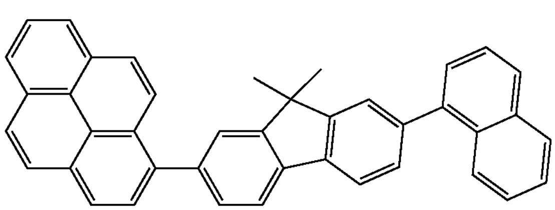
H34
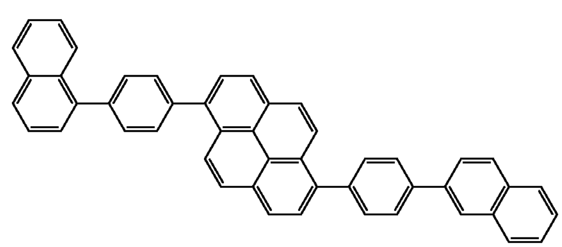

-continued
H35
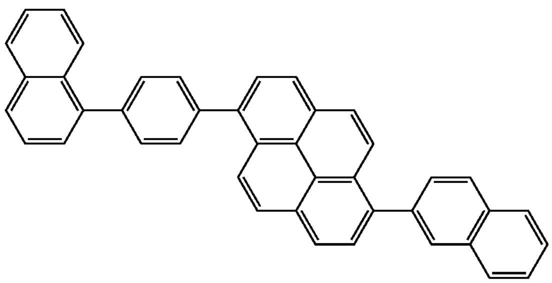
H36
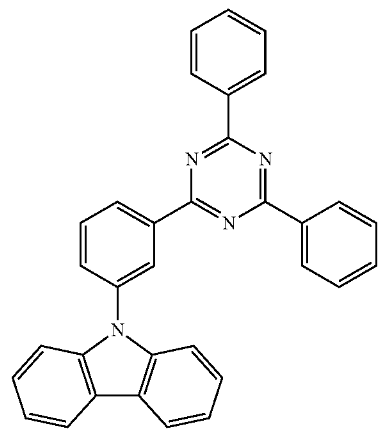
H37
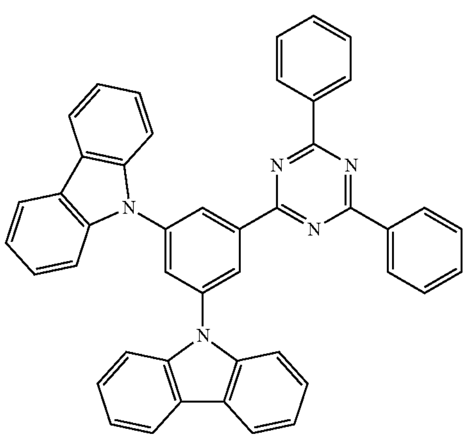
H38
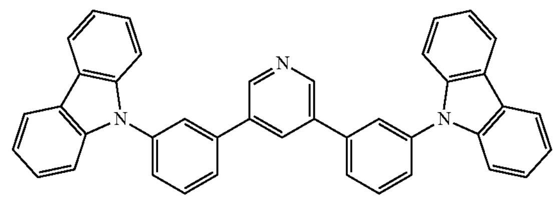
H39
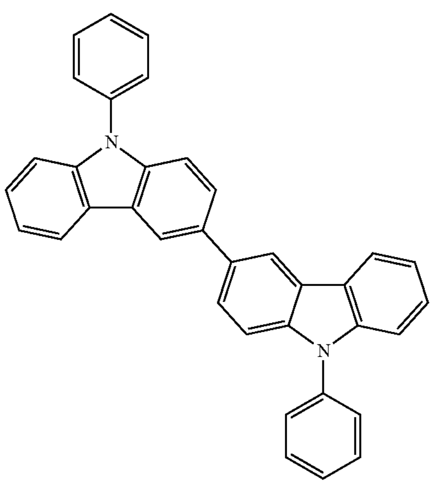
H40
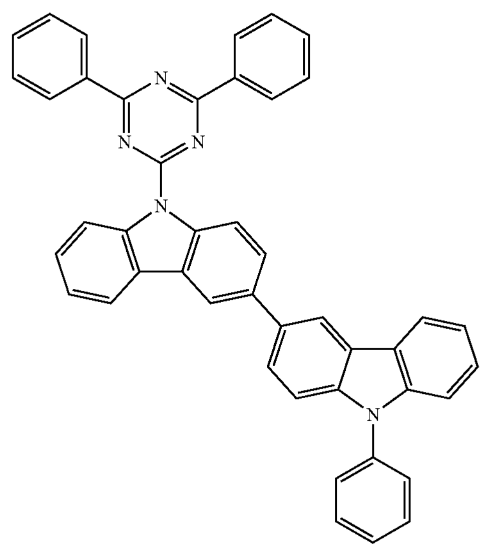

-continued
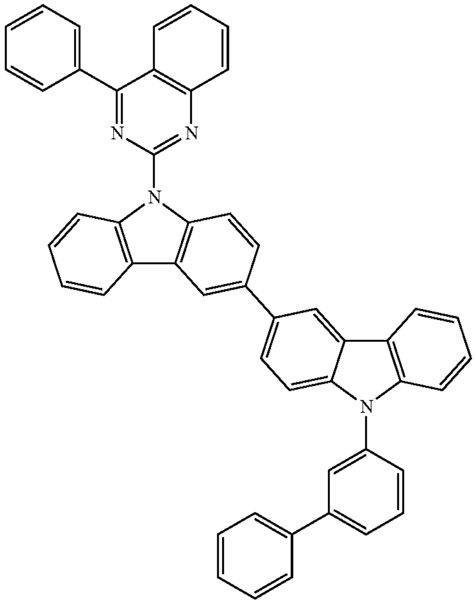
H41
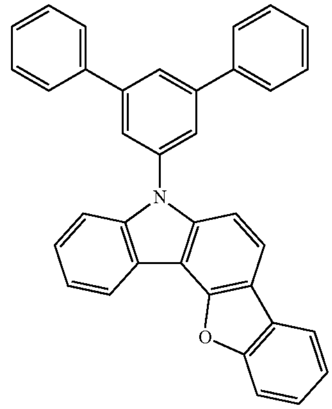
H42
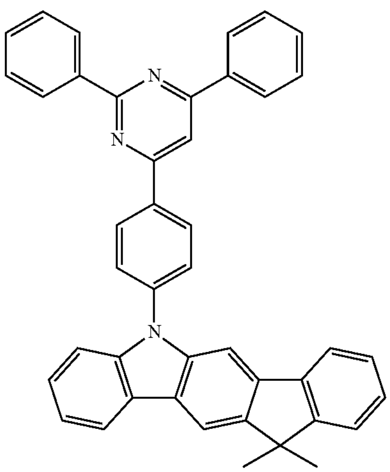
H43
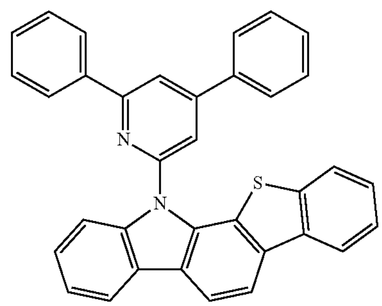
H44
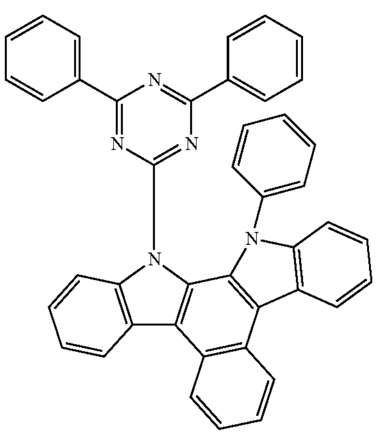
H45
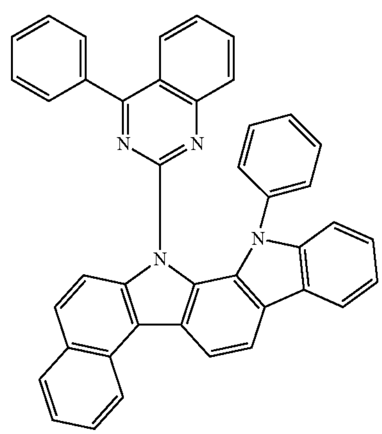
H46

-continued
H47
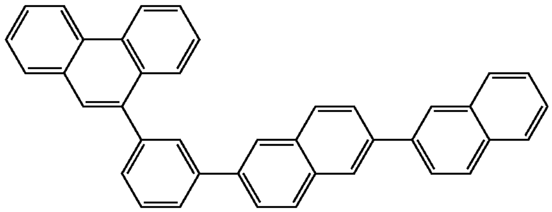
H48
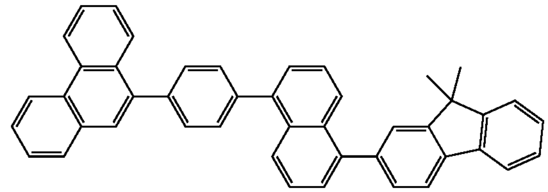
H49
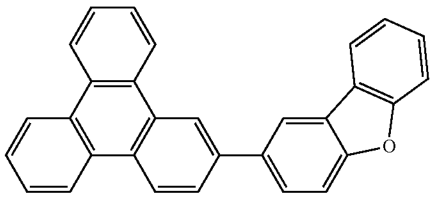
H50
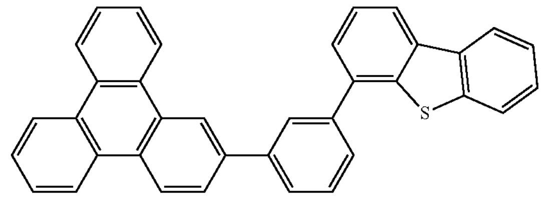
H51
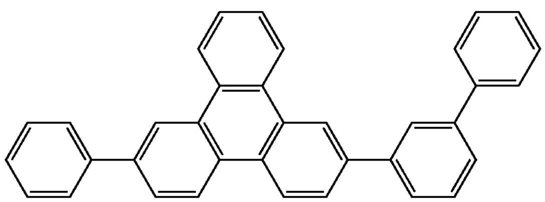
H52
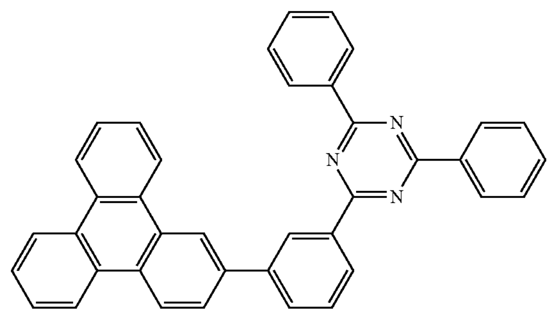
H53
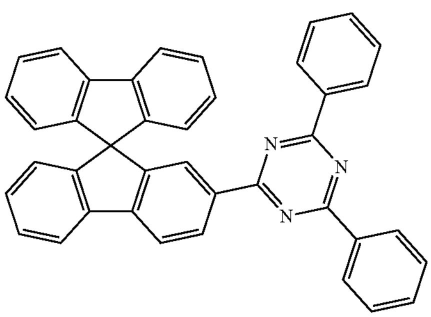
H54
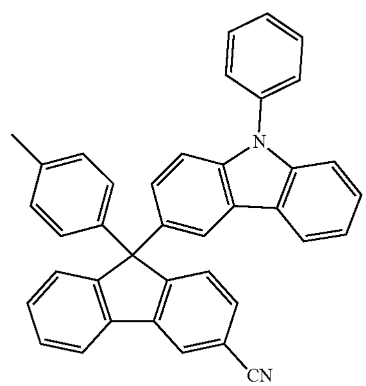
H55
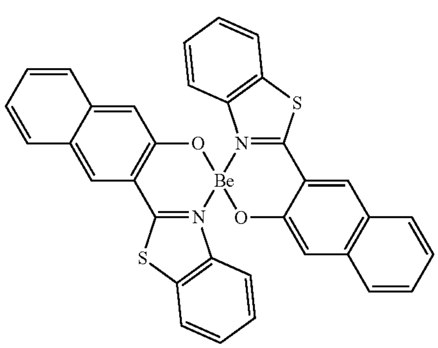
H56
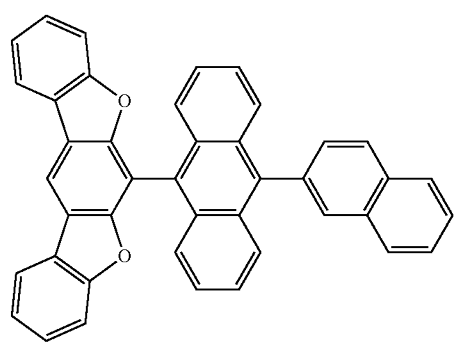

-continued
H57
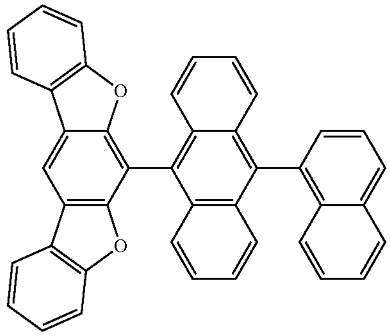
H58
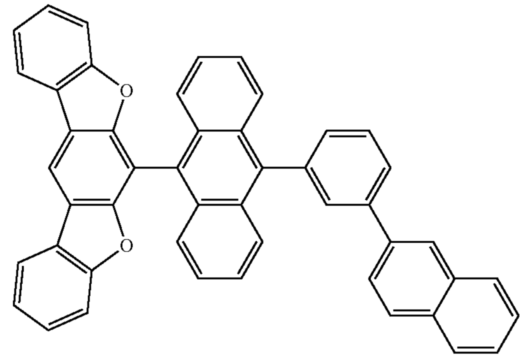
H59
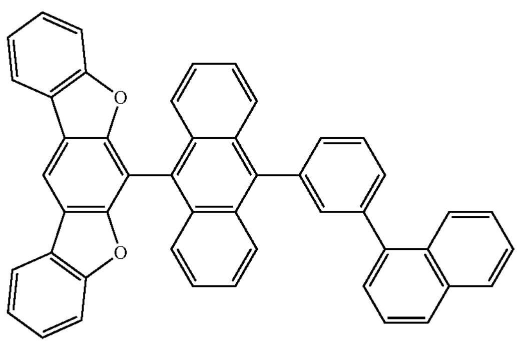
H60
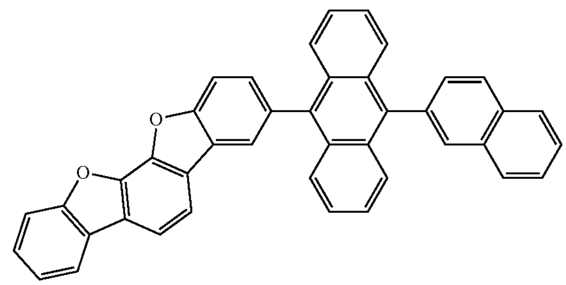
H61
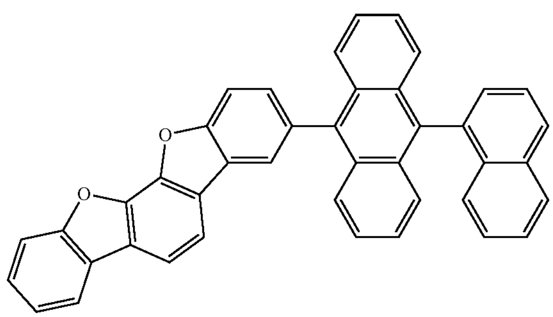
H62
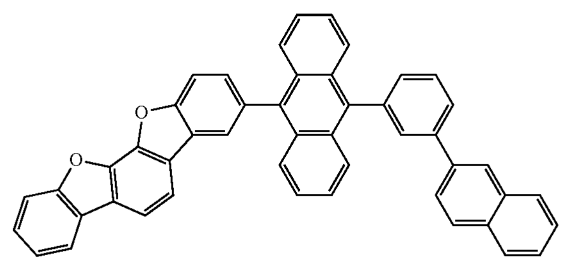
H63
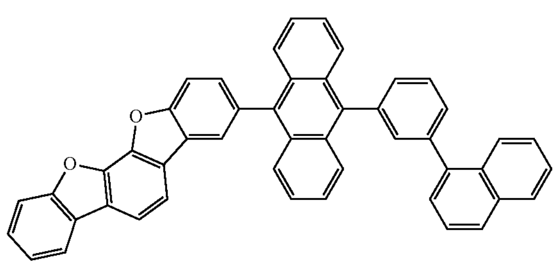
H64
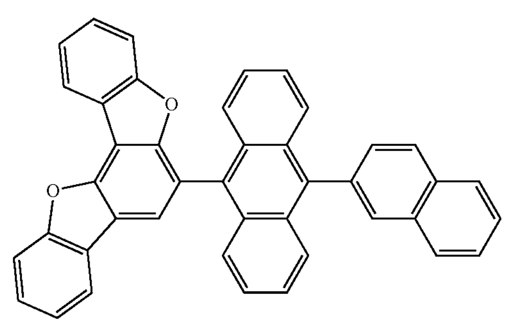

-continued
H65
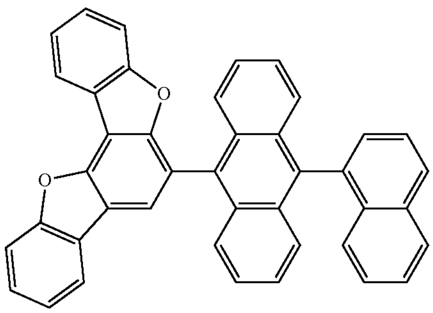
H66
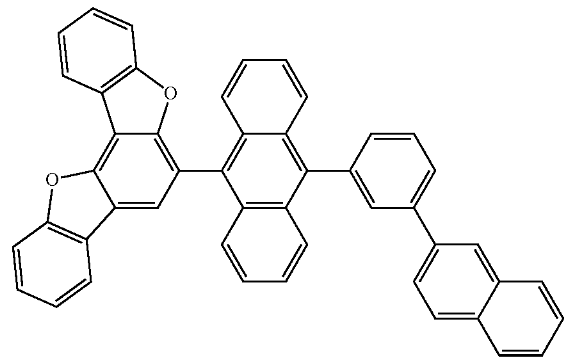
H67
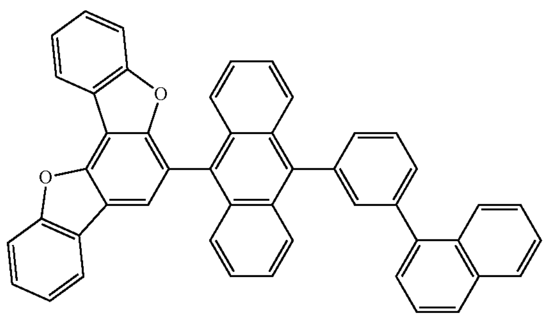
H68
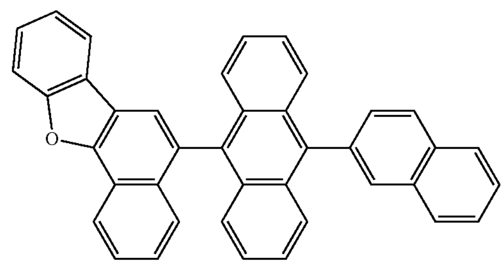
H69
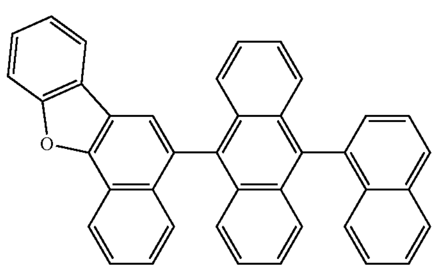
H70
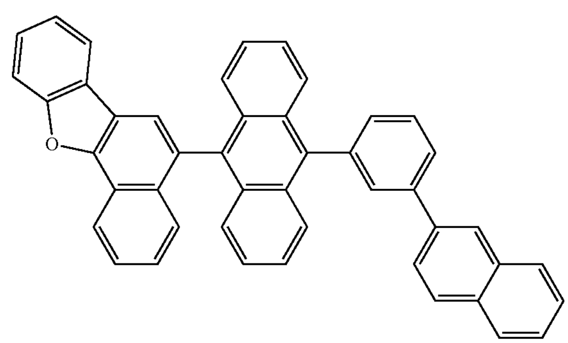
H71
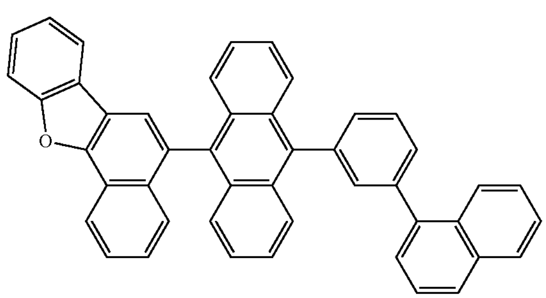
H72
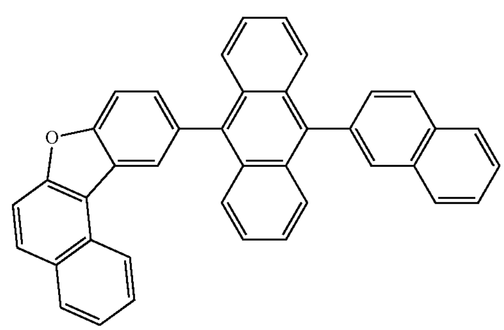

-continued
H73
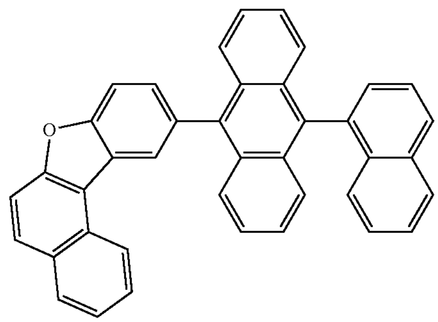
H74
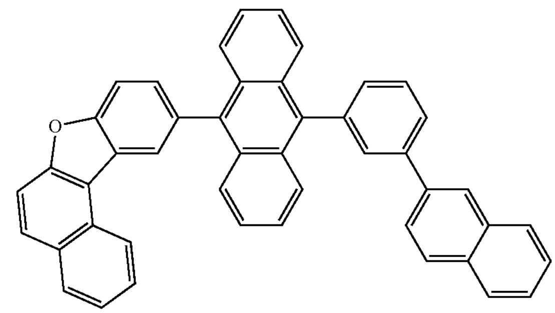
H75
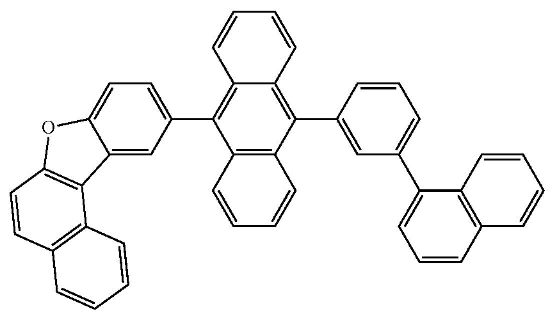
H76
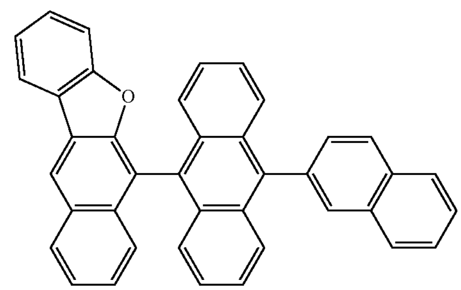
H77
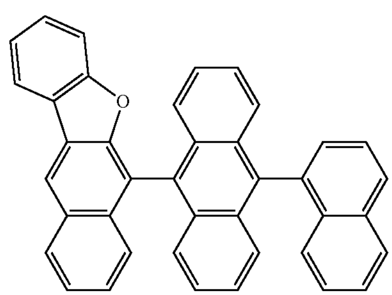
H78
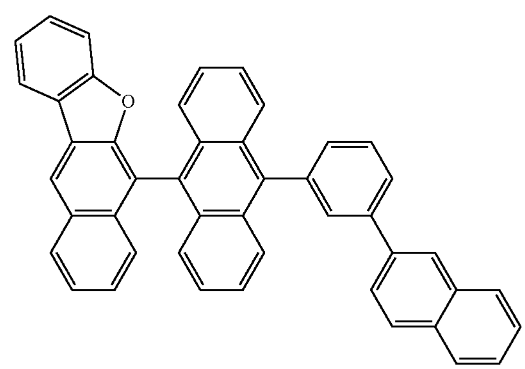
H79
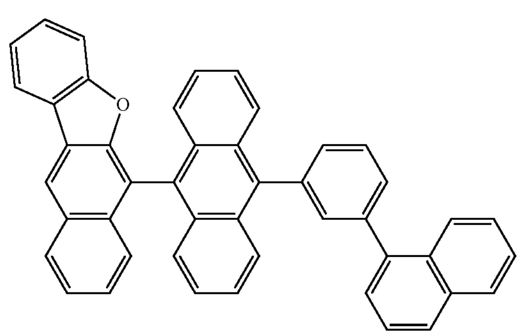
H80
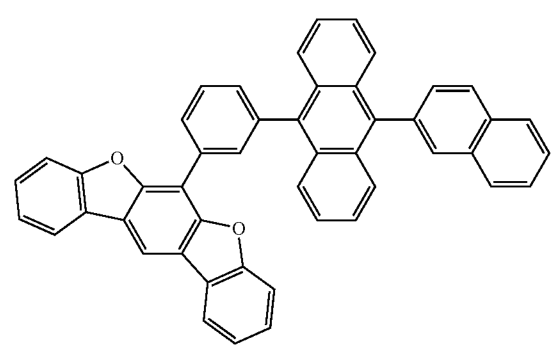

-continued
H81
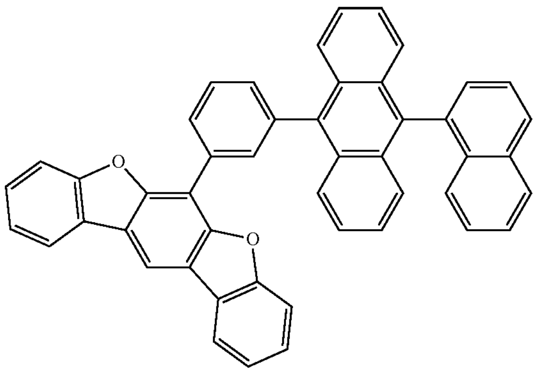
H82
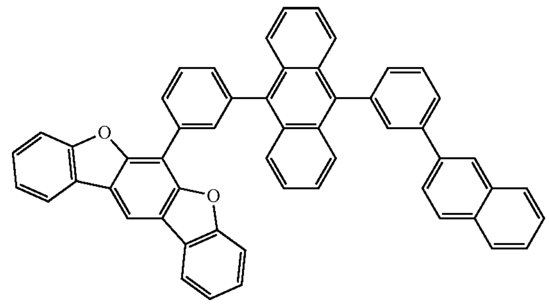
H83
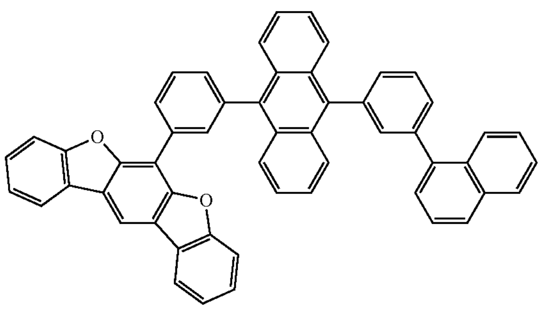
H84
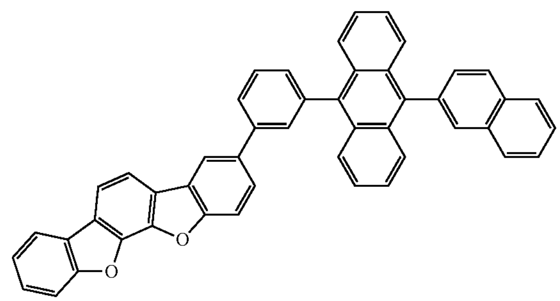
H85
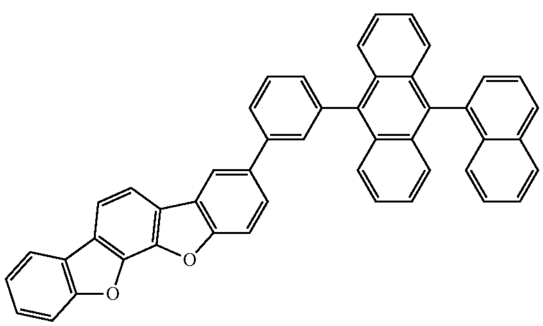
H86
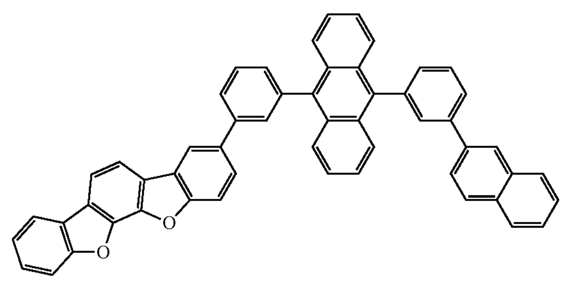
H87
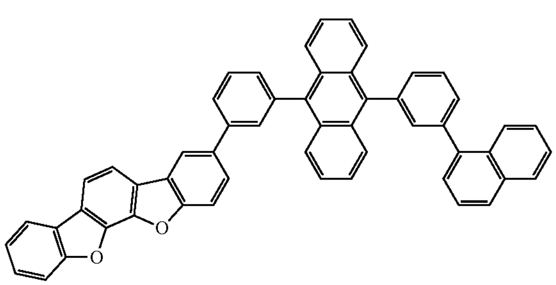
H88
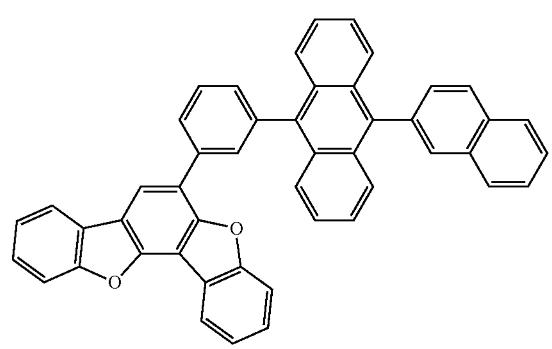

-continued
H89
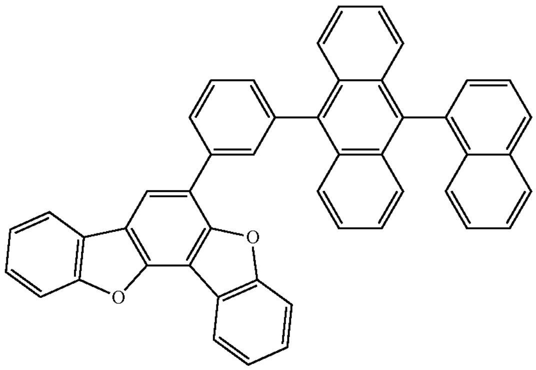
H90
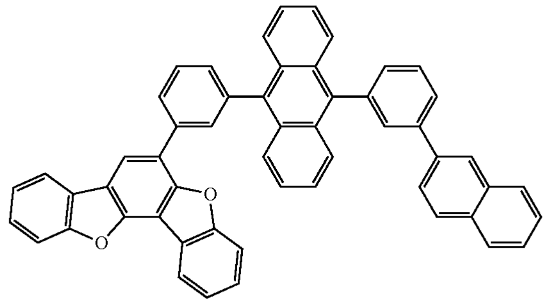
H91
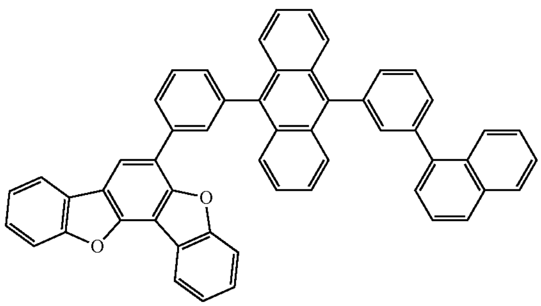
H92
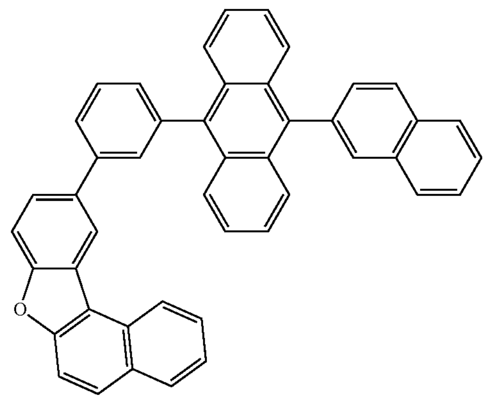
H93
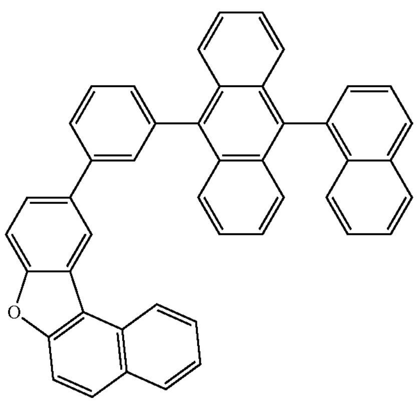
H94
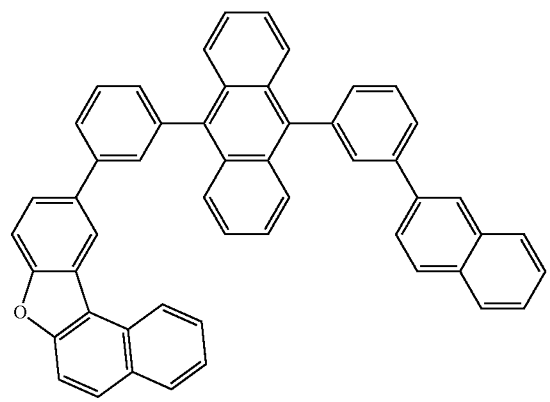
H95
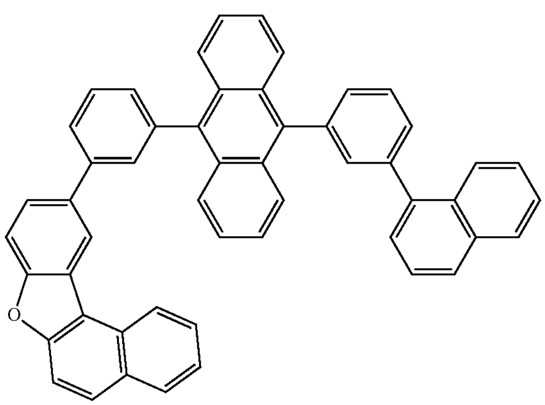
H96
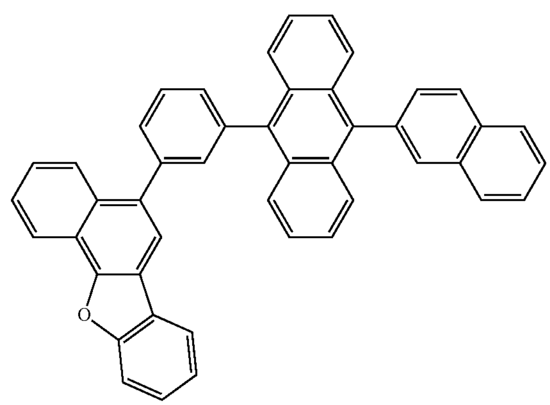

-continued
H97
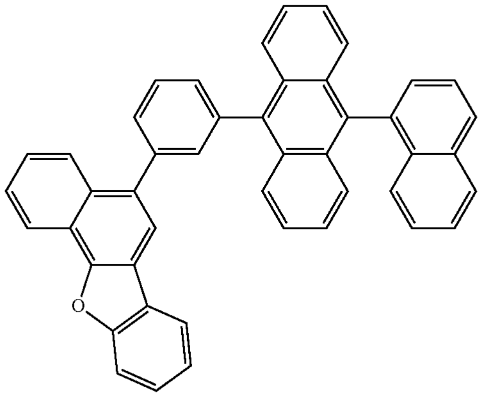
H98
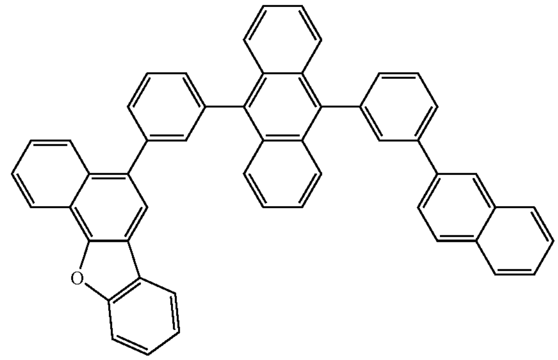
H99
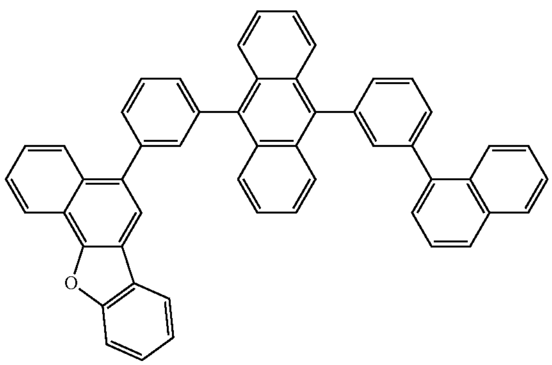
H100
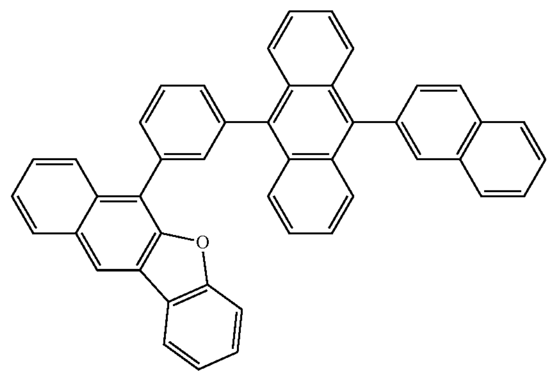
H101
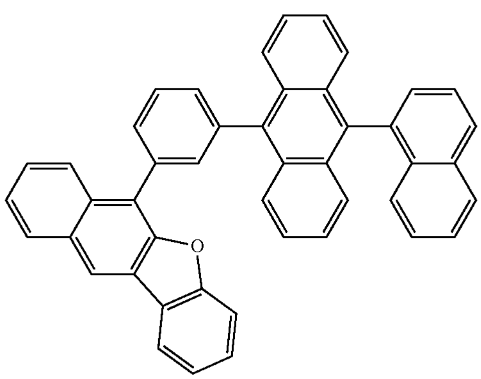
H102
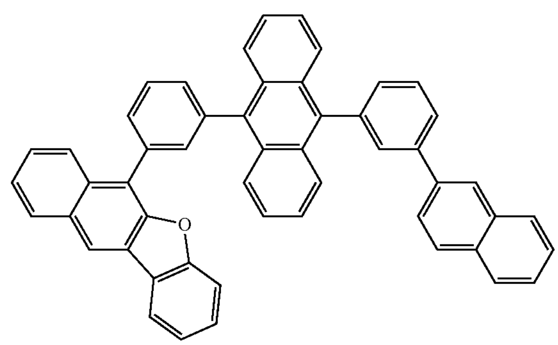

-continued
H103
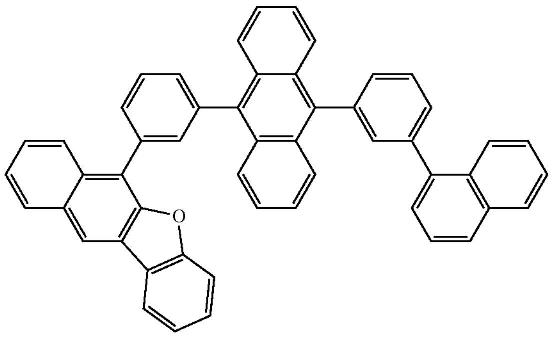
H104
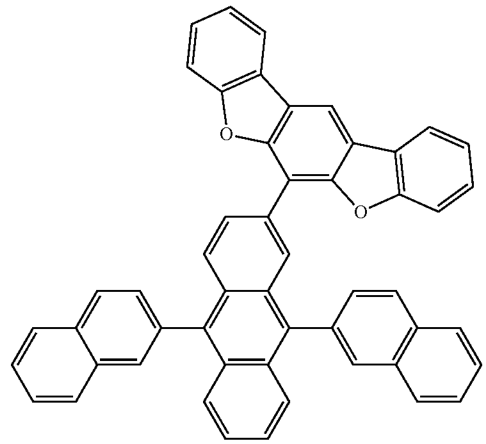
H105
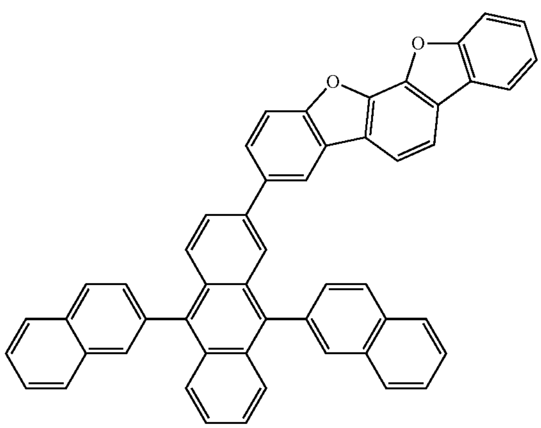
H106
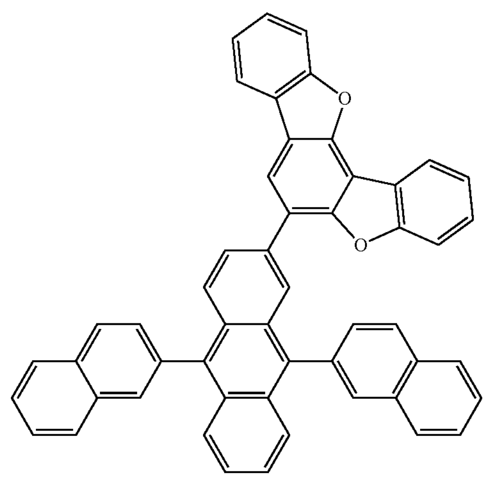
H107
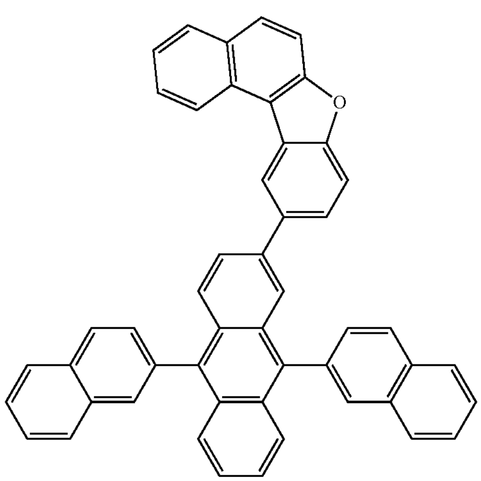
H108
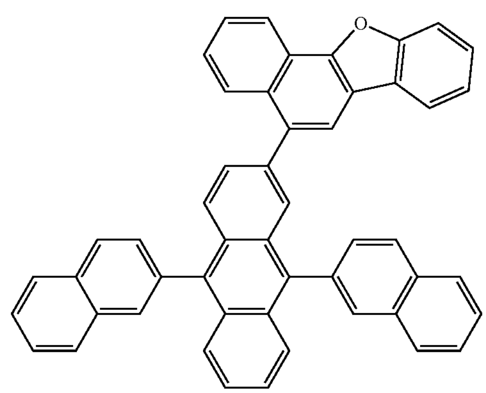

-continued
H109
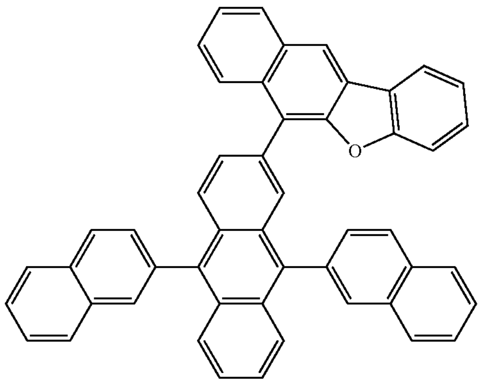
H110
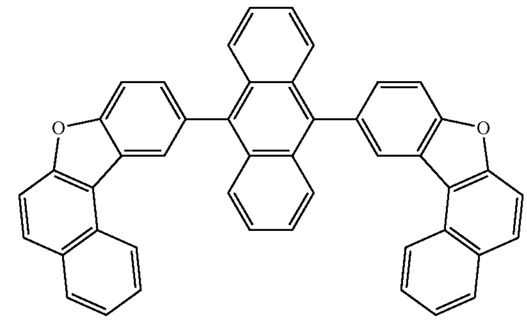
H111
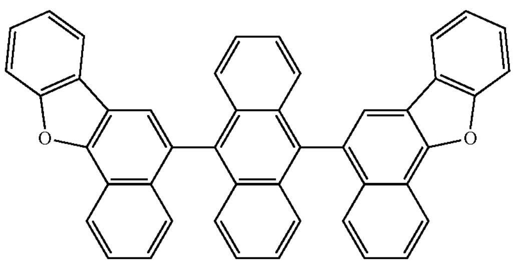
H112
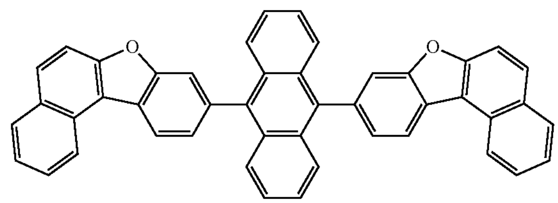
H113
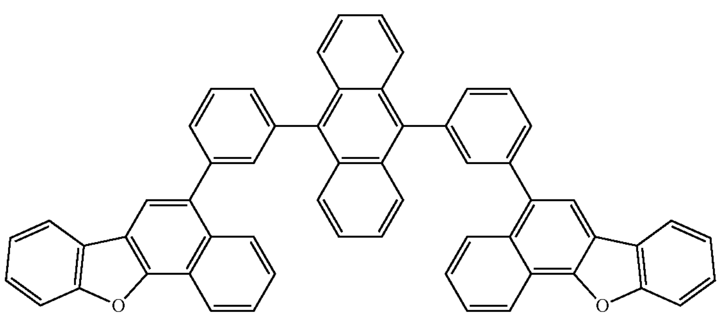
H114
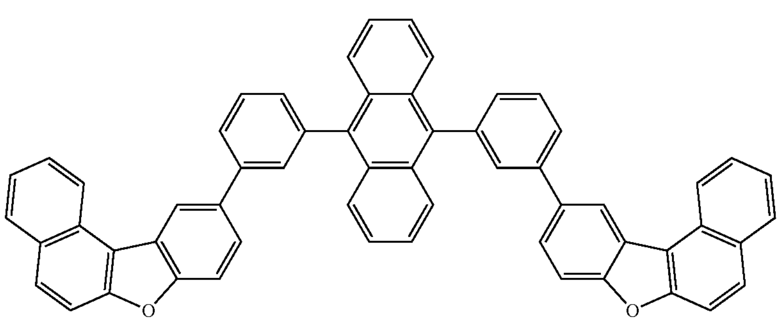

-continued
H115
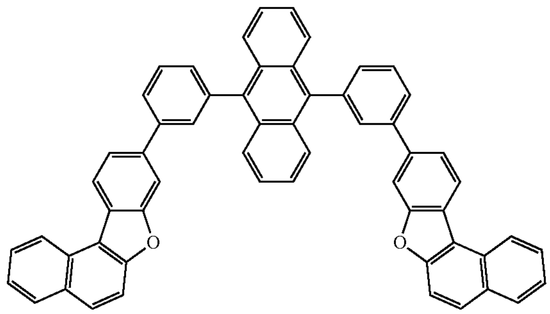
H116
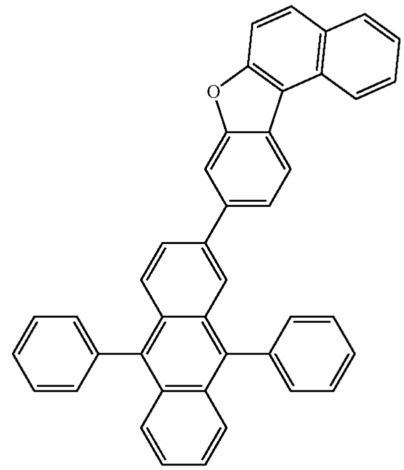
H117
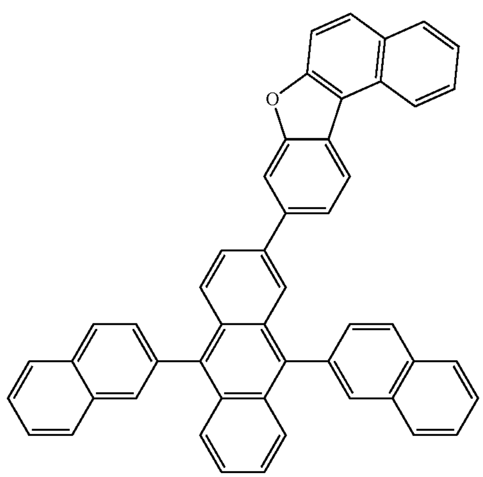
H118
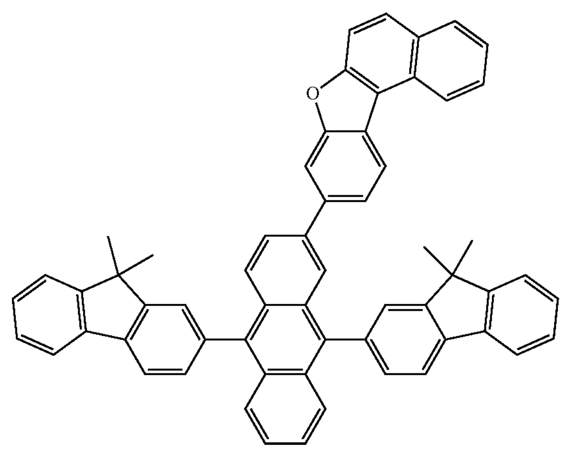
H119
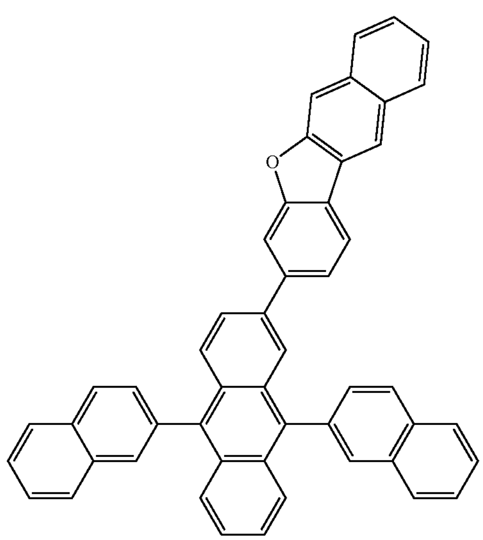
H120
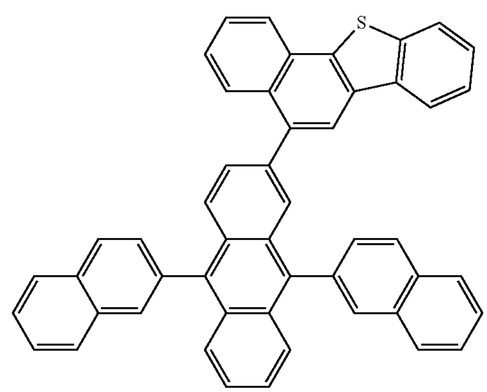

-continued
H121
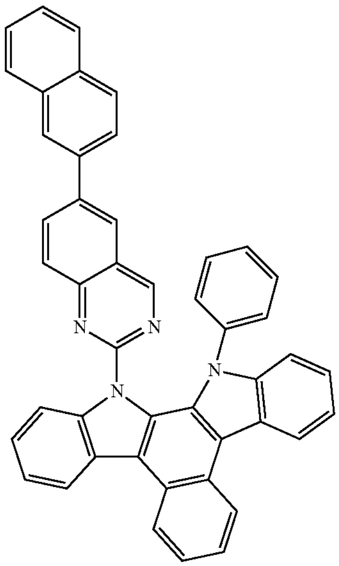
H122
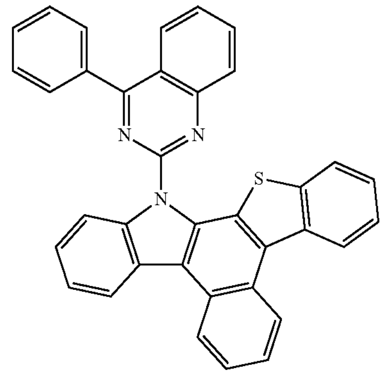
H123
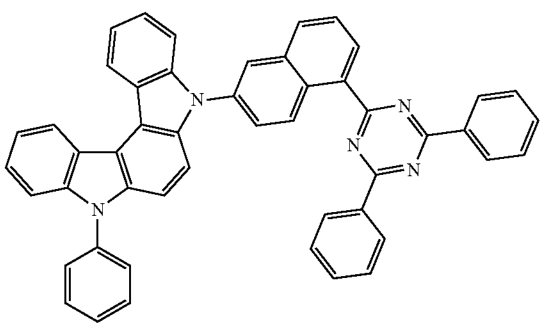
H124
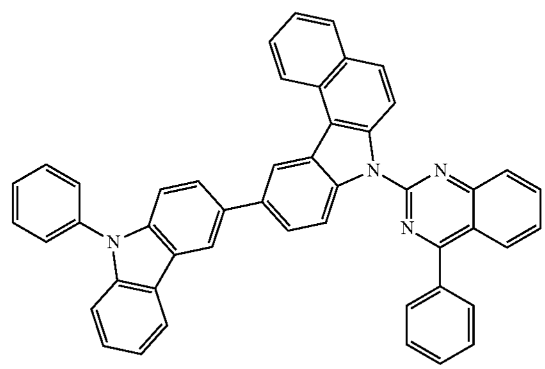
1H-1
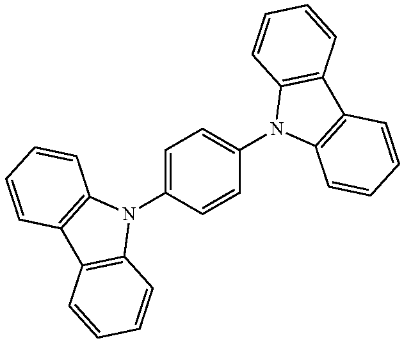
1H-2
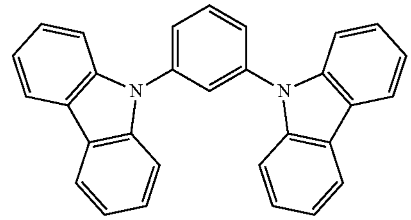

-continued
1H-3
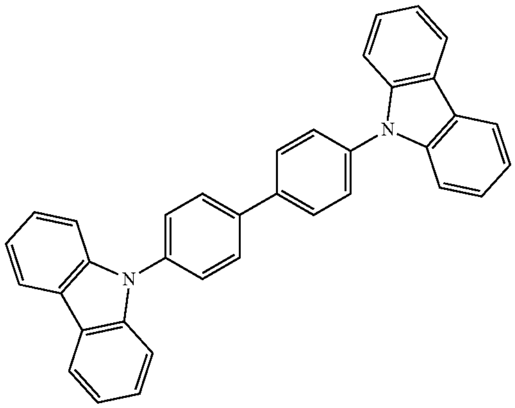
1H-4
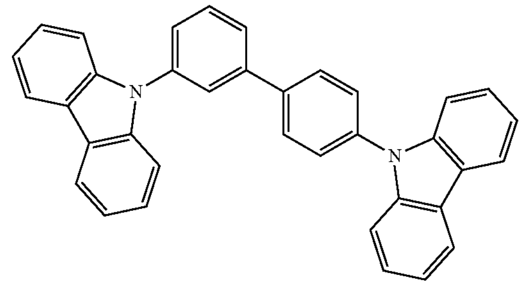
1H-5
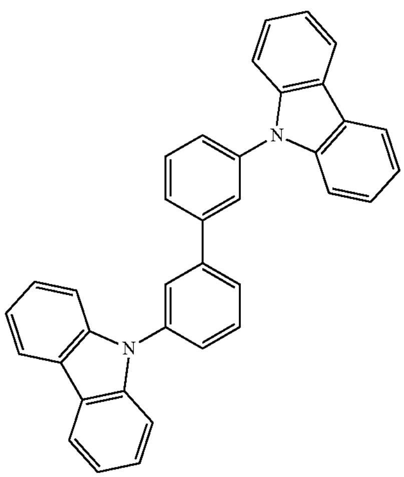
1H-6
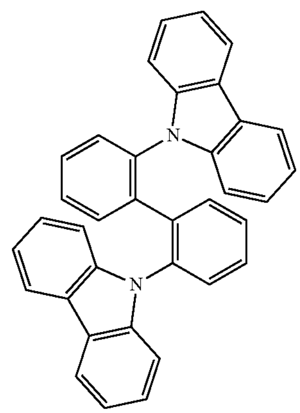
1H-7
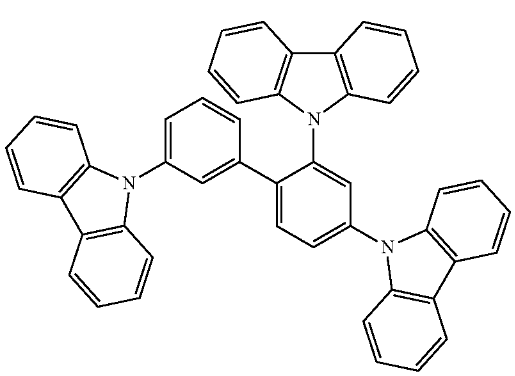
2H-1
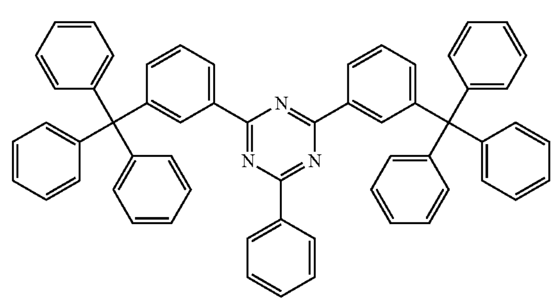

-continued 2H-2

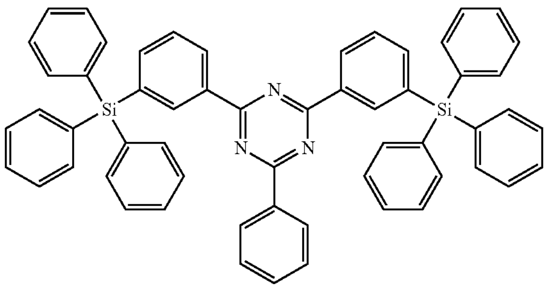

2H-3

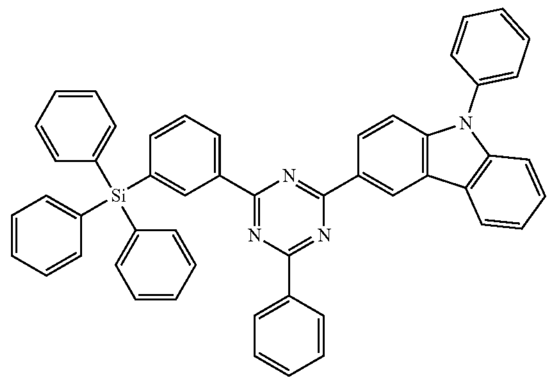

2H-4

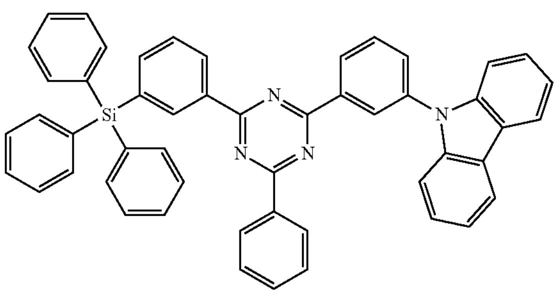

2H-5

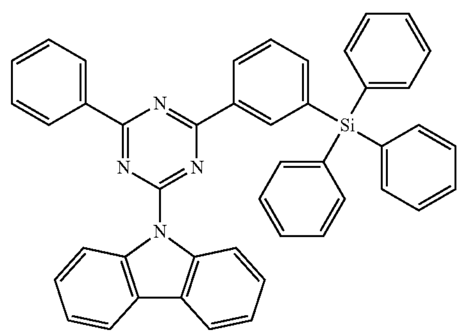

2H-6

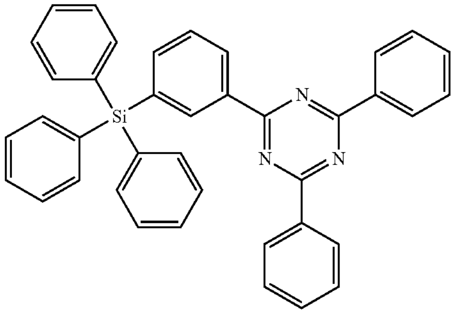

2H-7

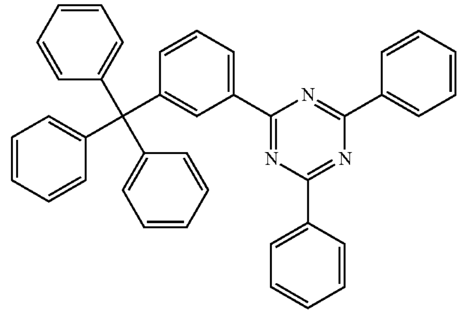

Phosphorescent Dopant

The phosphorescent dopant may include at least one transition metal as a central metal. The phosphorescent dopant may include a monodentate ligand, a bidentate ligand, a tridentate ligand, a tetradentate ligand, a pentadentate ligand, a hexadentate ligand, or any combination thereof. The phosphorescent dopant may be electrically neutral.

In an embodiment, the phosphorescent dopant may include an organometallic compound represented by Formula 401:

$M(L_{401})_{xc1}(L_{402})_{xc2}$ Formula 401

Formula 402

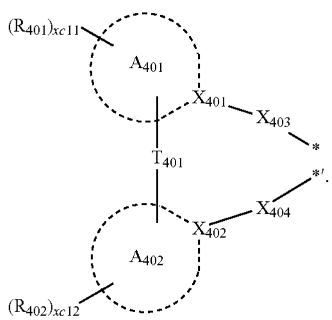

In Formulae 401 and 402,

M may be transition metal (for example, iridium (Ir), platinum (Pt), palladium (Pd), osmium (Os), titanium (Ti), gold (Au), hafnium (Hf), europium (Eu), terbium (Tb), rhodium (Rh), rhenium (Re), or thulium (Tm)), $L_{401}$ may be a ligand represented by Formula 402, and xc1 may be 1, 2, or 3, wherein, when xc1 is two or more, two or more of $L_{401(s)}$ may be identical to or different from each other, $L_{402}$ may be an organic ligand, and xc2 may be 0, 1, 2, 3, or 4, wherein, when xc2 is 2 or more, two or more of $L_{402(s)}$ may be identical to or different from each other, $X_{401}$ and $X_{402}$ may each independently be nitrogen or carbon, ring $A_{401}$ and ring $A_{402}$ may each independently be a $C_3$-$C_{60}$ carbocyclic group or a $C_1$-$C_{60}$ heterocyclic group, $T_{401}$ may be a single bond, —O—, —S—, —C(═O)—, —N($Q_{411}$)-, —C($Q_{411}$)($Q_{412}$)-, —C($Q_{411}$)=C($Q_{412}$)-, —C($Q_{411}$)=, or =C=, $X_{403}$ and $X_{404}$ may each independently be a chemical bond (for example, a covalent bond or a coordinate bond), O, S, N($Q_{413}$), B($Q_{413}$), P($Q_{413}$), C($Q_{413}$)($Q_{414}$), or Si($Q_{413}$)($Q_{414}$), $Q_{411}$ to $Q_{414}$ are the same as described in connection with $Q_1$, $R_{401}$ and $R_{402}$ may each independently be hydrogen, deuterium, —F, —Cl, —Br, —I, a hydroxyl group, a cyano group, a nitro group, a $C_1$-$C_{20}$ alkyl group unsubstituted or substituted with at least one $R_{10a}$, a $C_1$-$C_{20}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{401}$)($Q_{402}$)($Q_{403}$), —N($Q_{401}$)($Q_{402}$), —B($Q_{401}$)($Q_{402}$), —C(═O)($Q_{401}$), —S(═O)$_2$($Q_{401}$), or —P(═O)($Q_{401}$)($Q_{402}$), $Q_{401}$ to $Q_{403}$ are the same as described in connection with $Q_1$, xc11 and xc12 may each independently be an integer from 0 to 10, and

* and *' in Formula 402 each indicate a binding site to M in Formula 401.

In an embodiment, in Formula 402, i) $X_{401}$ may be nitrogen, and $X_{402}$ may be carbon, or ii) each of $X_{401}$ and $X_{402}$ may be nitrogen.

In an embodiment, when xc1 in Formula 402 is 2 or more, two ring $A_{401}$ in two or more of $L_{401(s)}$ may be optionally linked to each other via $T_{402}$, which is a linking group, and two ring $A_{402}$ may optionally be linked to each other via $T_{403}$, which is a linking group (see Compounds PD1 to PD4 and PD7). The variables $T_{402}$ and $T_{403}$ are the same as described in connection with $T_{401}$.

The variable $L_{402}$ in Formula 401 may be an organic ligand. In an embodiment, $L_{402}$ may include a halogen group, a diketone group (for example, an acetylacetonate group), a carboxylic acid group (for example, a picolinate group), a —C(═O), an isonitrile group, a —CN group, a phosphorus group (for example, a phosphine group, a phosphite group, etc.), or any combination thereof.

The phosphorescent dopant may include, for example, one of Compounds PD1 to PD28, one of 1D-1 to 1D-10, or any combination thereof:

PD1

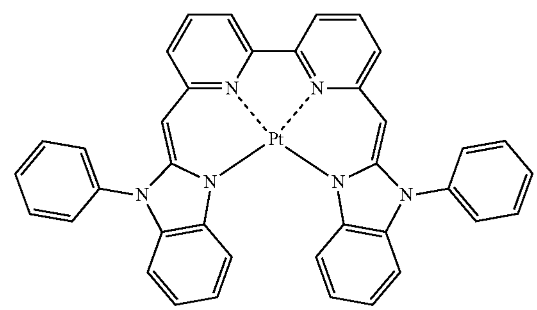

PD2

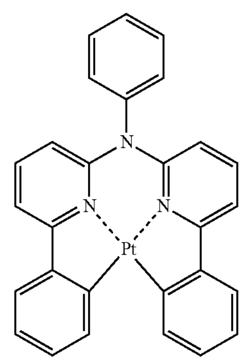

PD3

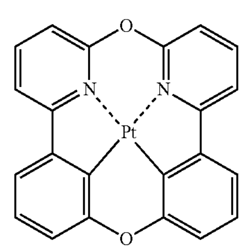

-continued
PD4
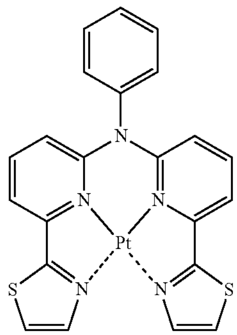
PD5
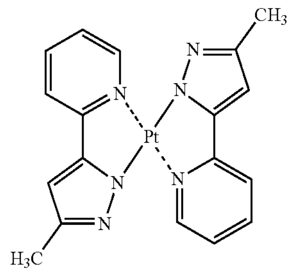
PD6
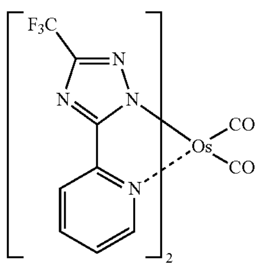
PD7
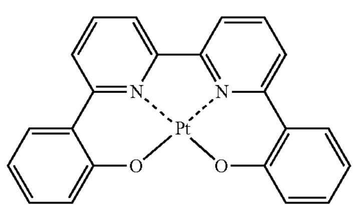
PD8
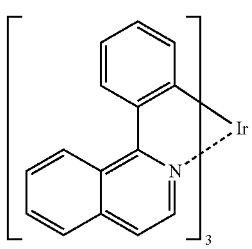
PD9
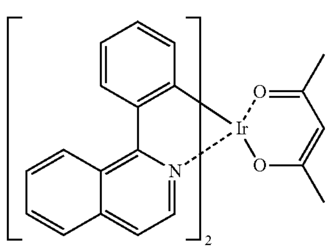
-continued
PD10
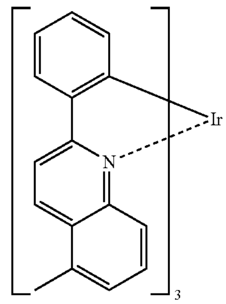
PD11
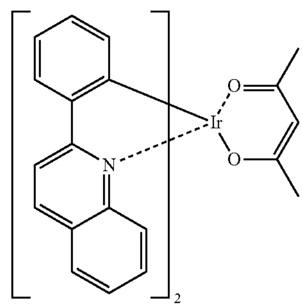
PD12
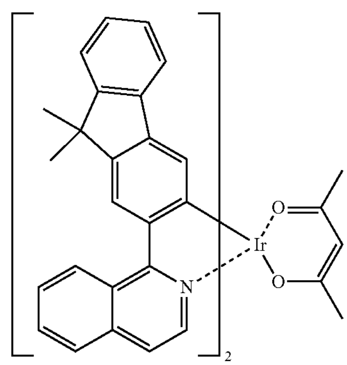
PD13
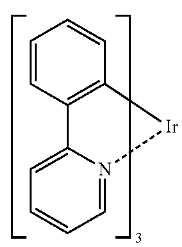
PD14
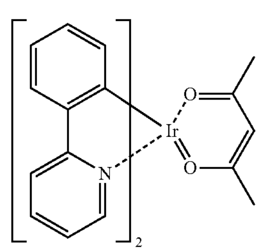

-continued
PD15
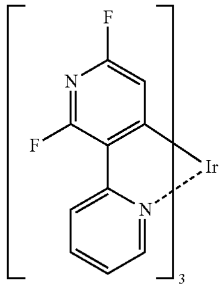
PD16
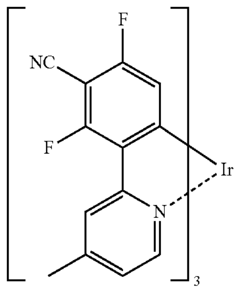
PD17
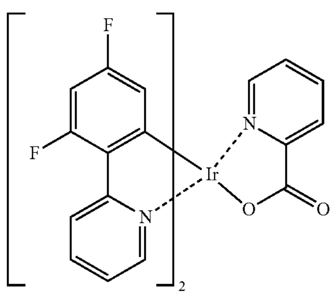
PD18
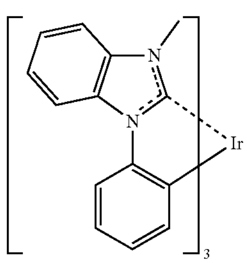
PD19
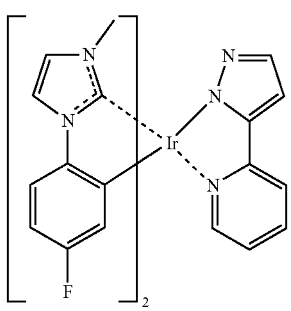
-continued
PD20
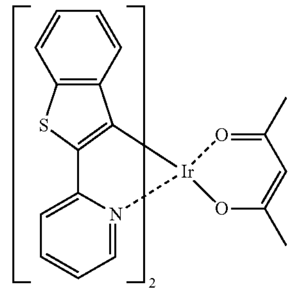
PD21
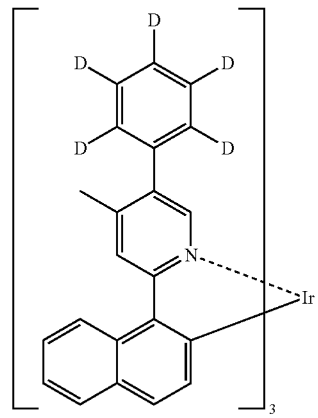
PD22
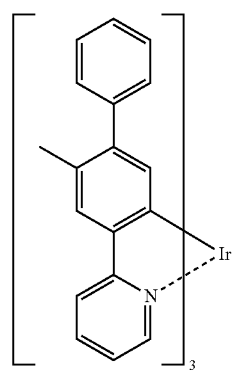
PD23
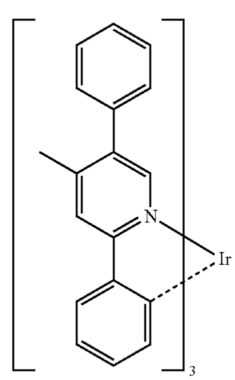

PD24
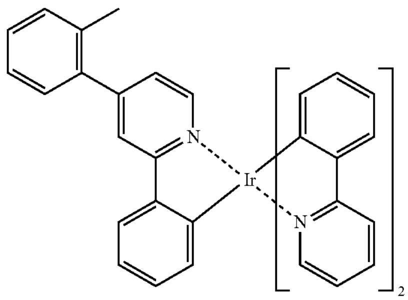
PD25
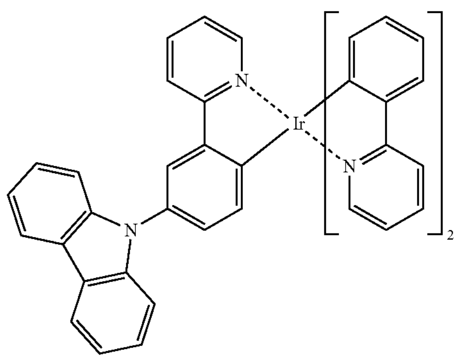
PD26
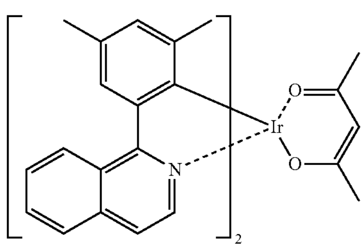
PD27
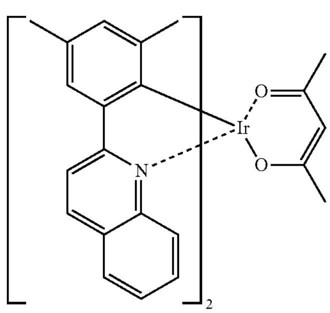
PD28
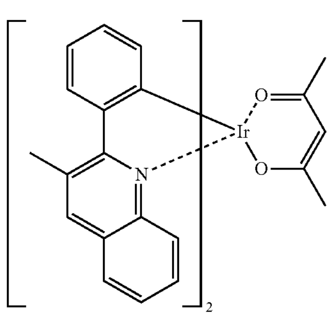
1D-1
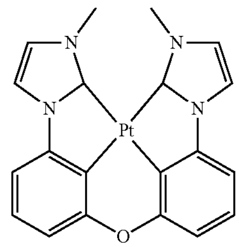
1D-2
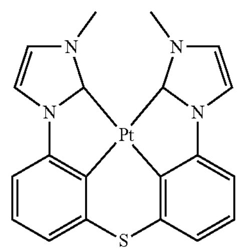
1D-3
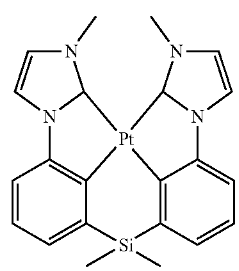
1D-4
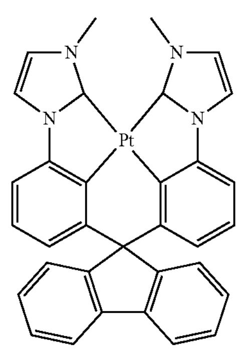
1D-5
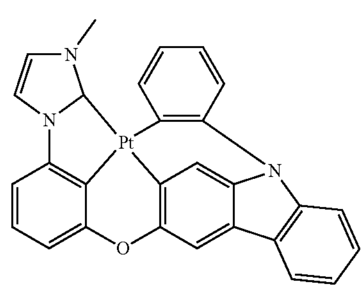

-continued 1D-6

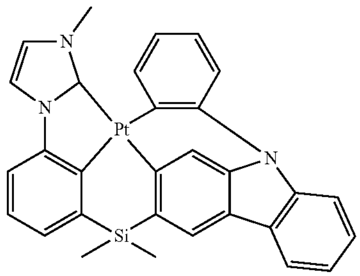

1D-7

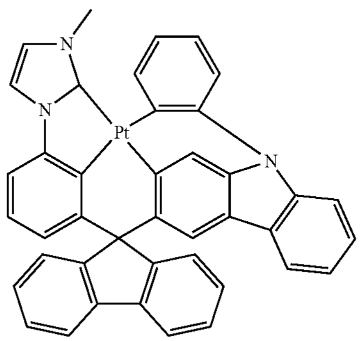

1D-8

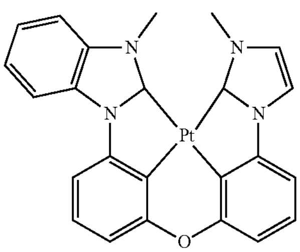

1D-9

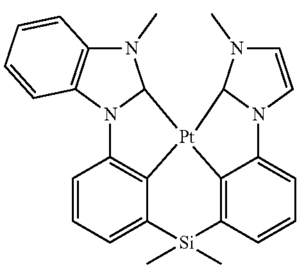

1D-10

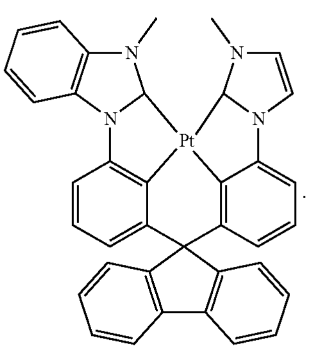

Delayed Fluorescence Material as Second Dopant

The second dopant may be a thermally activated delayed fluorescence material. As used herein, the delayed fluorescence material may be selected from compounds capable of emitting delayed fluorescence based on a delayed fluorescence emission mechanism. The delayed fluorescence material included in the emission layer may act as a host or a dopant depending on the type of other materials included in the emission layer.

In an embodiment, the difference between the triplet energy level in electron volt (eV) of the delayed fluorescence material and the singlet energy level (eV) of the delayed fluorescence material may be greater than or equal to about 0 eV and less than or equal to about 0.5 eV. When the difference between the triplet energy level (eV) of the delayed fluorescence material and the singlet energy level (eV) of the delayed fluorescence material satisfies the above-described range, up-conversion from the triplet state to the singlet state of the delayed fluorescence materials may effectively occur, and thus, the emission efficiency of the light-emitting device 10 may be improved.

In an embodiment, the delayed fluorescence material may include i) a material including at least one electron donor (for example, a π electron-rich $C_3$-$C_{60}$ cyclic group, such as a carbazole group) and at least one electron acceptor (for example, a sulfoxide group, a cyano group, or a π electron-deficient nitrogen-containing $C_1$-$C_{60}$ cyclic group), and ii) a material including a $C_8$-$C_{60}$ polycyclic group in which two or more cyclic groups are condensed while sharing boron (B).

Examples of the delayed fluorescence material may include at least one of Compounds DF1 to DF9 and 2D-1 to 2D-7:

DF1(DMAC-DPS)

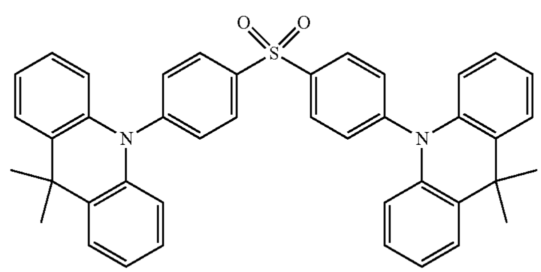

DF2(ACRFLCN)

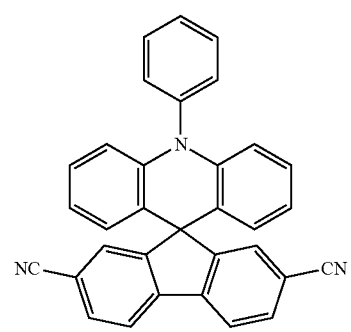

-continued
DF3(ACRSA)
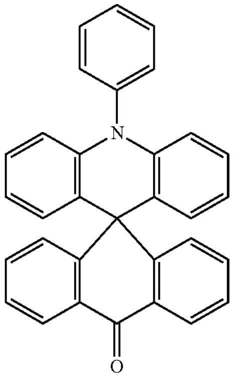
DF4(CC2TA)
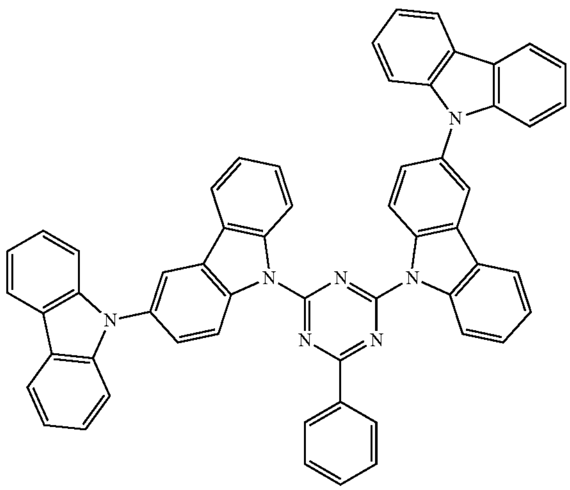
DF5(PIC-TRZ)
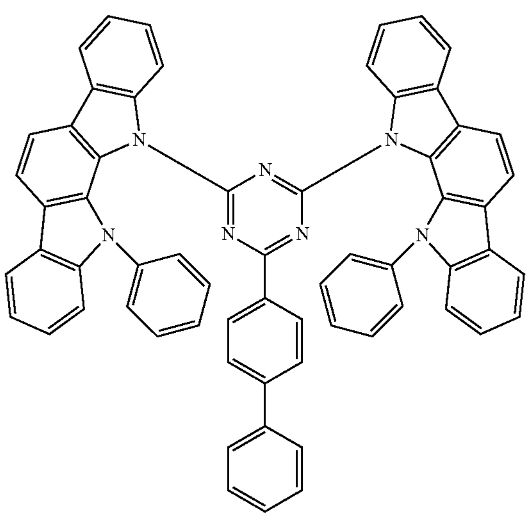
-continued
DF6(PIC-TRZ2)
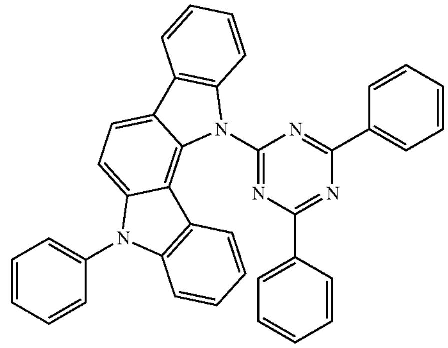
DF7(PXZ-TRZ)
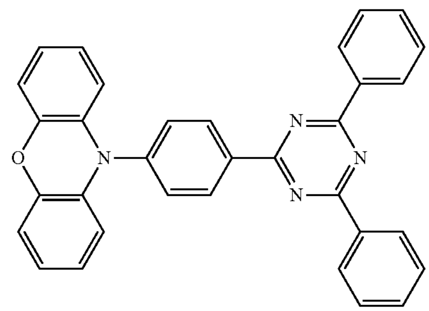
DF8(DABNA-1)
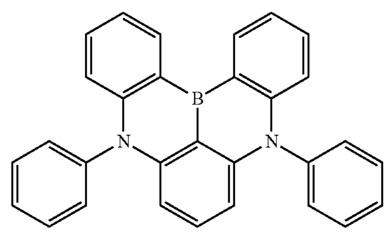
DF9(DABNA-2)
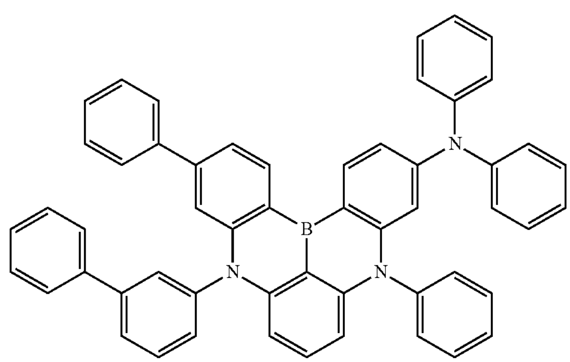

-continued 2D-1

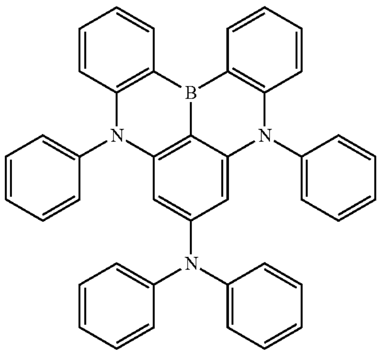

2D-2

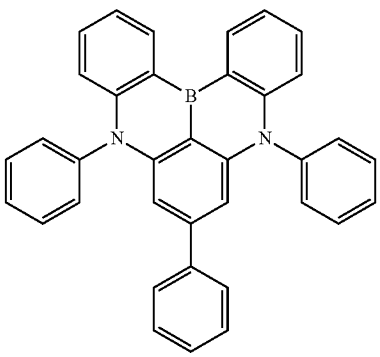

2D-3

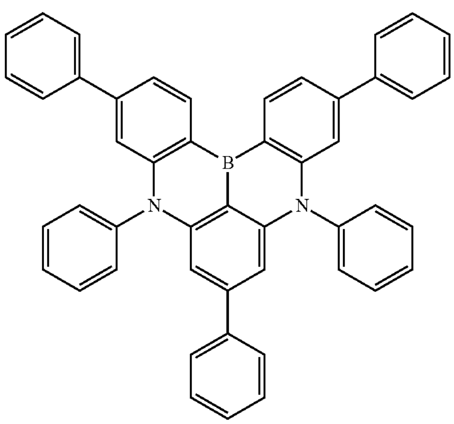

2D-4

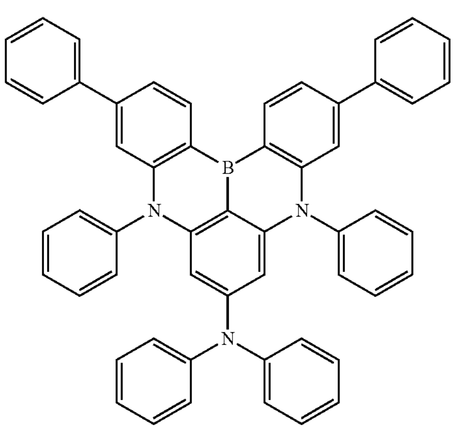

-continued 2D-5

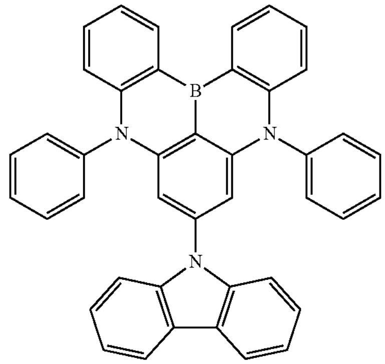

2D-6

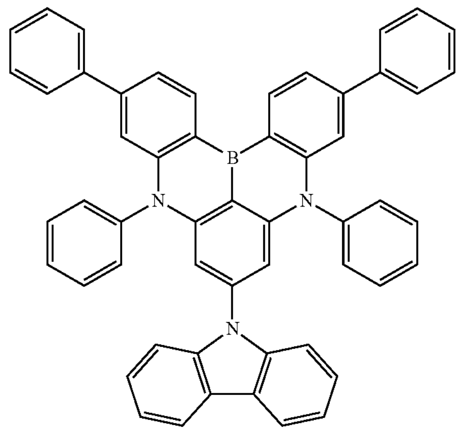

2D-7

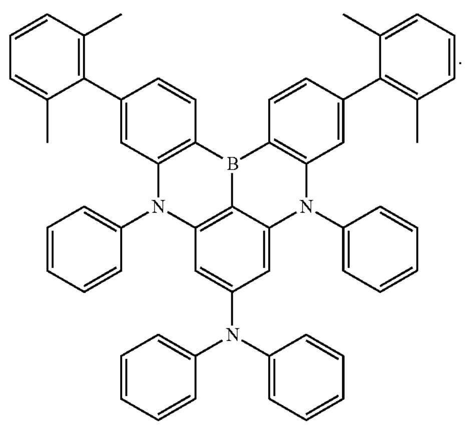

Electron Transport Region in Interlayer 130

The electron transport region may have: i) a single-layered structure consisting of a single layer consisting of a single material, ii) a single-layered structure consisting of a single layer consisting of a plurality of different materials, or iii) a multi-layered structure including a plurality of layers including different materials. The electron transport region may include a hole blocking layer and may include an electron transport layer, an electron injection layer, or any combination thereof.

In an embodiment, the electron transport region may have a hole blocking layer/electron transport layer/electron injection layer structure, wherein constituting layers are sequentially stacked from the emission layer. As described above, the hole blocking layer may include a first hole blocking layer and a second hole blocking layer.

The electron transport region (for example, the hole blocking layer or the electron transport layer in the electron transport region) may include a metal-free compound including at least one π electron-deficient nitrogen-containing $C_1$-$C_{60}$ cyclic group. In an embodiment, the electron transport region may include a compound represented by Formula 601 below:

$$[Ar_{601}]_{xe11}\text{-}[(L_{601})_{xe1}\text{-}R_{601}]_{xe21} \quad \text{Formula 601}$$

wherein, in Formula 601, $Ar_{601}$ and $L_{601}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xe11 may be 1, 2, or 3, xe1 may be 0, 1, 2, 3, 4, or 5, $R_{601}$ may be a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{601}$)($Q_{602}$)($Q_{603}$), —C(═O)($Q_{601}$), —S(═O)$_2$($Q_{601}$), or —P(═O)($Q_{601}$)($Q_{602}$), $Q_{601}$ to $Q_{603}$ are the same as described in connection with $Q_1$, xe21 may be 1, 2, 3, 4, or 5, and at least one of $Ar_{601}$, $L_{601}$, and $R_{601}$ may each independently be a π electron-deficient nitrogen-containing $C_1$-$C_{60}$ cyclic group unsubstituted or substituted with at least one $R_{10a}$.

In an embodiment, when xe11 in Formula 601 is 2 or more, two or more of $Ar_{601(s)}$ may be linked via a single bond.

In an embodiment, $Ar_{601}$ in Formula 601 may be a substituted or unsubstituted anthracene group.

In an embodiment, the electron transport region may include a compound represented by Formula 601-1:

Formula 601-1

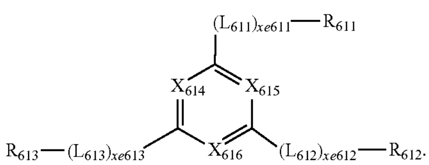

In Formula 601-1, $X_{614}$ may be N or C($R_{614}$), $X_{615}$ may be N or C($R_{615}$), $X_{616}$ may be N or C($R_{616}$), at least one of $X_{614}$ to $X_{616}$ may be N, $L_{611}$ to $L_{613}$ are the same as described in connection with $L_{601}$, xe611 to xe613 are the same as described in connection with xe1, $R_{611}$ to $R_{613}$ are the same as described in connection with $R_{601}$, and $R_{614}$ to $R_{616}$ may each independently be hydrogen, deuterium, —F, —Cl, —Br, —I, a hydroxyl group, a cyano group, a nitro group, a $C_1$-$C_{20}$ alkyl group, a $C_1$-$C_{20}$ alkoxy group, a $C_3$-$C_{60}$ carbocyclic group unsubstituted or substituted with at least one $R_{10a}$, or a $C_1$-$C_{60}$ heterocyclic group substituted or unsubstituted at least one $R_{10a}$.

In an embodiment, xe1 and xe611 to xe613 in Formulae 601 and 601-1 may each independently be 0, 1, or 2.

The electron transport region may include one of Compounds ET1 to ET46, 2,9-Dimethyl-4,7-diphenyl-1,10-phenanthroline (BCP), 4,7-Diphenyl-1,10-phenanthroline (Bphen), tris-(8-hydroxyquinoline)aluminum (Alq3), bis(2-methyl-8-quinolinolato-N1,08)-(1,1'-biphenyl-4-olato)aluminum (BAlq), 3-(biphenyl-4-yl)-5-(4-tert-butylphenyl)-4-phenyl-4H-1,2,4-triazole (TAZ), 4-(naphthalen-1-yl)-3,5-diphenyl-4H-1,2,4-triazole (NTAZ), or any combination thereof:

ET1

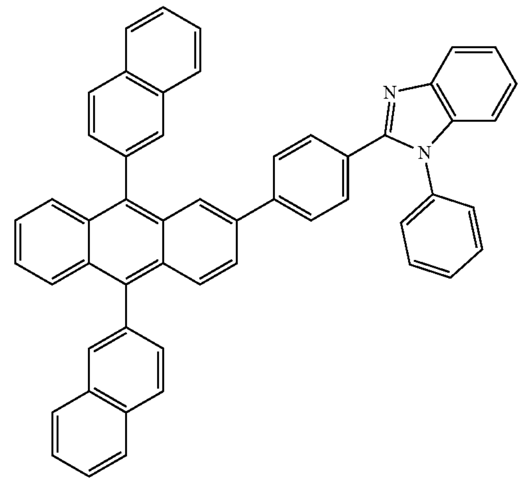

ET2

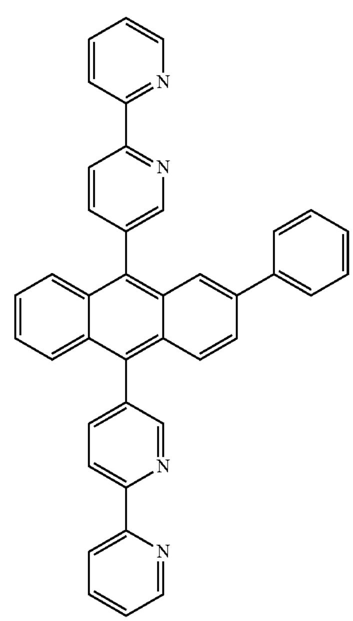

-continued
ET3
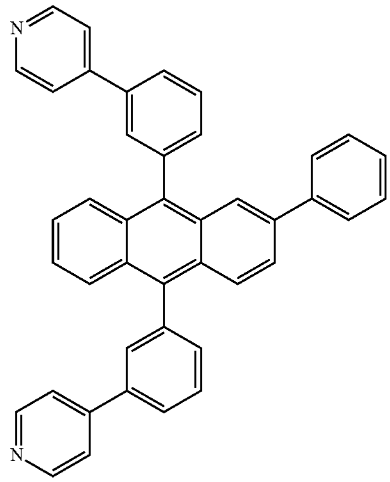
ET4
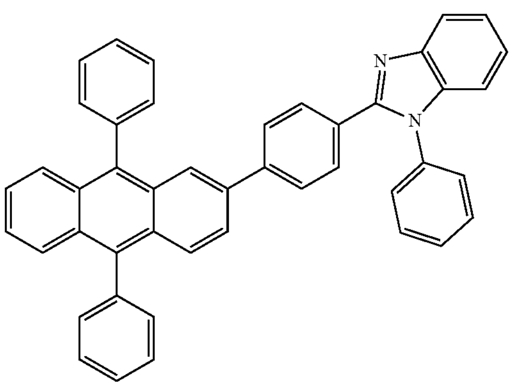
ET5
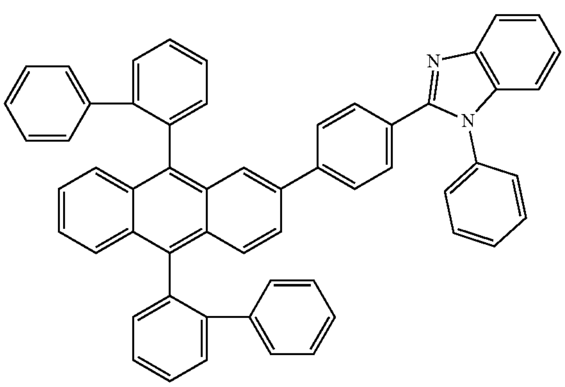
-continued
ET6
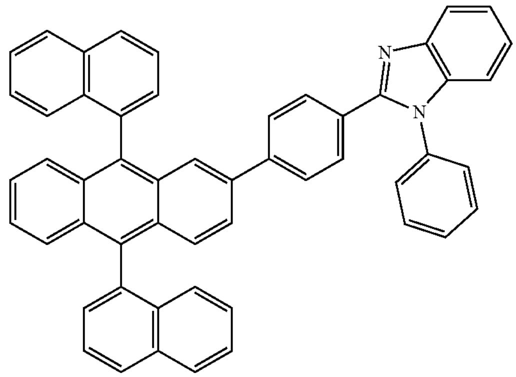
ET7
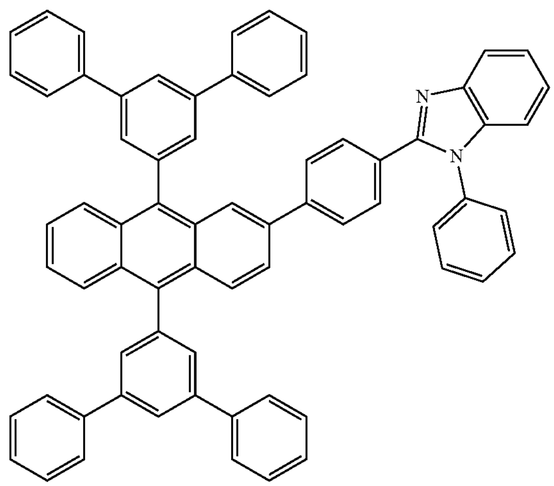
ET8
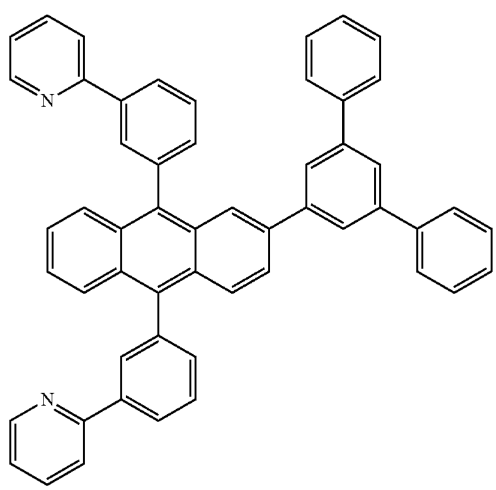

-continued
ET9
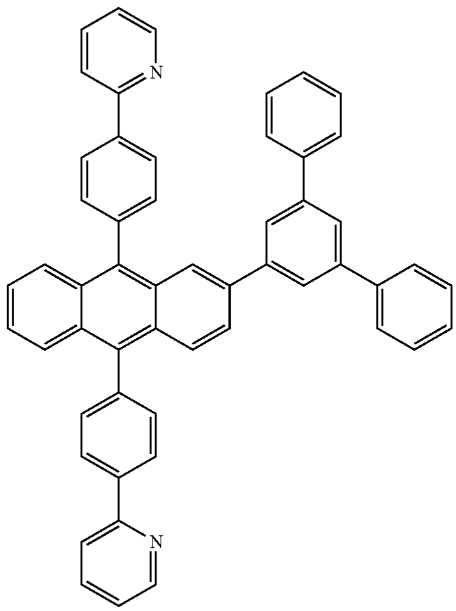
ET10
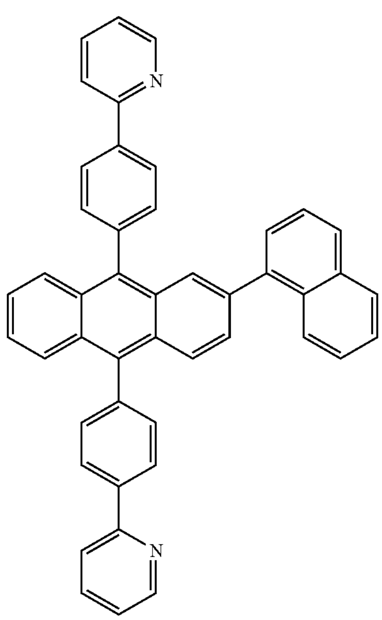
-continued
ET11
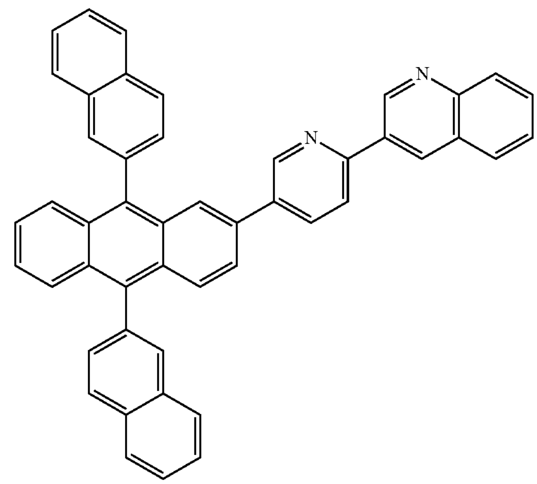
ET12
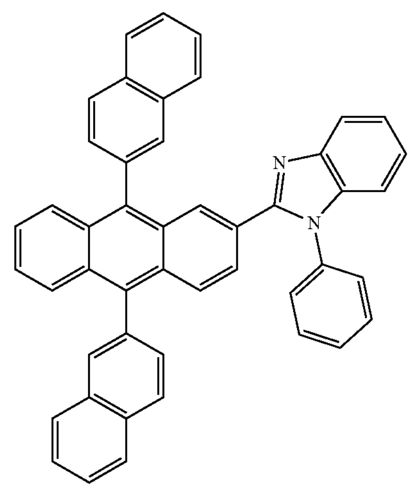
ET13
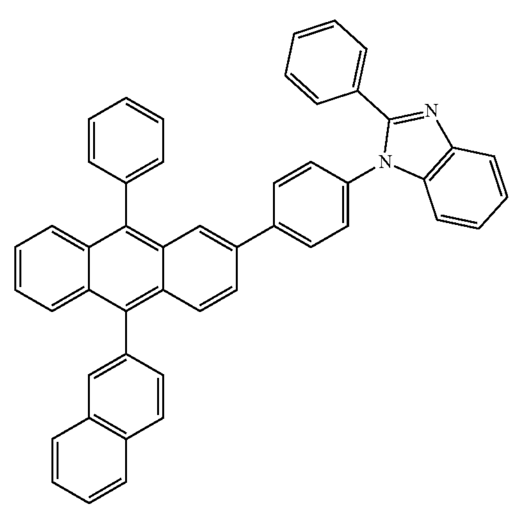

-continued
ET14
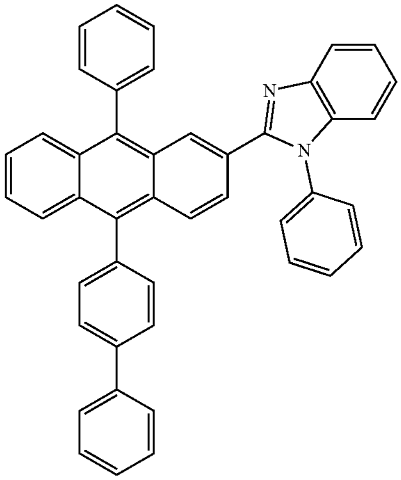
ET15
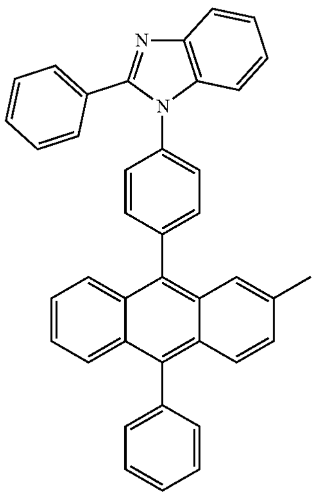
ET16
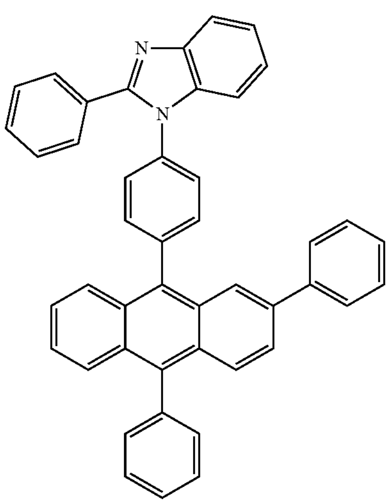
-continued
ET17
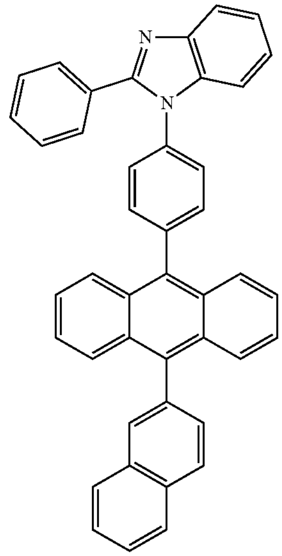
ET18
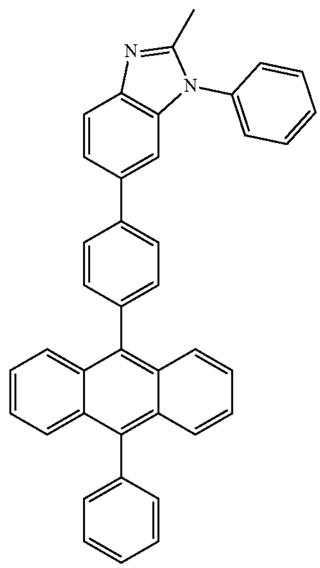
ET19
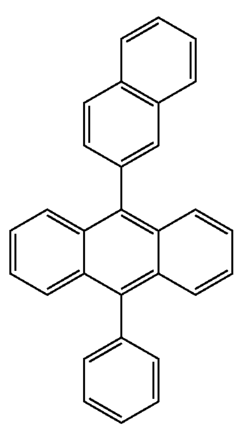

-continued
ET20
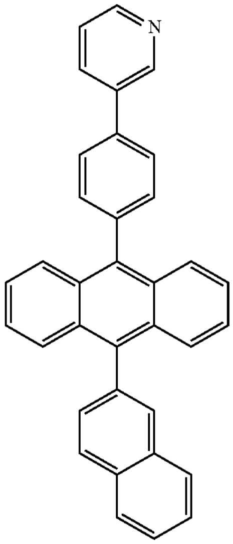
ET21
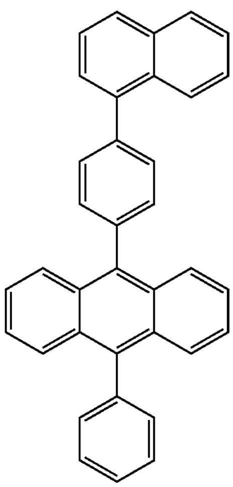
ET22
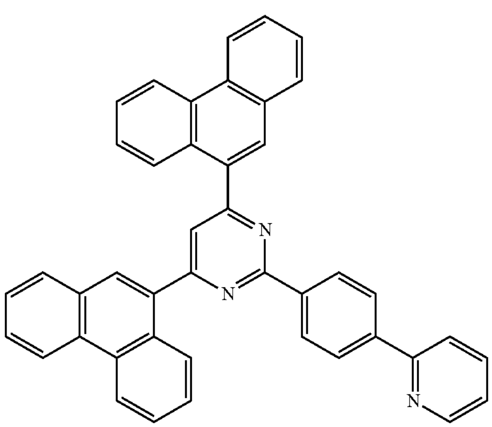
-continued
ET23
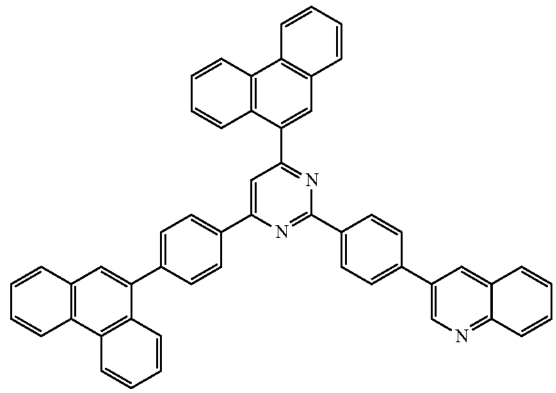
ET24
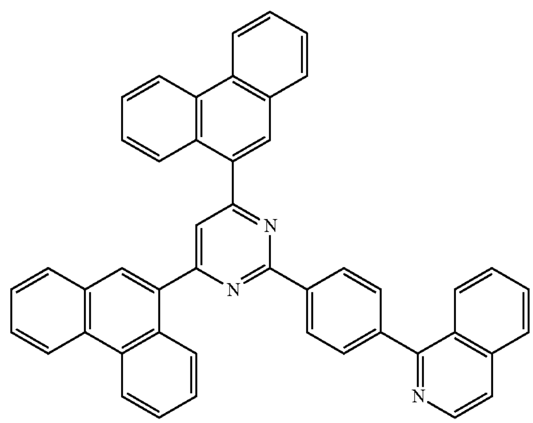
ET25
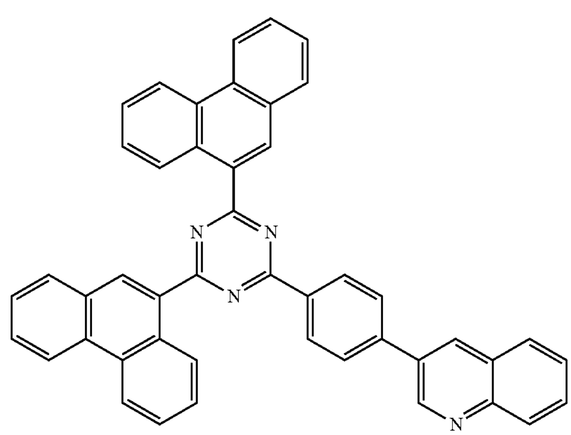

ET26
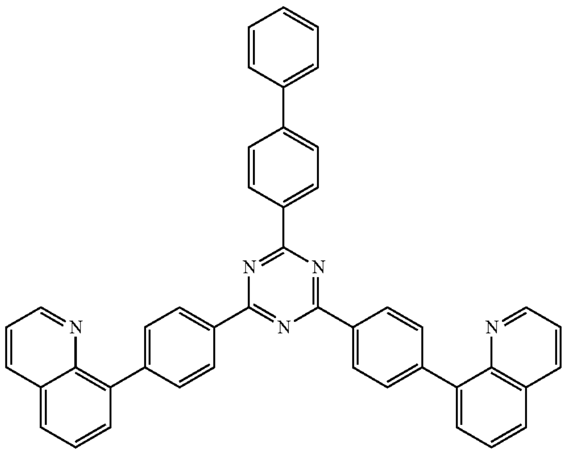
ET27
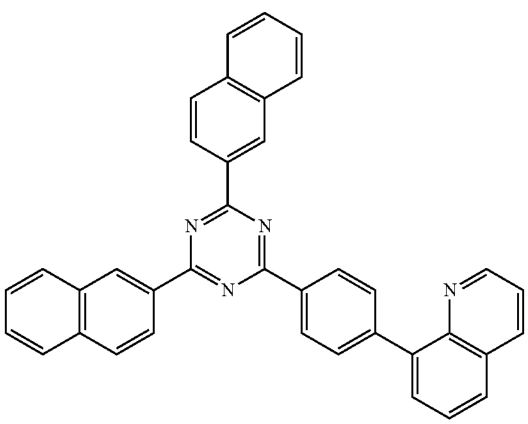
ET28
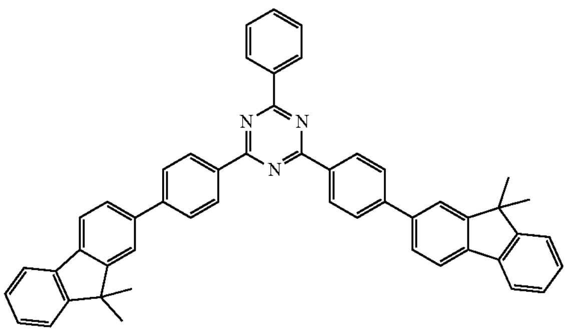
ET29
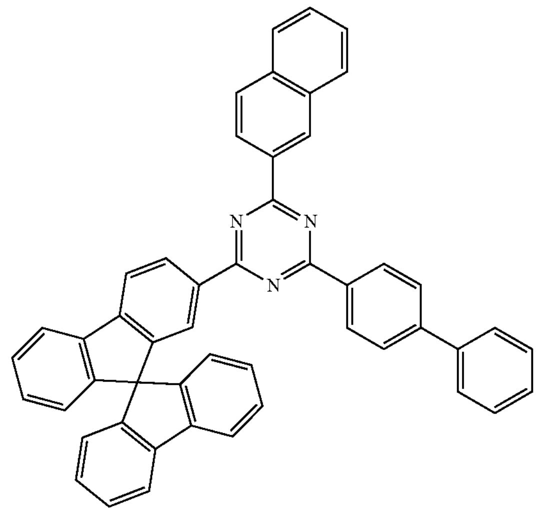
ET30
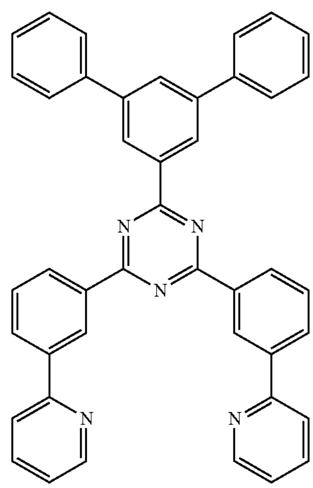
ET31
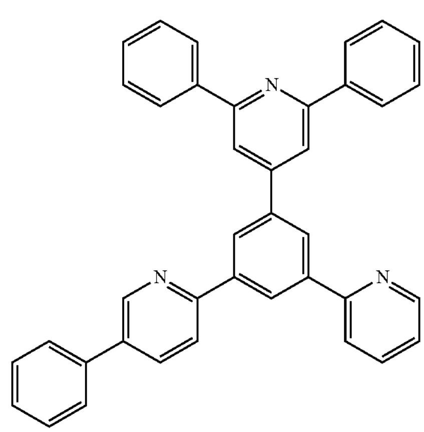

ET32
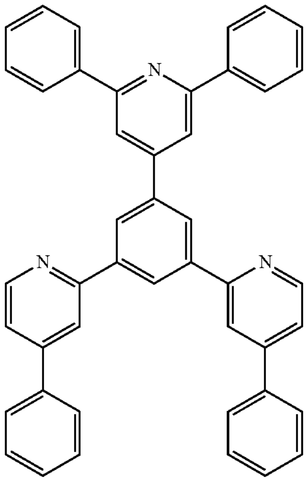
ET33
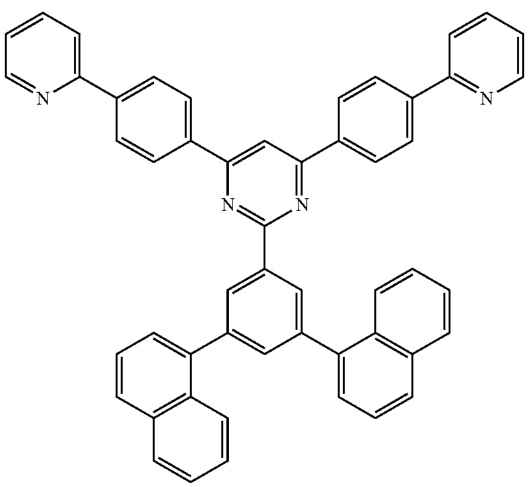
ET34
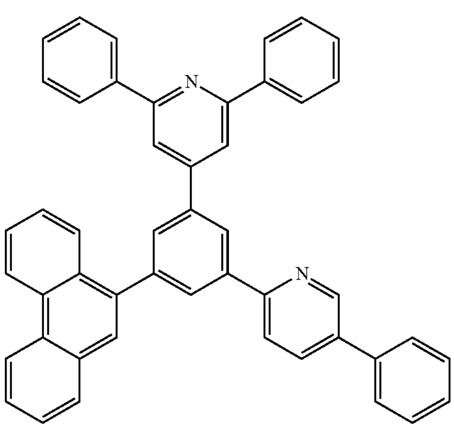
ET35
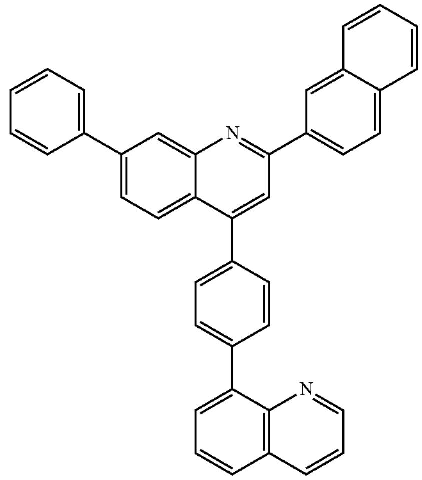
ET36
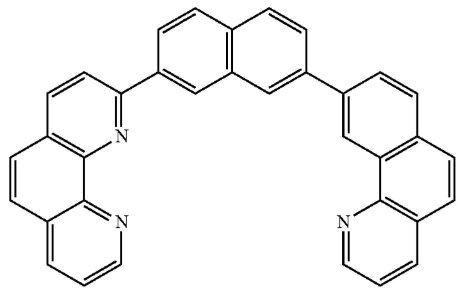
ET37
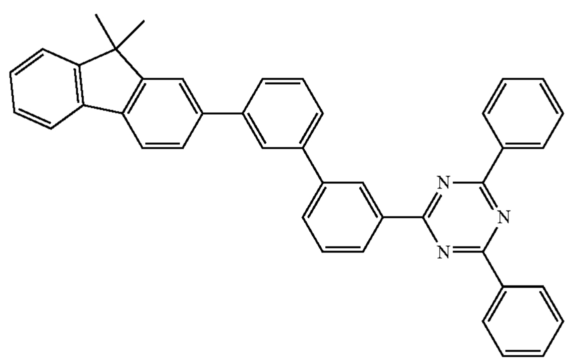
ET38
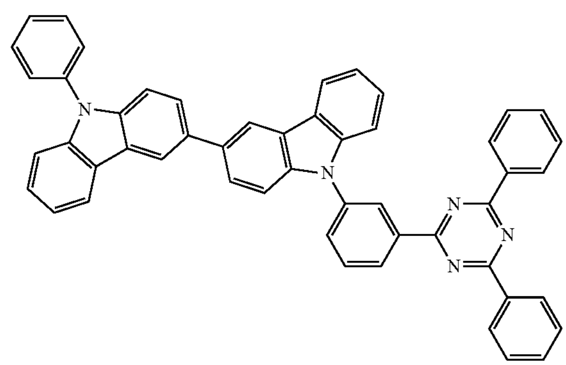

ET39
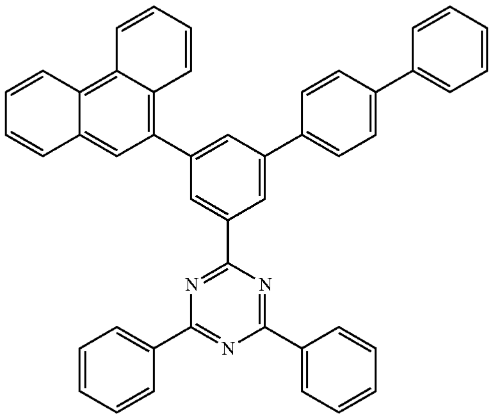
ET40
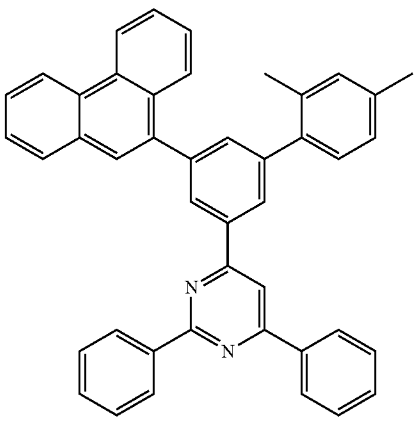
ET41
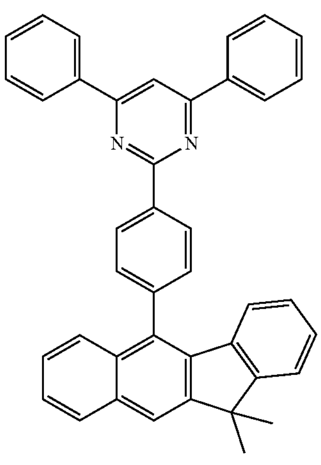
ET42
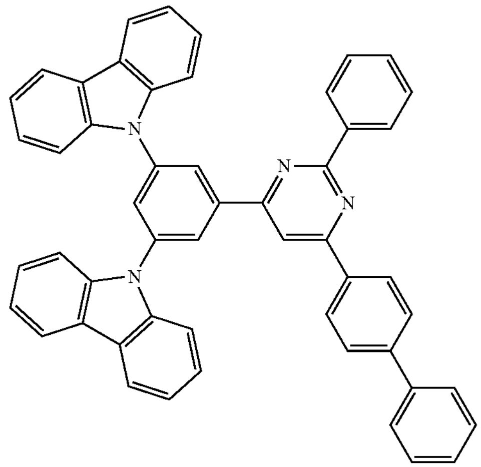
ET43
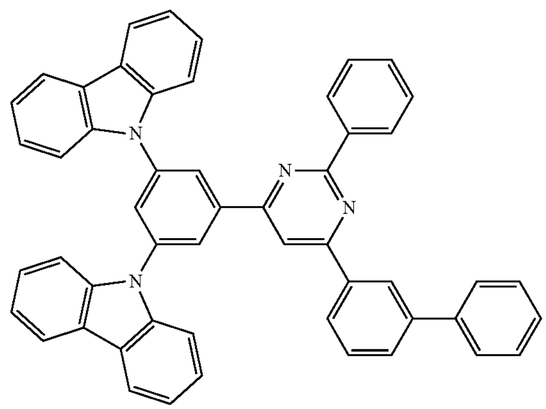
ET44
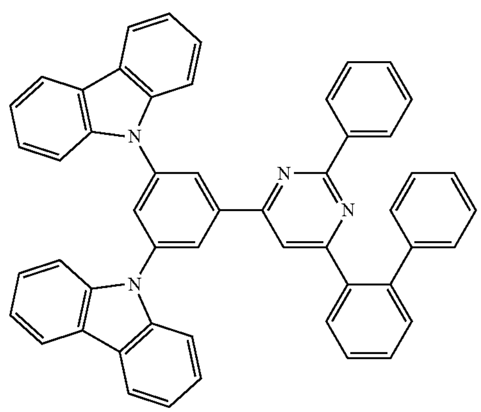
ET45
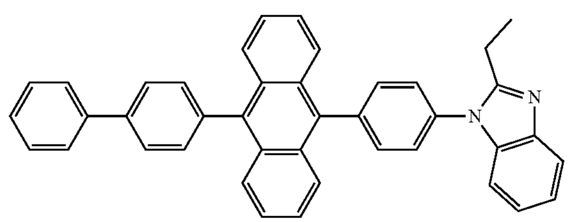

-continued

ET46

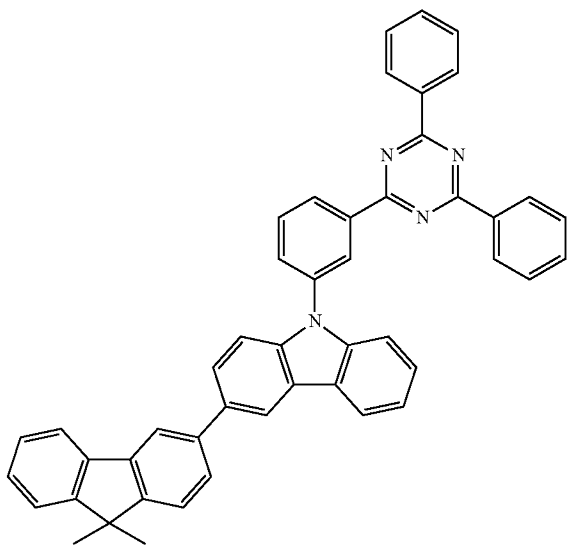

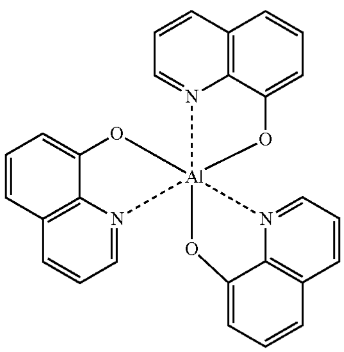

Alq3

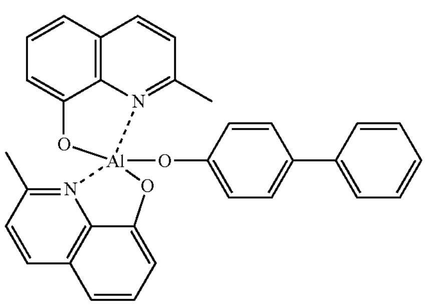

BAlq

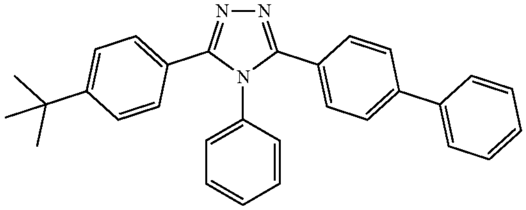

TAZ

-continued

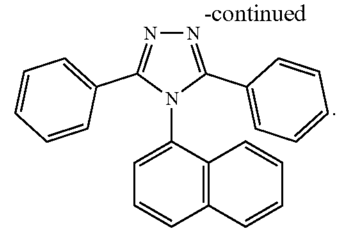

NTAZ

The thickness of the electron transport region may be from about 160 Å to about 5,000 Å, for example, from about 100 Å to about 4,000 Å. When the electron transport region includes a hole blocking layer, an electron transport layer, or any combination thereof, thicknesses of the hole blocking layer and the electron transport layer may each independently be from about 20 Å to about 1,000 Å, for example, from about 30 Å to about 300 Å, and the thickness of the electron transport layer may be from about 100 Å to about 1,000 Å, for example, from about 150 Å to about 500 Å. When the thicknesses of the hole blocking layer and/or electron transport layer are within the ranges described above, satisfactory electron-transporting characteristics may be obtained without a substantial increase in driving voltage.

The electron transport region (for example, the electron transport layer in the electron transport region) may further include, in addition to the materials described above, a metal-containing material.

The metal-containing material may include an alkali metal complex, an alkaline earth metal complex, or any combination thereof. The metal ion of the alkali metal complex may be a Li ion, a Na ion, a K ion, a Rb ion, or a Cs ion, and a metal ion of the alkaline earth metal complex may be a Be ion, a Mg ion, a Ca ion, a Sr ion, or a Ba ion. A ligand coordinated with the metal ion of the alkali metal complex or the alkaline earth-metal complex may include a hydroxyquinoline, a hydroxyisoquinoline, a hydroxybenzoquinoline, a hydroxyacridine, a hydroxyphenanthridine, a hydroxyphenyloxazole, a hydroxyphenylthiazole, a hydroxyphenyloxadiazole, a hydroxyphenylthiadiazole, a hydroxyphenylpyridine, a hydroxyphenylbenzimidazole, a hydroxyphenylbenzothiazole, a bipyridine, a phenanthroline, a cyclopentadiene, or any combination thereof.

In an embodiment, the metal-containing material may include a Li complex. The Li complex may include, for example, Compound ET-D1 (lithium quinolate, LiQ) or ET-D2:

ET-DI

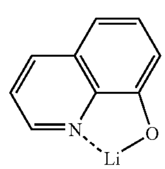

-continued

ET-D2

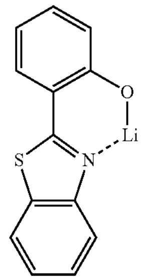

The electron transport region may include an electron injection layer that facilitates the injection of electrons from the second electrode 150. The electron injection layer may be in direct contact with the second electrode 150.

The electron injection layer may have: i) a single-layered structure consisting of a single layer consisting of a single material, ii) a single-layered structure consisting of a single layer consisting of a plurality of different materials, or iii) a multi-layered structure including a plurality of layers including different materials.

The electron injection layer may include an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof. The alkali metal may include Li, Na, K, Rb, Cs, or any combination thereof. The alkaline earth metal may include Mg, Ca, Sr, Ba, or any combination thereof. The rare earth metal may include Sc, Y, Ce, Tb, Yb, Gd, or any combination thereof. The alkali metal-containing compound, the alkaline earth metal-containing compound, and the rare earth metal-containing compound may include oxides, halides (for example, fluorides, chlorides, bromides, or iodides), or tellurides of the alkali metal, the alkaline earth metal, and the rare earth metal, or any combination thereof.

The alkali metal-containing compound may include alkali metal oxides, such as $Li_2O$, $Cs_2O$, or $K_2O$, alkali metal halides, such as LiF, NaF, CsF, KF, LiI, NaI, CsI, or KI, or any combination thereof. The alkaline earth metal-containing compound may include an alkaline earth metal compound, such as BaO, SrO, CaO, $Ba_xSr_{1-x}O$ (x is a real number satisfying the condition of $0<x<1$), $Ba_xCa_{1-x}O$ (x is a real number satisfying the condition of $0<x<1$), or the like. The rare earth metal-containing compound may include $YbF_3$, $ScF_3$, $Sc_2O_3$, $Y_2O_3$, $Ce_2O_3$, $GdF_3$, $TbF_3$, $YbI_3$, $ScI_3$, $TbI_3$, or any combination thereof. In an embodiment, the rare earth metal-containing compound may include lanthanide metal telluride. Examples of the lanthanide metal telluride may include LaTe, CeTe, PrTe, NdTe, PmTe, SmTe, EuTe, GdTe, TbTe, DyTe, HoTe, ErTe, TmTe, YbTe, LuTe, $La_2Te_3$, $Ce_2Te_3$, $Pr_2Te_3$, $Nd_2Te_3$, $Pm_2Te_3$, $Sm_2Te_3$, $Eu_2Te_3$, $Gd_2Te_3$, $Tb_2Te_3$, $Dy_2Te_3$, $Ho_2Te_3$, $Er_2Te_3$, $Tm_2Te_3$, $Yb_2Te_3$, and $Lu_2Te_3$.

The alkali metal complex, the alkaline earth-metal complex, and the rare earth metal complex may include i) one of ions of the alkali metal, the alkaline earth metal, and the rare earth metal and ii), as a ligand bonded to the metal ion, for example, a hydroxyquinoline, a hydroxyisoquinoline, a hydroxybenzoquinoline, a hydroxyacridine, a hydroxyphenanthridine, a hydroxyphenyloxazole, a hydroxyphenylthiazole, a hydroxyphenyloxadiazole, a hydroxyphenylthiadiazole, a hydroxyphenylpyridine, a hydroxyphenyl benzimidazole, a hydroxyphenylbenzothiazole, a bipyridine, a phenanthroline, a cyclopentadiene, or any combination thereof. The electron injection layer may consist of an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof, as described above. In an embodiment, the electron injection layer may further include an organic material (for example, a compound represented by Formula 601).

In an embodiment, the electron injection layer may consist of i) an alkali metal-containing compound (for example, an alkali metal halide), ii) a) an alkali metal-containing compound (for example, an alkali metal halide); and b) an alkali metal, an alkaline earth metal, a rare earth metal, or any combination thereof. In an embodiment, the electron injection layer may be a KI:Yb co-deposited layer, an RbI:Yb co-deposited layer, or the like. When the electron injection layer further includes an organic material, an alkali metal, an alkaline earth metal, a rare earth metal, an alkali metal-containing compound, an alkaline earth metal-containing compound, a rare earth metal-containing compound, an alkali metal complex, an alkaline earth-metal complex, a rare earth metal complex, or any combination thereof may be homogeneously or non-homogeneously dispersed in a matrix including the organic material.

The thickness of the electron injection layer may be in a range of about 1 Å to about 100 Å, and, for example, about 3 Å to about 90 Å. When the thickness of the electron injection layer is within the range described above, satisfactory electron injection characteristics may be obtained without a substantial increase in driving voltage.

Second Electrode 150

The second electrode 150 may be located on the interlayer 130 having such a structure. The second electrode 150 may be a cathode, which is an electron injection electrode, and as the material for the second electrode 150, a metal, an alloy, an electrically conductive compound, or any combination thereof, each having a low work function, may be used.

In an embodiment, the second electrode 150 may include lithium (Li), silver (Ag), magnesium (Mg), aluminum (Al), aluminum-lithium (Al—Li), calcium (Ca), magnesium-indium (Mg—In), magnesium-silver (Mg—Ag), ytterbium (Yb), silver-ytterbium (Ag—Yb), an ITO, an IZO, or a combination thereof. The second electrode 150 may be a transmissive electrode, a semi-transmissive electrode, or a reflective electrode. The second electrode 150 may have a single-layered structure or a multi-layered structure including two or more layers.

Capping Layer

A first capping layer may be located outside the first electrode 110, and/or a second capping layer may be located outside the second electrode 150. In detail, the light-emitting device 10 may have a structure in which the first capping layer, the first electrode 110, the interlayer 130, and the second electrode 150 are sequentially stacked in this stated order, a structure in which the first electrode 110, the interlayer 130, the second electrode 150, and the second capping layer are sequentially stacked in this stated order, or a structure in which the first capping layer, the first electrode 110, the interlayer 130, the second electrode 150, and the second capping layer are sequentially stacked in this stated order.

Light generated in an emission layer of the interlayer 130 of the light-emitting device 10 may be extracted toward the outside through the first electrode 110, which is a semi-transmissive electrode or a transmissive electrode, and the first capping layer or light generated in an emission layer of the interlayer 130 of the light-emitting device 10 may be extracted toward the outside through the second electrode 150, which is a semi-transmissive electrode or a transmissive electrode, and the second capping layer.

The first capping layer and the second capping layer may increase external emission efficiency according to the principle of constructive interference. Accordingly, the light extraction efficiency of the light-emitting device 10 is increased, so that the emission efficiency of the light-emitting device 10 may be improved.

Each of the first capping layer and second capping layer may include a material having a refractive index (at 589 nm) of about 1.6 or more. The first capping layer and the second capping layer may each independently be an organic capping layer including an organic material, an inorganic capping layer including an inorganic material, or an organic-inorganic composite capping layer including an organic material and an inorganic material.

At least one of the first capping layer and the second capping layer may each independently include carbocyclic compounds, heterocyclic compounds, amine group-containing compounds, porphyrin derivatives, phthalocyanine derivatives, naphthalocyanine derivatives, alkali metal complexes, alkaline earth metal complexes, or any combination thereof. The carbocyclic compound, the heterocyclic compound, and the amine group-containing compound may be optionally substituted with a substituent containing O, N, S, Se, Si, F, Cl, Br, I, or any combination thereof. In an embodiment, at least one of the first capping layer and the second capping layer may each independently include an amine group-containing compound.

In an embodiment, at least one of the first capping layer and the second capping layer may each independently include a compound represented by Formula 201, a compound represented by Formula 202, or any combination thereof. In an embodiment, at least one of the first capping layer and the second capping layer may each independently include one of Compounds HT28 to HT33, one of Compounds CP1 to CP6, N4,N4'-di(naphthalen-2-yl)-N4,N4'-diphenyl-[1,1'-biphenyl]-4,4'-diamine (β-NPB), or any combination thereof:

CP1

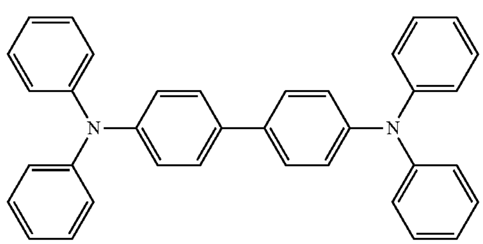

CP2

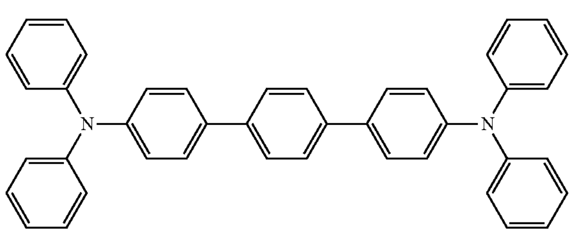

-continued

CP3

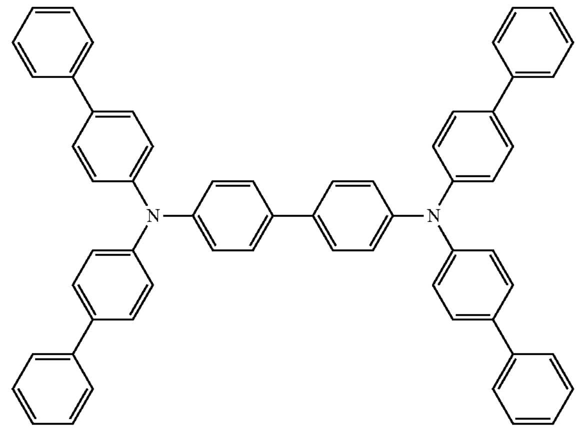

CP4

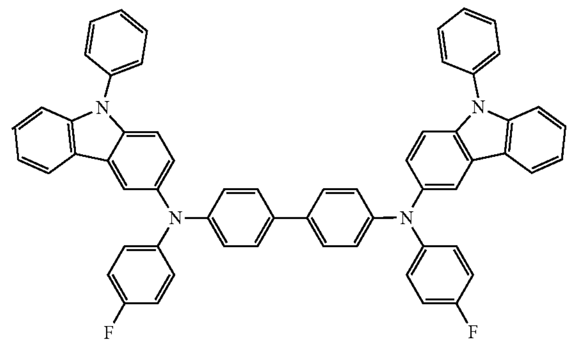

CP5

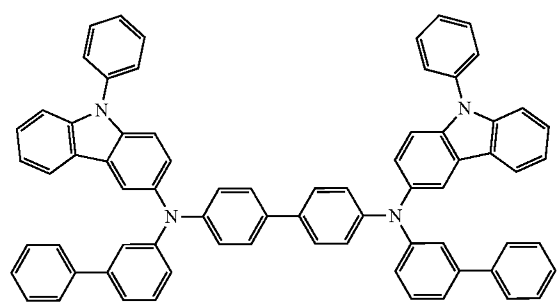

CP6

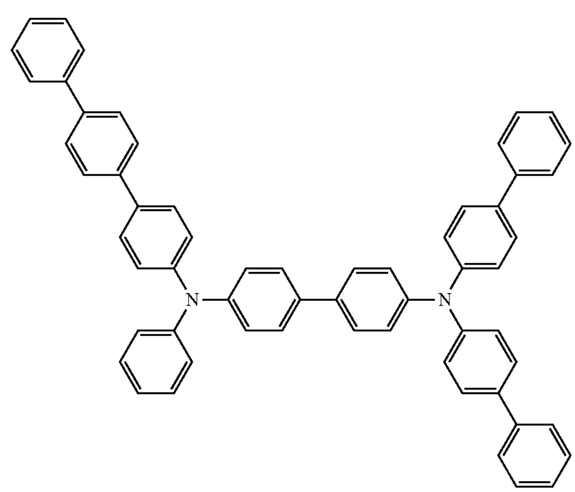

-continued

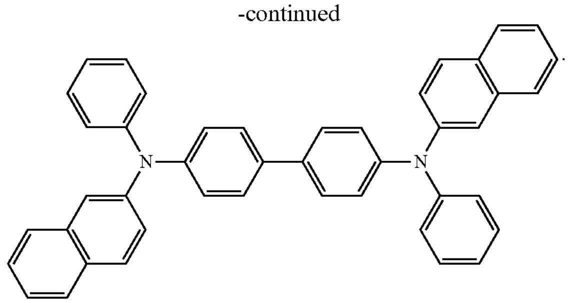

β-NPB

Electronic Apparatus

The light-emitting device may be included in various electronic apparatuses. In an embodiment, the electronic apparatus including the light-emitting device may be a light-emitting apparatus, an authentication apparatus, or the like.

The electronic apparatus (for example, light-emitting apparatus) may further include, in addition to the light-emitting device, i) a color filter, ii) a color conversion layer, or iii) a color filter and a color conversion layer. The color filter and/or the color conversion layer may be located in at least one traveling direction of light emitted from the light-emitting device. In an embodiment, the light emitted from the light-emitting device may be blue light. The light-emitting device may be the same as described above. In an embodiment, the color conversion layer may include quantum dots. The quantum dot may be, for example, a quantum dot as described herein.

The electronic apparatus may include a first substrate. The first substrate may include a plurality of subpixel areas, the color filter may include a plurality of color filter areas respectively corresponding to the subpixel areas, and the color conversion layer may include a plurality of color conversion areas respectively corresponding to the subpixel areas.

A pixel-defining film may be located among the subpixel areas to define each of the subpixel areas. The color filter may further include a plurality of color filter areas and light-shielding patterns located among the color filter areas, and the color conversion layer may include a plurality of color conversion areas and light-shielding patterns located among the color conversion areas.

The color filter areas (or the color conversion areas) may include a first area emitting first color light, a second area emitting second color light, and/or a third area emitting third color light, and the first color light, the second color light, and/or the third color light may have different maximum emission wavelengths from one another. In an embodiment, the first color light may be red light, the second color light may be green light, and the third color light may be blue light. In an embodiment, the color filter areas (or the color conversion areas) may include quantum dots. In detail, the first area may include a red quantum dot, the second area may include a green quantum dot, and the third area may not include a quantum dot. The quantum dot is the same as described herein. The first area, the second area, and/or the third area may each include a scatterer.

In an embodiment, the light-emitting device may emit first light, the first area may absorb the first light to emit first first-color light, the second area may absorb the first light to emit second first-color light, and the third area may absorb the first light to emit third first-color light. In this regard, the first first-color light, the second first-color light, and the third first-color light may have different maximum emission wavelengths. In detail, the first light may be blue light, the first first-color light may be red light, the second first-color light may be green light, and the third first-color light may be blue light.

The electronic apparatus may further include a thin-film transistor in addition to the light-emitting device as described above. The thin-film transistor may include a source electrode, a drain electrode, and an activation layer, wherein any one of the source electrode and the drain electrode may be electrically connected to any one of the first electrode and the second electrode of the light-emitting device. The thin-film transistor may further include a gate electrode, a gate insulating film, etc. The activation layer may include a crystalline silicon, an amorphous silicon, an organic semiconductor, an oxide semiconductor, or the like.

The electronic apparatus may further include a sealing portion for sealing the light-emitting device. The sealing portion and/or the color conversion layer may be located between the color filter and the light-emitting device. The sealing portion allows light from the light-emitting device to be extracted to the outside, while simultaneously preventing ambient air and moisture from penetrating into the light-emitting device. The sealing portion may be a sealing substrate including a transparent glass substrate or a plastic substrate. The sealing portion may be a thin-film encapsulation layer including at least one layer of an organic layer and/or an inorganic layer. When the sealing portion is a thin film encapsulation layer, the electronic apparatus may be flexible.

Various functional layers may be additionally located on the sealing portion, in addition to the color filter and/or the color conversion layer, according to the use of the electronic apparatus. The functional layers may include a touch screen layer, a polarizing layer, and the like. The touch screen layer may be a pressure-sensitive touch screen layer, a capacitive touch screen layer, or an infrared touch screen layer. The authentication apparatus may be, for example, a biometric authentication apparatus that authenticates an individual by using biometric information of a living body (for example, fingertips, pupils, etc.). The authentication apparatus may further include, in addition to the light-emitting device, a biometric information collector.

The electronic apparatus may take the form of or be applied to various displays, light sources, lighting, personal computers (for example, a mobile personal computer), mobile phones, digital cameras, electronic organizers, electronic dictionaries, electronic game machines, medical instruments (for example, electronic thermometers, sphygmomanometers, blood glucose meters, pulse measurement devices, pulse wave measurement devices, electrocardiogram displays, ultrasonic diagnostic devices, or endoscope displays), fish finders, various measuring instruments, meters (for example, meters for a vehicle, an aircraft, and a vessel), projectors, and the like.

Figure 2:
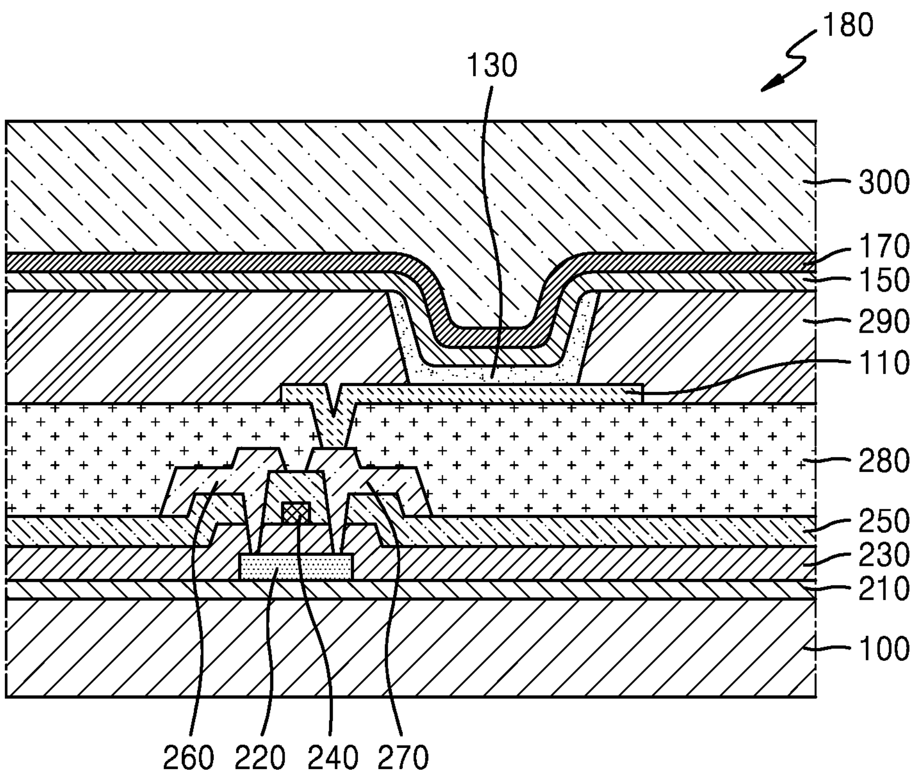
FIG. 2 is a cross-sectional view of an embodiment of a light-emitting apparatus constructed according to the principles of the invention. having the light emitting device of FIG. 1.
Figure 3:
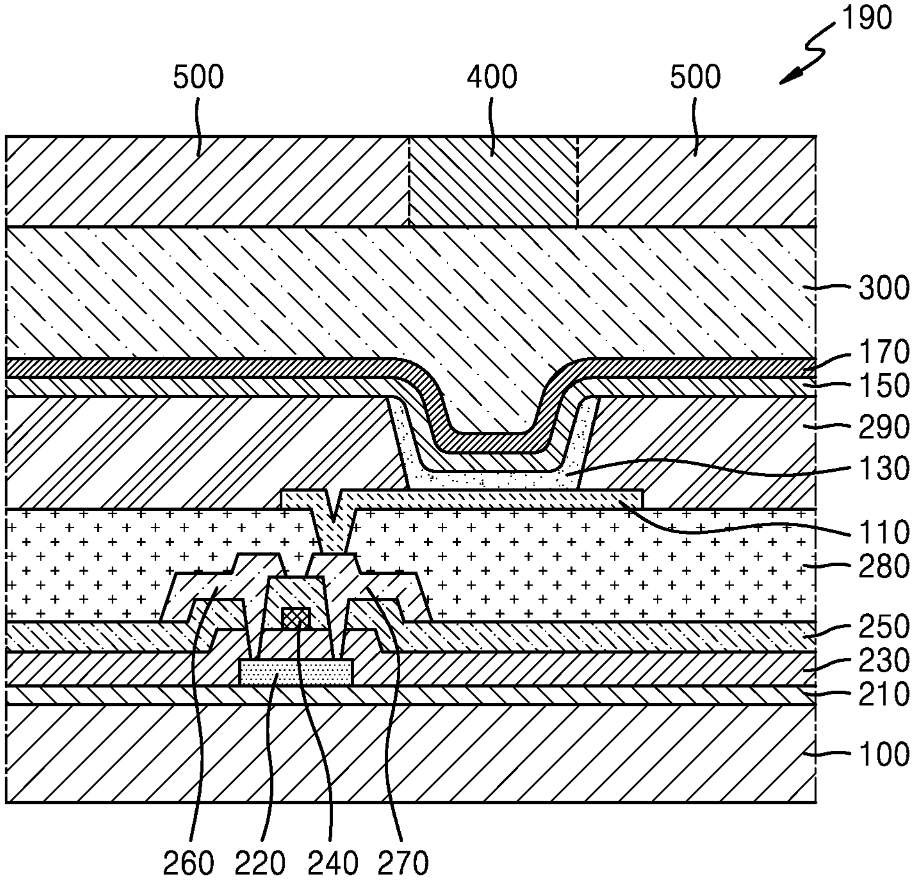
FIG. 3 is a cross-sectional view of another embodiment of a light-emitting apparatus having the light emitting device of FIG. 1 constructed according to the principles of the invention.

Description of FIGS. 2 and 3

FIG. 2 is a cross-sectional view of an embodiment of a light-emitting apparatus constructed according to the principles of the invention. having the light emitting device of FIG. 1.

The light-emitting apparatus 180 of FIG. 2 includes a substrate 100, a thin-film transistor (TFT), a light-emitting device 10, and an encapsulation portion 300 that seals the light-emitting device.

The substrate 100 may be a flexible substrate, a glass substrate, or a metal substrate. A buffer layer 210 may be formed on the substrate 100. The buffer layer 210 may prevent penetration of impurities through the substrate 100 and may provide a substantially flat surface on the substrate 100.

A TFT may be located on the buffer layer 210. The TFT may include an activation layer 220, a gate electrode 240, a source electrode 260, and a drain electrode 270. The activation layer 220 may include an inorganic semiconductor such as silicon or polysilicon, an organic semiconductor, or an oxide semiconductor, and may include a source region, a drain region and a channel region. A gate insulating film 230 for insulating the activation layer 220 from the gate electrode 240 may be located on the activation layer 220, and the gate electrode 240 may be located on the gate insulating film 230.

An interlayer insulating film 250 is located on the gate electrode 240. The interlayer insulating film 250 may be placed between the gate electrode 240 and the source electrode 260 to insulate the gate electrode 240 from the source electrode 260 and located between the gate electrode 240 and the drain electrode 270 to insulate the gate electrode 240 from the drain electrode 270. The source electrode 260 and the drain electrode 270 may be located on the interlayer insulating film 250. The interlayer insulating film 250 and the gate insulating film 230 may be formed to expose the source region and the drain region of the activation layer 220, and the source electrode 260 and the drain electrode 270 may be in contact with the exposed portions of the source region and the drain region of the activation layer 220.

The TFT is electrically connected to a light-emitting device 10 to drive the light-emitting device 10, and is covered by a passivation layer 280. The passivation layer 280 may include an inorganic insulating film, an organic insulating film, or a combination thereof. A light-emitting device 10 is provided on the passivation layer 280. The light-emitting device 10 may include a first electrode 110, an interlayer 130, and a second electrode 150.

The first electrode 110 may be formed on the passivation layer 280. The passivation layer 280 does not completely cover the drain electrode 270 and exposes a portion of the drain electrode 270, and the first electrode 110 is connected to the exposed portion of the drain electrode 270. A pixel-defining layer 290 containing an insulating material may be located on the first electrode 110. The pixel-defining layer 290 exposes a region of the first electrode 110, and an interlayer 130 may be formed in the exposed region of the first electrode 110. The pixel-defining layer 290 may be a polyimide or a polyacrylic organic film. At least some layers of the interlayer 130 may extend beyond the upper portion of the pixel-defining layer 290 to be located in the form of a common layer. The second electrode 150 may be located on the interlayer 130, and a capping layer 170 may be additionally formed on the second electrode 150. The capping layer 170 may be formed to cover the second electrode 150.

The encapsulation portion 300 may be located on the capping layer 170. The encapsulation portion 300 may be located on a light-emitting device to protect the light-emitting device from moisture or oxygen. The encapsulation portion 300 may include: an inorganic film including a silicon nitride ($SiN_x$), a silicon oxide ($SiO_x$), an indium tin oxide (ITO), an indium zinc oxide (IZO), or any combination thereof; an organic film including a polyethylene terephthalate, a polyethylene naphthalate, a polycarbonate, a polyimide, a polyethylene sulfonate, a polyoxymethylene, a polyarylate, a hexamethyldisiloxane, an acrylic resin (for example, a polymethyl methacrylate, a polyacrylic acid, or the like), an epoxy-based resin (for example, an aliphatic glycidyl ether (AGE), or the like), or a combination thereof; or a combination of the inorganic film and the organic film.

FIG. 3 is a cross-sectional view of another embodiment of a light-emitting apparatus having the light emitting device of FIG. 1 constructed according to the principles of the invention.

The light-emitting apparatus 190 of FIG. 3 is substantially the same as the light-emitting apparatus 180 of FIG. 2, except that a light-shielding pattern 500 and a functional region 400 are additionally located on the encapsulation portion 300. The functional region 400 may be a combination of i) a color filter area, ii) a color conversion area, or iii) a combination of the color filter area and the color conversion area. In an embodiment, the light-emitting device included in the light-emitting apparatus 190 of FIG. 3 may be a tandem light-emitting device.

Manufacture Method

Respective layers included in the hole transport region, the emission layer, and respective layers included in the electron transport region may be formed in a certain region by using one or more suitable methods selected from vacuum deposition, spin coating, casting, Langmuir-Blodgett (LB) deposition, ink-jet printing, laser-printing, and laser-induced thermal imaging.

When layers constituting the hole transport region, an emission layer, and layers constituting the electron transport region are formed by vacuum deposition, the deposition may be performed at a deposition temperature of about 100° C. to about 500° C., a vacuum degree of about 10' torr to about 10' torr, and a deposition speed of about 0.01 Å/sec to about 100 Å/sec, depending on the material to be included in a layer to be formed and the structure of a layer to be formed. When layers constituting the hole transport region, an emission layer, and layers constituting the electron transport region are formed by spin coating, the spin coating may be performed at a coating speed of about 2,000 rpm to about 5,000 rpm and at a heat treatment temperature of about 80° C. to 200° C. by taking into account the material to be included in a layer to be formed and the structure of a layer to be formed.

General Definitions

As used herein, the term "atom" may mean an element or its corresponding radical bonded to one or more other atoms.

The terms "hydrogen" and "deuterium" refer to their respective atoms and corresponding radicals, and the terms "—F, —Cl, —Br, and —I" are radicals of, respectively, fluorine, chlorine, bromine, and iodine.

As used herein, a substituent for a monovalent group, e.g., alkyl, may also be, independently, a substituent for a corresponding divalent group, e.g., alkylene.

The term "interlayer" as used herein refers to a single layer and/or all of a plurality of layers located between a first electrode and a second electrode of a light-emitting device.

The term "$C_3$-$C_{60}$ carbocyclic group" as used herein refers to a cyclic group consisting of carbon only as a ring-forming atom and having three to sixty carbon atoms, and the term "$C_1$-$C_{60}$ heterocyclic group" as used herein refers to a cyclic group that has one to sixty carbon atoms and further has, in addition to carbon, a heteroatom as a ring-forming atom. The $C_3$-$C_{60}$ carbocyclic group and the $C_1$-$C_{60}$ heterocyclic group may each be a monocyclic group consisting of one ring or a polycyclic group in which two or more rings are fused with each other. In an embodiment, the $C_1$-$C_{60}$ heterocyclic group has 3 to 61 ring-forming atoms.

The "cyclic group" as used herein may include the $C_3$-$C_{60}$ carbocyclic group and the $C_1$-$C_{60}$ heterocyclic group.

The term "π electron-rich $C_3$-$C_{60}$ cyclic group" as used herein refers to a cyclic group that has three to sixty carbon atoms and does not include *—N=*' as a ring-forming moiety, and the term "π electron-deficient nitrogen-containing $C_1$-$C_{60}$ cyclic group" as used herein refers to a heterocyclic group that has one to sixty carbon atoms and includes *—N=*' as a ring-forming moiety.

In an embodiment, the $C_3$-$C_{60}$ carbocyclic group may be i) group T1 or ii) a fused cyclic group in which two or more groups T1 are fused with each other for example, a cyclopentadiene group, an adamantane group, a norbornane group, a benzene group, a pentalene group, a naphthalene group, an azulene group, an indacene group, an acenaphthylene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spiro-bifluorene group, a benzofluorene group, an indenophenanthrene group, or an indenoanthracene group, and the $C_1$-$C_{60}$ heterocyclic group may be i) group T2, ii) a fused cyclic group in which two or more groups T2 are fused with each other, or iii) a fused cyclic group in which at least one group T2 and at least one group T1 are fused with each other for example, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, etc.

The π electron-rich $C_3$-$C_{60}$ cyclic group may be i) group T1, ii) a fused cyclic group in which two or more groups T1 are fused with each other, iii) group T3, iv) a fused cyclic group in which two or more groups T3 are fused with each other, or v) a fused cyclic group in which at least one group T3 and at least one group T1 are fused with each other, for example, the $C_3$-$C_{60}$ carbocyclic group, a 1H-pyrrole group, a silole group, a borole group, a 2H-pyrrole group, a 3H-pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, etc.

The π electron-deficient nitrogen-containing $C_1$-$C_{60}$ cyclic group may be i) group T4, ii) a fused cyclic group in which two or more group T4 are fused with each other, iii) a fused cyclic group in which at least one group T4 and at least one group T1 are fused with each other, iv) a fused cyclic group in which at least one group T4 and at least one group T3 are fused with each other, or v) a fused cyclic group in which at least one group T4, at least one group T1, and at least one group T3 are fused with one another, for example, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, etc., the group T1 may be a cyclopropane group, a cyclobutane group, a cyclopentane group, a cyclohexane group, a cycloheptane group, a cyclooctane group, a cyclobutene group, a cyclopentene group, a cyclopentadiene group, a cyclohexene group, a cyclohexadiene group, a cycloheptene group, an adamantane group, a norbornane (or a bicyclo[2.2.1]heptane) group, a norbornene group, a bicyclo[1.1.1]pentane group, a bicyclo[2.1.1]hexane group, a bicyclo[2.2.2]octane group, or a benzene group, the group T2 may be a furan group, a thiophene group, a 1H-pyrrole group, a silole group, a borole group, a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, a tetrazine group, a pyrrolidine group, an imidazolidine group, a dihydropyrrole group, a piperidine group, a tetrahydropyridine group, a dihydropyridine group, a hexahydropyrimidine group, a tetrahydropyrimidine group, a dihydropyrimidine group, a piperazine group, a tetrahydropyrazine group, a dihydropyrazine group, a tetrahydropyridazine group, or a dihydropyridazine group, the group T3 may be a furan group, a thiophene group, a 1H-pyrrole group, a silole group, or a borole group, and the group T4 may be a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group.

The term "cyclic group", "$C_3$-$C_{60}$ carbocyclic group", "$C_1$-$C_{60}$ heterocyclic group", "π electron-rich $C_3$-$C_{60}$ cyclic group", or "π electron-deficient nitrogen-containing $C_1$-$C_{60}$ cyclic group" as used herein refers to a group fused to any cyclic group or a polyvalent group (for example, a divalent group, a trivalent group, a tetravalent group, etc.), depending on the structure of a formula in connection with which the terms are used. In an embodiment, "a benzene group" may be a benzo group, a phenyl group, a phenylene group, or the like, which may be easily understood by one of ordinary skill in the art according to the structure of a formula including the "benzene group."

Examples of the monovalent $C_3$-$C_{60}$ carbocyclic group and the monovalent $C_1$-$C_{60}$ heterocyclic group may include a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic fused polycyclic group, and a monovalent non-aromatic fused heteropolycyclic group, and examples of the divalent $C_3$-$C_{60}$ carbocyclic group and the monovalent $C_1$-$C_{60}$ heterocyclic group may include a $C_3$-$C_{10}$ cycloalkylene group, a $C_1$-$C_{10}$ heterocycloalkylene group, a $C_3$-$C_{10}$ cycloalkenylene group, a $C_1$-$C_{10}$ heterocycloalkenylene group, a $C_6$-$C_{60}$ arylene group, a $C_1$-$C_{60}$ heteroarylene group, a divalent non-aromatic fused polycyclic group, and a substituted or unsubstituted divalent non-aromatic fused heteropolycyclic group.

The term "$C_1$-$C_{60}$ alkyl group" as used herein refers to a linear or branched aliphatic hydrocarbon monovalent group that has one to sixty carbon atoms, and examples thereof include a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, and a tert-decyl group. The term "$C_1$-$C_{60}$ alkylene group" as used herein refers to a divalent group having a structure corresponding to the $C_1$-$C_{60}$ alkyl group.

The term "$C_2$-$C_{60}$ alkenyl group" as used herein refers to a monovalent hydrocarbon group having at least one carbon-carbon double bond in the middle or at the terminus of the $C_2$-$C_{60}$ alkyl group, and examples thereof include an ethenyl group, a propenyl group, and a butenyl group. The term "$C_2$-$C_{60}$ alkenylene group" as used herein refers to a divalent group having a structure corresponding to the $C_2$-$C_{60}$ alkenyl group.

The term "$C_2$-$C_{60}$ alkynyl group" as used herein refers to a monovalent hydrocarbon group having at least one carbon-carbon triple bond in the middle or at the terminus of the $C_2$-$C_{60}$ alkyl group, and examples thereof include an ethynyl group and a propynyl group.

The term "$C_2$-$C_{60}$ alkynylene group" as used herein refers to a divalent group having a structure corresponding to the $C_2$-$C_{60}$ alkynyl group.

The term "$C_1$-$C_{60}$ alkoxy group" as used herein refers to a monovalent group represented by —$OA_{101}$ (wherein $A_{101}$ is the $C_1$-$C_{60}$ alkyl group), and examples thereof include a methoxy group, an ethoxy group, and an isopropyloxy group.

The term "$C_3$-$C_{10}$ cycloalkyl group" as used herein refers to a monovalent saturated hydrocarbon cyclic group having 3 to 10 carbon atoms, and examples thereof include a cyclopropyl group, a cyclobutyl group, a cyclopentyl group, a cyclohexyl group, a cycloheptyl group, a cyclooctyl group, an adamantanyl group, a norbornanyl group (or a bicyclo[2.2.1]heptyl group), a bicyclo[1.1.1]pentyl group, a bicyclo[2.1.1]hexyl group, and a bicyclo[2.2.2]octyl group. The term "$C_3$-$C_{10}$ cycloalkylene group" as used herein refers to a divalent group having a structure corresponding to the $C_3$-$C_{10}$ cycloalkyl group.

The term "$C_1$-$C_{10}$ heterocycloalkyl group" as used herein refers to a monovalent cyclic group that further includes, in addition to a carbon atom, at least one heteroatom as a ring-forming atom and has 1 to 10 carbon atoms, and examples thereof include a 1,2,3,4-oxatriazolidinyl group, a tetrahydrofuranyl group, and a tetrahydrothiophenyl group. The term "$C_1$-$C_{10}$ heterocycloalkylene group" as used herein refers to a divalent group having a structure corresponding to the $C_1$-$C_{10}$ heterocycloalkyl group.

The term "$C_3$-$C_{10}$ cycloalkenyl group" used herein refers to a monovalent cyclic group that has three to ten carbon atoms and at least one carbon-carbon double bond in the ring thereof and no aromaticity, and examples thereof include a cyclopentenyl group, a cyclohexenyl group, and a cycloheptenyl group. The term "$C_3$-$C_{10}$ cycloalkenylene group" as used herein refers to a divalent group having a structure corresponding to the $C_3$-$C_{10}$ cycloalkenyl group.

The term "$C_1$-$C_{10}$ heterocycloalkenyl group" as used herein refers to a monovalent cyclic group that has, in addition to a carbon atom, at least one heteroatom as a ring-forming atom, 1 to 10 carbon atoms, and at least one carbon-carbon double bond in the cyclic structure thereof. Examples of the $C_1$-$C_{10}$ heterocycloalkenyl group include a 4,5-dihydro-1,2,3,4-oxatriazolyl group, a 2,3-dihydrofuranyl group, and a 2,3-dihydrothiophenyl group. The term "$C_1$-$C_{10}$ heterocycloalkenylene group" as used herein refers to a divalent group having a structure corresponding to the $C_1$-$C_{10}$ heterocycloalkenyl group.

The term "$C_6$-$C_{60}$ aryl group" as used herein refers to a monovalent group having a carbocyclic aromatic system having six to sixty carbon atoms, and the term "$C_6$-$C_{60}$ arylene group" as used herein refers to a divalent group having a carbocyclic aromatic system having six to sixty carbon atoms. Examples of the $C_6$-$C_{60}$ aryl group include a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, and an ovalenyl group. When the $C_6$-$C_{60}$ aryl group and the $C_6$-$C_{60}$ arylene group each include two or more rings, the rings may be fused with each other.

The term "$C_1$-$C_{60}$ heteroaryl group" as used herein refers to a monovalent group having a heterocyclic aromatic system that has, in addition to a carbon atom, at least one heteroatom as a ring-forming atom, and 1 to 60 carbon atoms. The term "$C_1$-$C_{60}$ heteroarylene group" as used herein refers to a divalent group having a heterocyclic aromatic system that has, in addition to a carbon atom, at least one heteroatom as a ring-forming atom, and 1 to 60 carbon atoms. Examples of the $C_1$-$C_{60}$ heteroaryl group include a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinnolinyl group, a phenanthrolinyl group, a phthalazinyl group, and a naphthyridinyl group. When the $C_1$-$C_{60}$ heteroaryl group and the $C_1$-$C_{60}$ heteroarylene group each include two or more rings, the rings may be fused with each other.

The term "monovalent non-aromatic fused polycyclic group" as used herein refers to a monovalent group having two or more rings fused to each other, only carbon atoms (for example, having 8 to 60 carbon atoms) as ring-forming atoms, and non-aromaticity in its molecular structure when considered as a whole. Examples of the monovalent non-aromatic fused polycyclic group include an indenyl group, a fluorenyl group, a spiro-bifluorenyl group, a benzofluorenyl group, an indenophenanthrenyl group, and an indeno anthracenyl group. The term "divalent non-aromatic fused polycyclic group" as used herein refers to a divalent group having the a structure corresponding to a monovalent non-aromatic fused polycyclic group.

The term "monovalent non-aromatic fused heteropolycyclic group" as used herein refers to a monovalent group having two or more rings fused to each other, at least one heteroatom other than carbon atoms (for example, having 1 to 60 carbon atoms), as a ring-forming atom, and non-aromaticity in its molecular structure when considered as a whole. Examples of the monovalent non-aromatic fused heteropolycyclic group include a pyrrolyl group, a thiophenyl group, a furanyl group, an indolyl group, a benzoindolyl group, a naphtho indolyl group, an isoindolyl group, a benzoisoindolyl group, a naphthoisoindolyl group, a benzosilolyl group, a benzothiophenyl group, a benzofuranyl group, a carbazolyl group, a dibenzosilolyl group, a dibenzothiophenyl group, a dibenzofuranyl group, an azacarbazolyl group, an azafluorenyl group, an azadibenzosilolyl group, an azadibenzothiophenyl group, an azadibenzofuranyl group, a pyrazolyl group, an imidazolyl group, a triazolyl group, a tetrazolyl group, an oxazolyl group, an isoxazolyl group, a thiazolyl group, an isothiazolyl group, an oxadiazolyl group, a thiadiazolyl group, a benzopyrazolyl group, a benzimidazolyl group, a benzoxazolyl group, a benzothiazolyl group, a benzoxadiazolyl group, a benzothiadiazolyl group, an imidazopyridinyl group, an imidazopyrimidinyl group, an imidazotriazinyl group, an imidazopyrazinyl group, an imidazopyridazinyl group, an indenocarbazolyl group, an indolocarbazolyl group, a benzofurocarbazolyl group, a benzothienocarbazolyl group, a benzosilolocarbazolyl group, a benzoindolocarbazolyl group, a benzocarbazolyl group, a benzonaphthofuranyl group, a benzonaphthothiophenyl group, a benzonaphthosilolyl group, a benzofurodibenzofuranyl group, a benzofurodibenzothiophenyl group, and a benzothienodibenzothiophenyl group. The term "divalent non-aromatic fused heteropolycyclic group" as used herein refers to a divalent group having the same structure as a monovalent non-aromatic fused heteropolycyclic group.

The term "$C_6$-$C_{60}$ aryloxy group" as used herein indicates —$OA_{102}$ (wherein $A_{102}$ is the $C_6$-$C_{60}$ aryl group), and the term "$C_6$-$C_{60}$ arylthio group" as used herein indicates —$SA_{103}$ (wherein $A_{103}$ is the $C_6$-$C_{60}$ aryl group).

The term "$C_7$-$C_{60}$ aryl alkyl group" used herein refers to -$A_{104}A_{105}$ (where $A_{104}$ may be a $C_1$-$C_{54}$ alkylene group, and $A_{105}$ may be a $C_6$-$C_{59}$ aryl group), and the term "$C_2$-$C_{60}$ heteroaryl alkyl group" used herein refers to -$A_{106}A_{107}$ (where $A_{106}$ may be a $C_1$-$C_{59}$ alkylene group, and $A_{107}$ may be a $C_1$-$C_{59}$ heteroaryl group).

$R_{10a}$ may be:

deuterium (-D), —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted or unsubstituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, —$Si(Q_{11})(Q_{12})(Q_{13})$, —$N(Q_{11})(Q_{12})$, —$B(Q_{11})(Q_{12})$, —$C(=O)(Q_{11})$, —$S(=O)_2(Q_{11})$, —$P(=O)(Q_{11})(Q_{12})$, or any combination thereof;

a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, or a $C_2$-$C_{60}$ heteroaryl alkyl group, each substituted or unsubstituted with deuterium, —F, —$C_1$, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, —$Si(Q_{21})(Q_{22})(Q_{23})$, —$N(Q_{21})(Q_{22})$, —$B(Q_{21})(Q_{22})$, —$C(=O)(Q_{21})$, —$S(=O)_2(Q_{21})$, —$P(=O)(Q_{21})(Q_{22})$, or any combination thereof; or —$S(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, or —$P(=O)(Q_{31})(Q_{32})$.

$Q_1$ to $Q_3$, $Q_{11}$ to $Q_{13}$, $Q_{21}$ to $Q_{23}$, and $Q_{31}$ to $Q_{33}$ used herein may each independently be: hydrogen; deuterium; —F; —$C_1$; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof; a $C_7$-$C_{60}$ aryl alkyl group; or a $C_2$-$C_{60}$ heteroaryl alkyl group.

The term "hetero atom" as used herein refers to any atom other than a carbon atom. Examples of the heteroatom include O, S, N, P, Si, B, Ge, Se, or any combination thereof The term "the third-row transition metal" used herein includes hafnium (Hf), tantalum (Ta), tungsten (W), rhenium (Re), osmium (Os), iridium (Ir), platinum (Pt), gold (Au), or the like.

The term "Ph" as used herein refers to a phenyl group, the term "Me" as used herein refers to a methyl group, the term "Et" as used herein refers to an ethyl group, the term "ter-Bu" or "But" as used herein refers to a tert-butyl group, and the term "OMe" as used herein refers to a methoxy group.

The term "biphenyl group" as used herein refers to "a phenyl group substituted with a phenyl group." In other words, the "biphenyl group" is a substituted phenyl group having a $C_6$-$C_{60}$ aryl group as a substituent.

The term "terphenyl group" as used herein refers to "a phenyl group substituted with a biphenyl group". The "terphenyl group" is a substituted phenyl group having, as a substituent, a $C_6$-$C_{60}$ aryl group substituted with a $C_6$-$C_{60}$ aryl group.

* and *' as used herein, unless defined otherwise, each refer to a binding site to a neighboring atom in a corresponding formula or moiety.

Hereinafter, a compound made according to the principles and certain embodiments of the invention and a light-emitting device made according to the principles and certain embodiments of the invention will be described in detail with reference to the Examples.

EXAMPLES

Manufacture of Light-Emitting Device

Comparative Example 1

A substrate of an ITO 300 Å/Ag 50 Å/ITO 300 Å (anode) was cut to a size of 50 mm×50 mm×0.7 mm, sonicated with isopropyl alcohol and pure water each for 5 minutes, and then cleaned by irradiation of ultraviolet rays and exposure of ozone thereto for 30 minutes. Then, the ITO glass substrate was provided to a vacuum deposition apparatus.

The compound HAT-CN was vacuum-deposited on the substrate to form a hole injection layer having a thickness of 150 Å. Next, the compound NPB as a hole transporting compound was vacuum-deposited thereon to form a hole transport layer having a thickness of 600 Å. The compound 1H-1 was vacuum-deposited on the hole transport layer to form an electron blocking layer having a thickness of 50 Å.

The compounds 1H-1 as a first host, 2H-1 as a second host, 1D-1 as a first dopant, and DF8 as a second dopant were deposited on the electron blocking layer to form an emission layer having a thickness of 100 Å (a weight ratio of first host:second host:first dopant:second dopant=4.5:4.5:0.5:0.5). ET46 was deposited on the emission layer to form a hole blocking layer having a thickness of 300 Å.

The compounds TPM-TAZ and LiQ were deposited on the hole blocking layer at a weight ratio of 5:5 to form an electron transport layer having a thickness of 300 Å.

The element Yb was vacuum-deposited on the electron transport layer to a thickness of 10 Å and the combination of AgMg was vacuum-deposited thereon to a thickness of 100 Å, to thereby form a cathode, and the compound CP1 was deposited thereon to form a cathode having a thickness of 700 Å, thereby completing the manufacture of an organic light-emitting device.

Example 1

A light-emitting device was manufactured in the same manner as in Comparative Example 1, except that ET46 was deposited on the emission layer to form a first hole blocking layer having a thickness of 150 Å, and ET46 and PD9 were deposited on the first hole blocking layer to form a second hole blocking layer having a thickness of 150 Å (doping of 5% of PD9).

To evaluate the characteristics of the light-emitting devices manufactured according to Comparative Example 1 and Example 1, driving voltage, efficiency, and lifespan at 10 mA/cm$^2$ of current density were measured. Efficiency and the like of the light-emitting devices were measured using the measurement device sold under the trade designation C9920-2-12 of Hamamatsu Photonics Inc., of Hamamatsu-city, Japan.

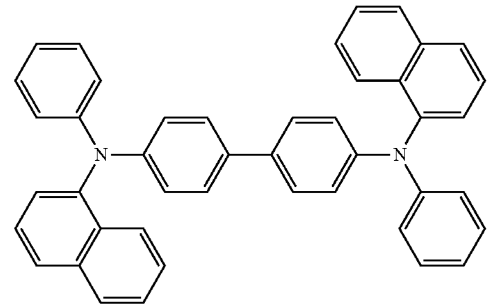

NPB

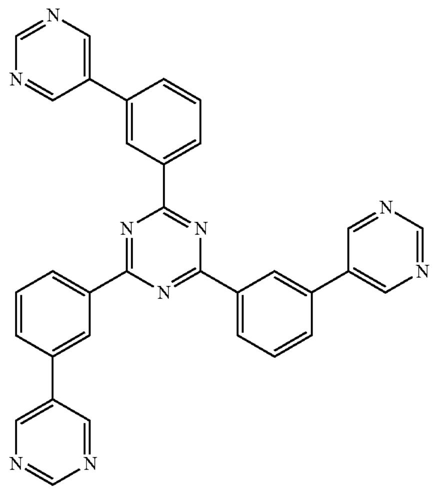

TPM-TAZ 1H-1

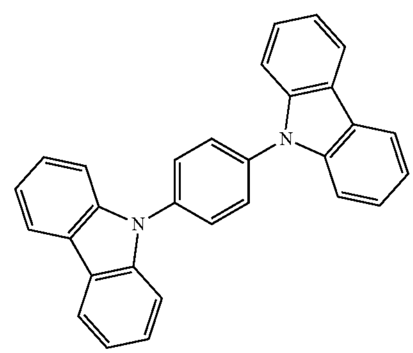

2H-1

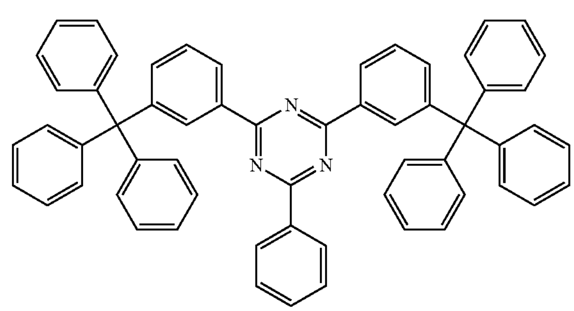

-continued 1D-1

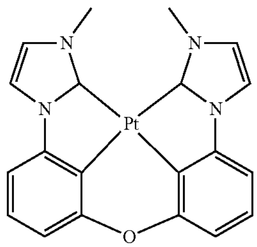

ET46

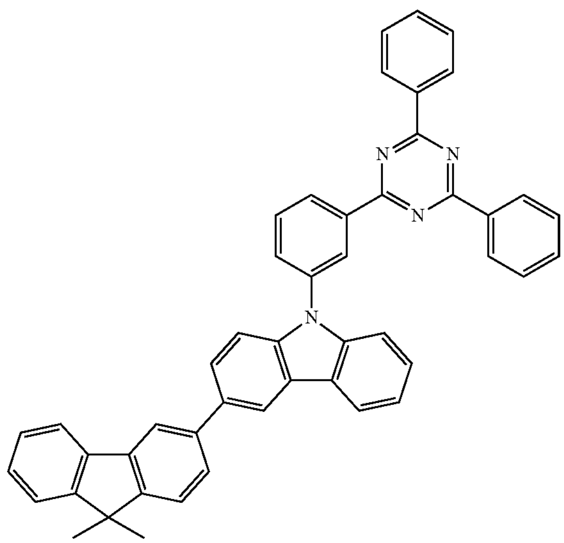

PD9

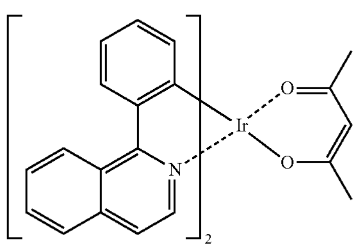

CP1

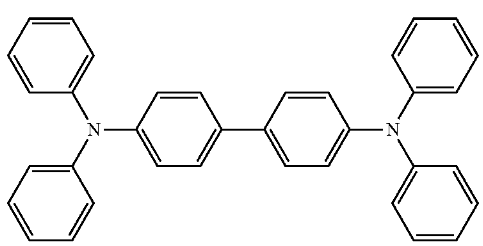

DF8(DABNA-1)

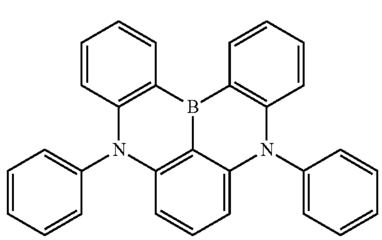

TABLE 1

| | Driving voltage (V) | Efficiency (cd/A) | T95 lifespan (relative value) |
|---|---|---|---|
| Comparative Example 1 | 5.3 | 17.9 | 100 |
| Example 1 | 5.3 | 17.7 | 121 |

Table 1 demonstrates the significant and unexpected results of Example 1 having an efficiency equivalent to that of Comparative Example 1, but a lifespan improved by 20% or more. The T1 energy and HOMO energy values of Compounds ET46 and PD9 were shown in Table 2.

TABLE 2

| Compound | T1 (eV) | HOMO energy (eV) |
|---|---|---|
| ET46 | 3.1 | −6.2 |
| PD9 | 2.0 | −5.1 |

A second hole blocking layer doped with PD9 having a T1 energy value less than T1 energy of Compound ET46 and a HOMO energy absolute value less than a HOMO energy absolute value of Compound ET46 is located in an electron transport region, and thus it is believed that, not wanting to be bound by theory, holes leaked from the emission layer were trapped by PD9 of the second hole blocking layer to suppress deterioration of ET46 due to hole retention in the electron transport region and deterioration of ET46 due to exciton formation. Thus, the lifespan is improved.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A light-emitting device comprising:

a first electrode;

a second electrode facing the first electrode;

an interlayer comprising an emission layer between the first electrode and the second electrode; and an electron transport region comprising a layer including a red dopant compound between the emission layer and the second electrode and comprising: a hole blocking layer; and an electron transport layer, an electron injection layer, or any combination thereof, wherein the emission layer comprises a first host, a second host, a first dopant, and a second dopant.

2. The light-emitting device of claim 1, wherein the first electrode comprises an anode, and the second electrode comprises a cathode.

3. The light-emitting device of claim 1, wherein the first electrode comprises an anode, the second electrode comprises a cathode, and the interlayer further comprises a hole transport region between the first electrode and the emission layer and comprising a hole injection layer, a hole transport layer, an electron blocking layer, or any combination thereof.

4. The light-emitting device of claim 1, wherein the emission layer is configured to emit blue light.

5. The light-emitting device of claim 1, wherein the emission layer does not contact the layer comprising the red dopant compound.

6. The light-emitting device of claim 1, wherein the first dopant comprises a phosphorescent dopant, and the second dopant comprises a thermally activated delayed fluorescence dopant.

7. The light-emitting device of claim 1, wherein any one of the first dopant and the second dopant exhibits intersystem crossing more than it exhibits emission of light.

8. The light-emitting device of claim 1, wherein the first dopant comprises a phosphorescent dopant, the second dopant comprises a thermally activated delayed fluorescence dopant, and the first dopant exhibits intersystem crossing more than it exhibits emission of light.

9. The light-emitting device of claim 1, wherein the hole blocking layer comprises a Compound HB, and a value of a T1 energy of the Compound HB ($T_{1\_HB}$) and a value of the T1 energy of the red dopant compound ($T_{1\_RD}$) satisfy the following Equation (1):

$$T1\_HB > T1\_RD \quad (1).$$

10. The light-emitting device of claim 1, wherein the hole blocking layer comprises a Compound HB, and the Compound HB has an absolute value of highest occupied molecular orbital energy ($HOMO_{\_HB}$) and the red dopant compound has an absolute value of highest occupied molecular orbital energy ($HOMO_{\_RD}$) that satisfy the following Equation (2):

$$|HOMO_{\_HB}| > |HOMO_{\_RD}| \quad (2).$$

11. The light-emitting device of claim 1, wherein the hole blocking layer comprises a Compound HB, and the Compound HB has a value of a T1 energy ($T_{1\_HB}$) from about 2.5 eV to about 3.5 eV.

12. The light-emitting device of claim 1, wherein the red dopant compound has a value of a T1 energy ($T_{1\_RD}$) from about 1.5 eV to about 2.5 eV.

13. The light-emitting device of claim 1, wherein the first host comprises a hole transporting host, and the second host comprises an electron transporting host.

14. The light-emitting device of claim 1, wherein the hole blocking layer comprises the layer comprising the red dopant compound.

15. The light-emitting device of claim 1, wherein the first host comprises any one of the following compounds:

1H-1

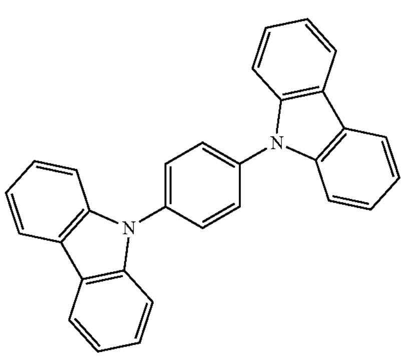

1H-2

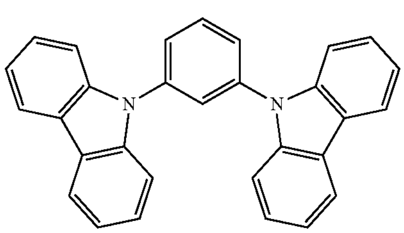

-continued 1H-3

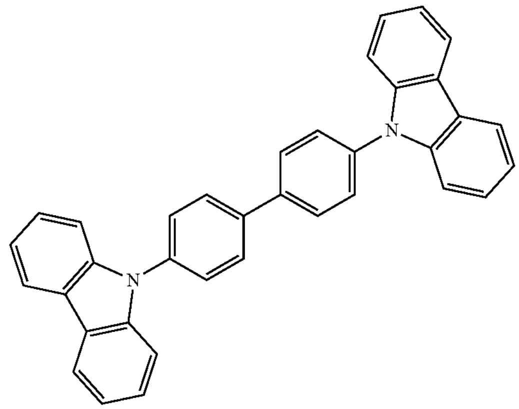

1H-4

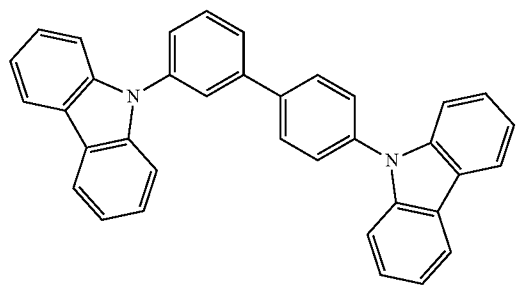

1H-5

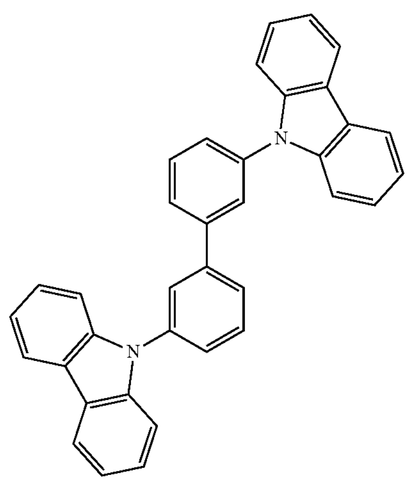

1H-6

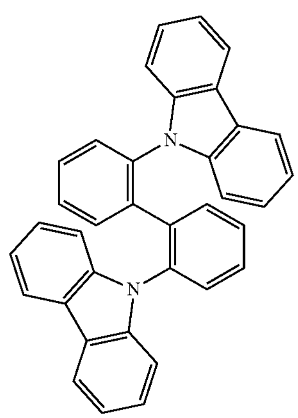

-continued
1H-7
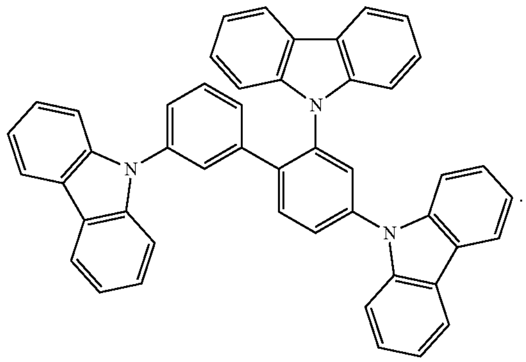
16. The light-emitting device of claim 1, wherein the second host comprises any one of the following compounds:
2H-1
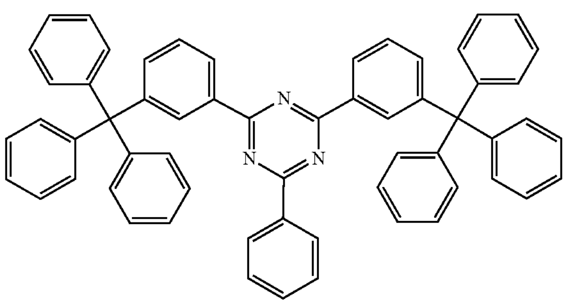
2H-2
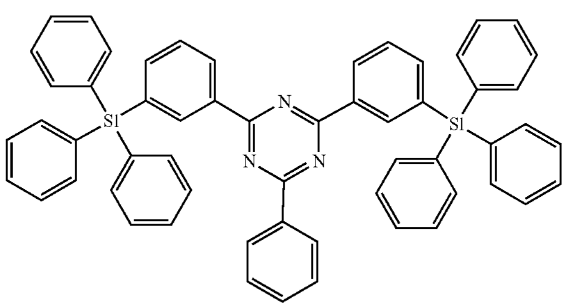
2H-3
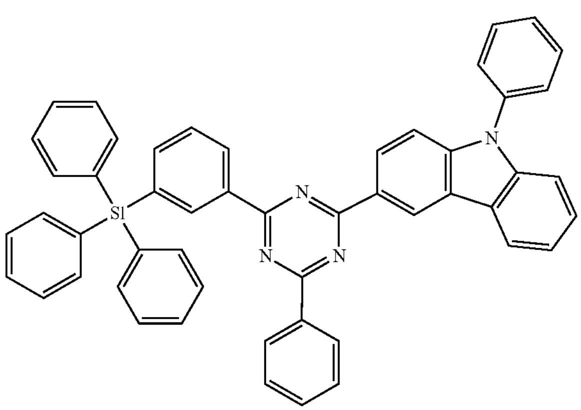
-continued
2H-4
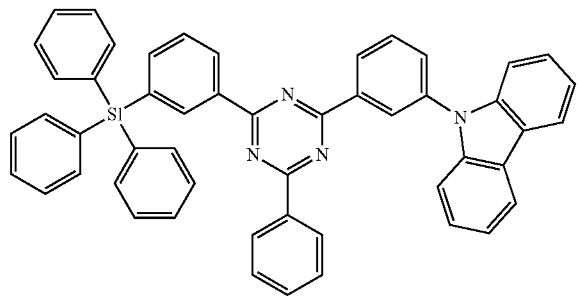
2H-5
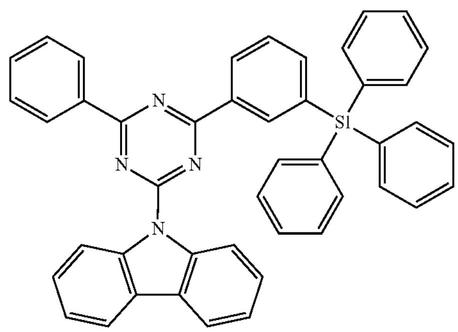
2H-6
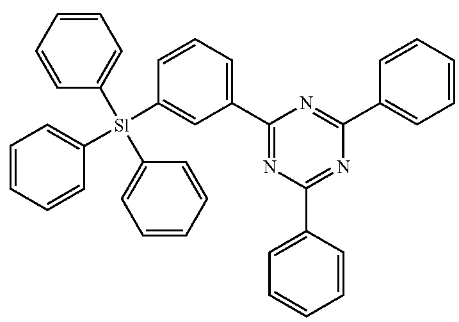
2H-7
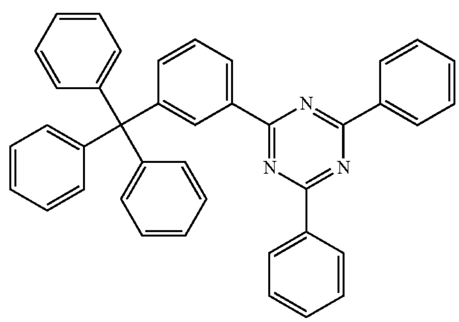
17. The light-emitting device of claim 1, wherein the first dopant comprises any one of the following compounds:

1D-1
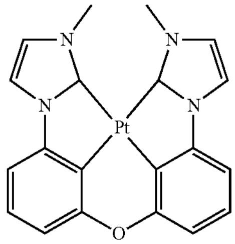
1D-2
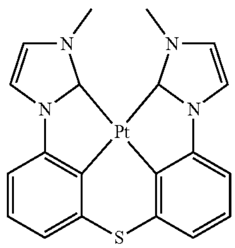
1D-3
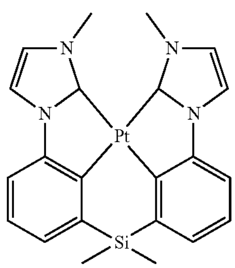
1D-4
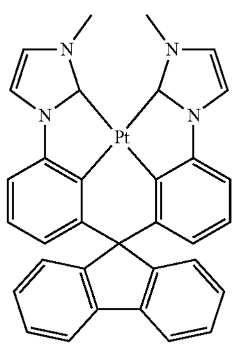
1D-5
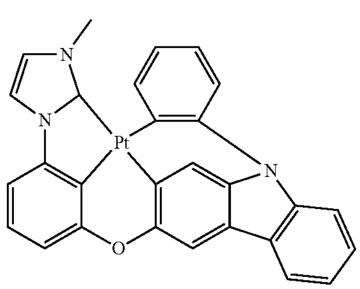
-continued
1D-6
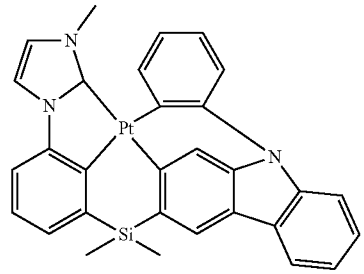
1D-7
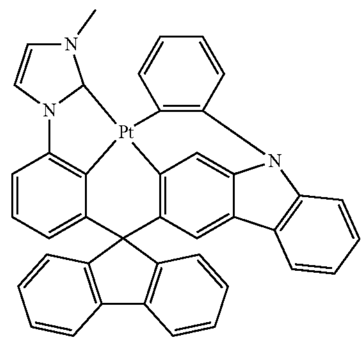
1D-8
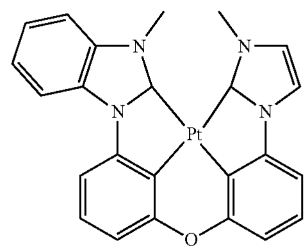
1D-9
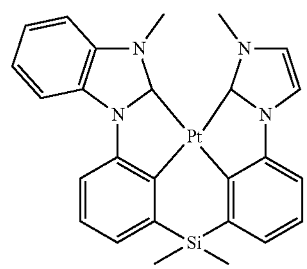
1D-10
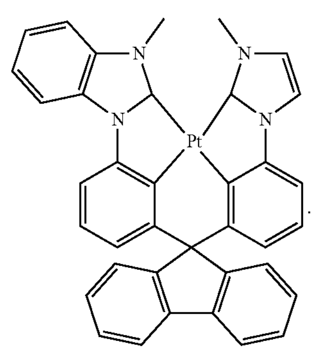
18. The light-emitting device of claim 1, wherein the second dopant comprises any one of the following compounds:

DF8(DABNA-1)
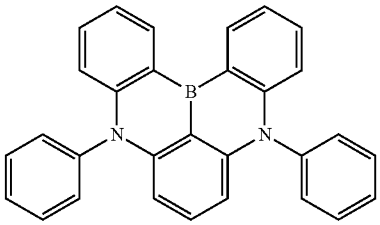
2D-1
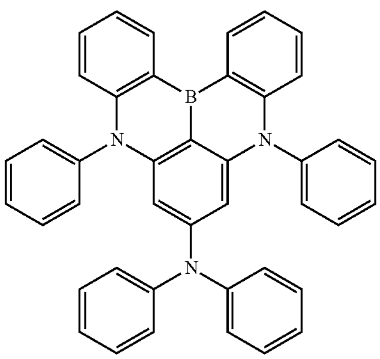
2D-2
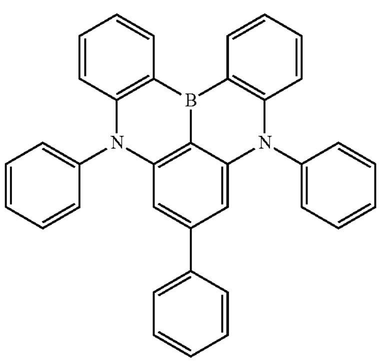
2D-3
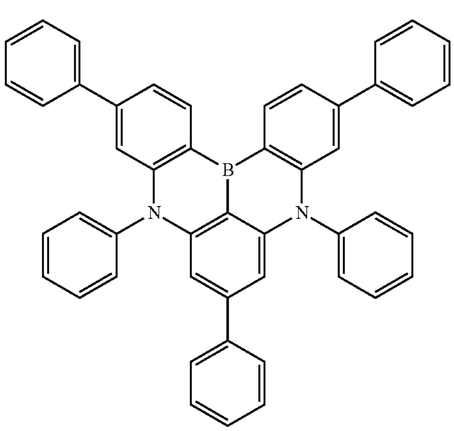
-continued
2D-4
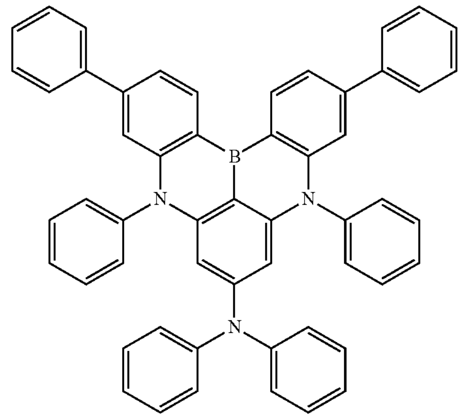
2D-5
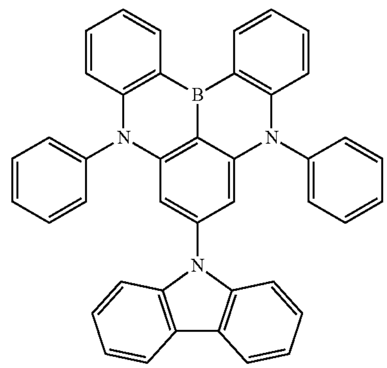
2D-6
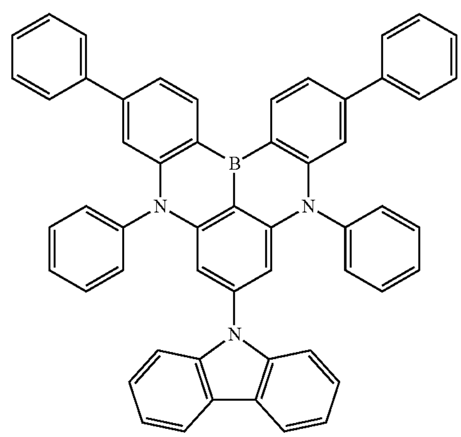
2D-7
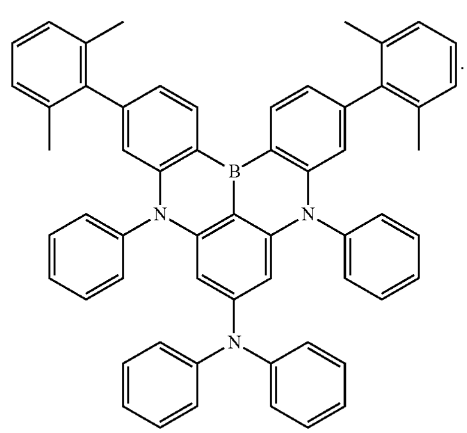

19. The light-emitting device of claim 1, wherein the red dopant compound comprises any one of the following compounds:
PD9
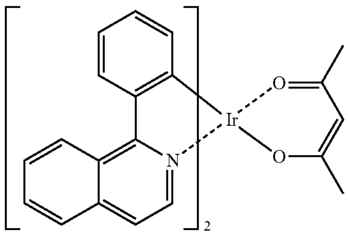
PD11
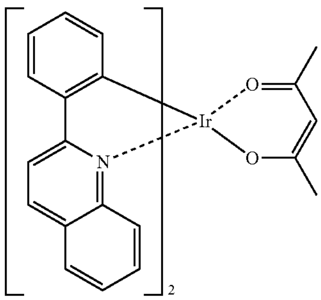
PD26
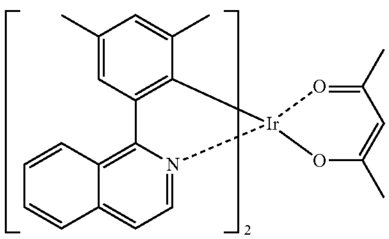
-continued
PD27
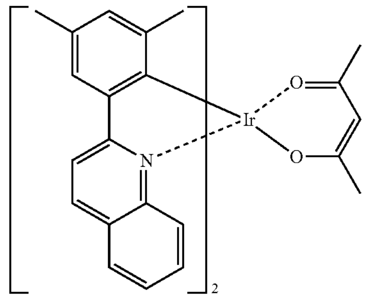
PD28
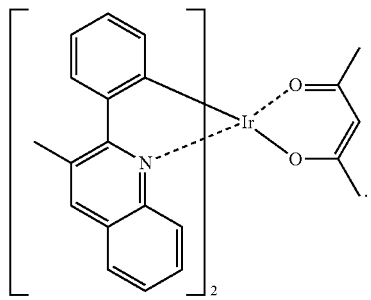
20. An electronic apparatus comprising the light-emitting device of claim 1.
* * * * *